United States Patent
Gofuku et al.

[11] Patent Number: 5,985,689
[45] Date of Patent: Nov. 16, 1999

[54] METHOD OF FABRICATING PHOTOELECTRIC CONVERSION DEVICE HAVING AT LEAST ONE STEP-BACK LAYER

[75] Inventors: Ihachiro Gofuku, Atsugi; Masato Yamanobe, Machida; Izumi Tabata, Yokohama; Hiraku Kozuka, Hiratsuka, all of Japan

[73] Assignee: Canon Kabushiki Kaisha, Tokyo, Japan

[21] Appl. No.: 09/012,015

[22] Filed: Jan. 22, 1998

Related U.S. Application Data

[60] Continuation of application No. 08/488,086, Jun. 7, 1995, abandoned, which is a division of application No. 08/150,983, Nov. 12, 1993, Pat. No. 5,453,629.

[30] Foreign Application Priority Data

Nov. 13, 1992 [JP] Japan .................................. 4-327569

[51] Int. Cl.⁶ .................................................. H01L 21/20
[52] U.S. Cl. .................................. 438/59; 438/57; 438/73; 438/900; 438/936
[58] Field of Search .................................. 438/48, 57, 59, 438/73, 493, 900, 936; 257/186, 16, 21, 22, 185, 438, 458

[56] References Cited

U.S. PATENT DOCUMENTS

| | | | |
|---|---|---|---|
| 4,476,477 | 10/1984 | Capasso et al. | 357/30 |
| 4,613,382 | 9/1986 | Katayama et al. | 437/170 |
| 4,936,781 | 6/1990 | Micrea et al. | 437/937 |
| 5,155,351 | 10/1992 | Yamanobe et al. | 257/435 |
| 5,179,029 | 1/1993 | Gottscho et al. | 437/937 |
| 5,194,398 | 3/1993 | Miyachi et a l. | 437/937 |
| 5,214,002 | 5/1993 | Hayashi et al. | 437/937 |
| 5,336,623 | 8/1994 | Sichanugrist et al. | 437/937 |

FOREIGN PATENT DOCUMENTS

| | | |
|---|---|---|
| 58-157179 | 9/1983 | Japan . |
| 61-39586 | 2/1986 | Japan . |
| 62-112290 | 5/1987 | Japan . |
| 2-122574 | 5/1990 | Japan . |
| 3-253082 | 11/1991 | Japan . |
| 4-282873 | 10/1992 | Japan . |
| 5-275725 | 10/1993 | Japan . |

OTHER PUBLICATIONS

G.F. Williams et al., "The graded bandgap multilayer avalanche photodiode: a new low–noise detector", IEEE Electron Device Letters EDL–3 No. 3, pp. 71–73, Mar. 1982.

IEEE Electron Device Letters, vol. EDL–3, No. 3, Mar. 1982, pp. 71–73, G.F. Williams et al., "The Graded Bandgap Multilayer Avalanche Photodiode: A New Low–Noise Detector".

*Primary Examiner*—Charles Bowers
*Assistant Examiner*—Keith Christianson
*Attorney, Agent, or Firm*—Fitzpatrick, Cella, Harper & Scinto

[57] ABSTRACT

A photoelectric conversion device includes a plurality of photoelectric conversion units and a signal output unit. The signal output unit has at least one storage device for storing electrical signals generated by the photoelectric conversion device. A scanning device scans the electrical signals generated by the electric conversion units, and a reading device reads out electrical signals generated by the photoelectric conversion units. Each of the photoelectric conversion units includes a light absorption layer and a multiplication layer. The multiplication layer includes at least one step-back structure which multiplies carriers produced by absorption of light, and in which a forbidden band width changes continuously from a minimum to a maximum width.

18 Claims, 45 Drawing Sheets

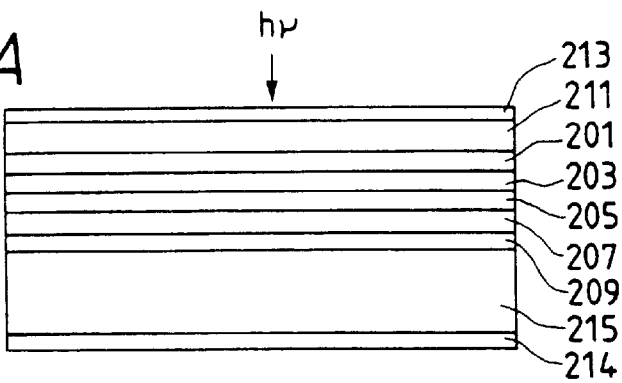
FIG. 5A PRIOR ART
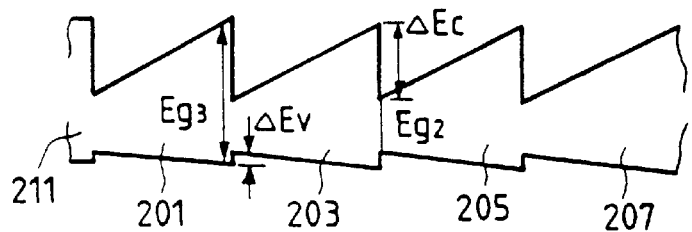
FIG. 5B PRIOR ART
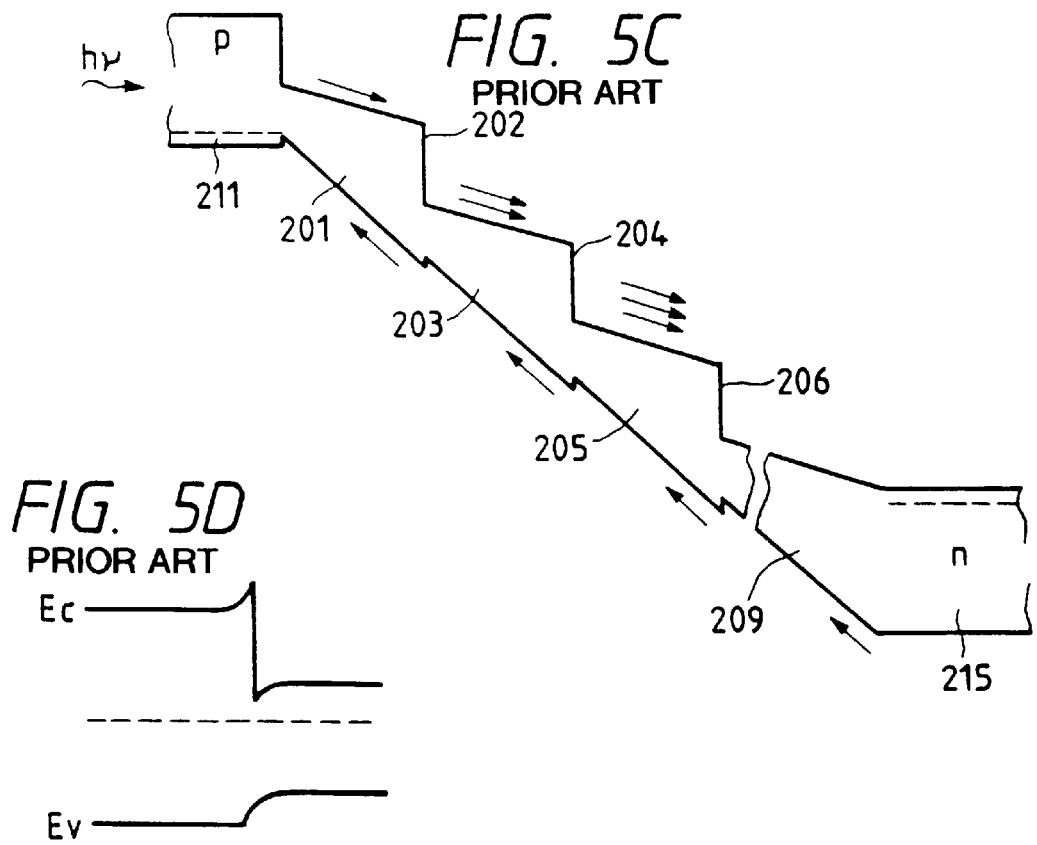
FIG. 5C PRIOR ART
FIG. 5D PRIOR ART

SECTIONAL VIEW ALONG A-A'

SECTIONAL VIEW ALONG A-A'

TEST SAMPLE STRUCTURE

WET-ETCHING ON EDGE PER TIME

VAPOR PHASE CHEMICAL ETCHING PER TIME

○ F₂
● SiH₄

FRONT VIEW OF GAS SUPPLY NOZZLE

LINE SENSOR PLAN VIEW

LINE SENSOR SECTIONAL VIEW ALONG A-A'

LINE SENSOR SECTIONAL VIEW ALONG B-B'

PREPARATION OF SUBSTRATE WITH SCANNING CIRCUIT

DEPOSITION OF $n^+$-$\mu c$-Si:H LAYER

ISOLATION OF $n^+$-$\mu c$-Si:H LAYER

VAPOR PHASE CHEMICAL ETCHING OF $n^{++}\mu c$-Si:H LAYER SURFACE

DEPOSITION OF a-Si:H (i/p) LAYER, ITO

PATTERNING OF ITO

PATTERNING OF p LAYER

PASSIVATION

FORMING WIRING ELECTRODE WITH CONTACT HOLE OPENING

POWER EFFECT IN HYDROGEN PLASMA PROCESSING

EFFECT OF SUBSTRATE TEMPERATURE IN HYDROGEN PLASMA PROCESSING

EFFECT OF PROCESSING TIME IN
HYDROGEN PLASMA PROCESSING

LINE SENSOR PLAN VIEW

LINE SENSOR SECTIONAL VIEW ALONG A-A'

LINE SENSOR SECTIONAL VIEW ALONG B-B'

PREPARATION OF SUBSTRATE WITH SCANNING CIRCUIT

DEPOSITION OF a-Si:H (n/i/p) LAYER

DEPOSITION OF ITO

ETCHING OF ITO

ISOLATION (RIE) OF a-Si:H LAYER

HYDROGEN PLASMA PROCESSING OF a-Si:H LAYER END SURFACE

PASSIVATION

FORMING WIRING ELECTRODE WITH CONTACT HOLE

PREPARATION OF SUBSTRATE WITH SCANNING CIRCUIT

DEPOSITION OF a-Si:H (n/i/p) LAYER

DEPOSITION OF ITO, Al

ETCHING OF ITO, Al

ISOLATION (RIE) OF a-Si:H LAYER

HYDROGEN PLASMA PROCESSING OF a-Si:H LAYER END SURFACE

ETCHING AI

PASSIVATION

FORMING WIRING ELECTRODE WITH CONTACT HOLE

PREPARATION OF SUBSTRATE WITH SCANNING CIRCUIT

DEPOSITION OF Al LAYER FOR LIFT OFF MASK

FORMING LIFT OFF PATTERN BY Al ETCHING

DEPOSITION OF a-Si:H, ITO

ETCHING ITO

LIFT OFF a-Si:H LAYER BY Al ETCHING

PREPARATION OF SUBSTRATE WITH SCANNING CIRCUIT

DEPOSITION OF Al, Ti LAYER FOR LIFT OFF MASK

FORMING LIFT OFF PATTERN BY Ti, Al ETCHING

DEPOSITION OF a-Si:H, ITO

ETCHING ITO

LIFT OFF a-Si:H LAYER BY Al ETCHING

PREPARATION OF SUBSTRATE WITH SCANNING CIRCUIT

DEPOSITION OF a-Si:H (n/i/p) LAYER

DEPOSITION OF ITO

ETCHING ITO

ISOLATION (RIE) OF a-Si:H LAYER

REMOVING a-Si:H LAYER END SURFACE
LAYER SECTION BY WET ETCHING

ONE PIXEL

5,985,689

METHOD OF FABRICATING PHOTOELECTRIC CONVERSION DEVICE HAVING AT LEAST ONE STEP-BACK LAYER

This application is a continuation of application Ser. No. 08/488,086, filed Jun. 7, 1995, now abandoned, which was a division of application Ser. No. 08/150,983, filed Nov. 12, 1993, now U.S. Pat. No. 5,453,629.

BACKGROUND OF THE INVENTION

1. Field of the Invention

The present invention relates to a photoelectric conversion device suitable for a photometry sensor of a camera, an image sensor of an image reading apparatus such as a facsimile or copying machine, or a light-receiving sensor of an optical communication apparatus or the like and, more particularly, to a method of manufacturing a photoelectric conversion device according to an isolation technique which does not cause degradation in characteristics of a photoelectric conversion device using an avalanche effect and a photoelectric conversion device in which elements are arranged one-dimensionally or two-dimensionally.

2. Related Background Art

Recently, elongated line sensors in which photosensors are arranged one-dimensionally and area sensors in which photosensors are arranged two-dimensionally are used frequently with the spread of image information processing apparatuses such as facsimile apparatuses, digital copying machines, image readers, and video cameras. Although various types of photosensors are usable in these line and area sensors, thin-film photosensors are applied extensively in consideration of the following functionalities:

(1) Layers can be stacked so as to isolate individual functions in accordance with the properties of a material.

(2) A large area can be formed at one time.

(3) A low-temperature process which is not limited by the type of substrate can be adopted, so that any one of a glass, a semiconductor substrate, and a metal is usable as a substrate.

(4) A formation process is simple, and this realizes a low cost.

As the structure of an element, on the other hand, photodiode structures which suppress a dark current by preventing injection of carriers from electrodes are used widely because a high sensitivity can be obtained by a high S/N ratio.

Among other photodiode type photosensors, a so-called PIN photodiode is the mainstream in favor of suppression of a dark current, in which a photoconductive film is formed by arranging heavily doped impurity layers (P and N layers) having opposite conductivity types on the upper and lower surfaces of a semiconductor layer (an I layer) not doped with or doped slightly with an impurity for controlling a conductivity type.

To realize a one-dimensional or two-dimensional arrangement of the photodiode type photosensors, such as the arrangement of a line sensor or an area sensor, at least one of upper and lower electrodes is isolated into individual pixels to form discrete electrodes in order for a plurality of photosensors to be able to operate independently. Especially in the PIN photodiode, in order to suppress crosstalk, a heavily doped impurity layer of a photoconductive film formed on the side of discrete electrodes must also be isolated into individual pixels.

FIGS. 1 and 2 are schematic sectional views showing examples of conventional area sensors. FIG. 1 illustrates a sensor in which discrete electrodes are connected to a lower electrode, and FIG. 2 illustrates a sensor in which discrete electrodes are connected to an upper electrode.

If discrete electrodes 115 are arranged on the side of an upper electrode 113 of a photoconductive film in an area sensor as shown in FIG. 2, the ratio of an effective pixel region B to a region A of one pixel decreases, making it impossible to take advantage of the merit of a multilayered photoelectric conversion element. Therefore, as shown in FIG. 1, the discrete electrodes 115 are arranged on the side of a lower electrode 107.

FIG. 3 is a schematic sectional view showing another example of a conventional line sensor. Also in a line sensor, as shown in FIG. 3, to prevent occurrence of a pixel defect caused by disconnection of a wiring electrode 115 connected to a signal processing element at a position indicated by X, it is advantageous to use the discrete electrodes 115 as a lower electrode. Therefore, pixel isolation methods (to be referred to as isolation methods hereinafter) used when discrete electrodes are formed on the lower electrode side are important.

The isolation methods are roughly classified into two categories as described below.

The first one is a method of isolating only a heavily doped impurity layer (a lower heavily doped impurity layer) on the side of discrete electrodes into individual pixels. In this method, a film for discrete electrodes and a lower heavily doped impurity layer are deposited and then isolated. Thereafter, an I layer, an upper heavily doped impurity layer, and an upper electrode layer are deposited to form photodiodes.

The second one is a method by which not only a lower heavily doped impurity layer but also a whole photoconductive film including an I layer and an upper heavily doped impurity layer is isolated. That is, a film for discrete electrodes is deposited and patterned into a desired shape, and a lower heavily doped impurity layer, an I layer, and an upper heavily doped impurity layer, which constitute a photoconductive film, are deposited in succession. Thereafter, all the layers of this photoconductive film are isolated successively.

In video information systems, optical communications, various other industries, and fields of industrial apparatuses, which use light as a medium of information signals, a semiconductor light-receiving element for converting a light signal into an electrical signal is one constituent element that is most important and basic, and a large number of semiconductor light-receiving elements have been put into practical use. The semiconductor light-receiving element is generally required to have a high signal-to-noise ratio in its photoelectric conversion characteristics.

An avalanche photodiode (to be abbreviated as an APD hereinafter) which uses an avalanche effect is a promising candidate for a semiconductor light-receiving element meeting the above requirement because the avalanche diode has a high gain and a high response speed.

A large number of APDs using compound semiconductors, such as InGaAs, as their materials have already been put to use as semiconductor light-receiving elements particularly in optical communication systems. In addition, development for improving the basic characteristics of the elements, such as low noise, a high response speed, and a high gain, has been advanced, so applications of the APDs to other fields, e.g., a visible light-receiving element, are also expected.

FIG. 4 is a longitudinal sectional view showing the structure of a conventional APD for optical communications.

Referring to FIG. 4, this APD comprises an $n^+$-type InP layer 151, an n-type InGaAs layer 152, an n-type InP layer 153, and a $p^+$-type InP layer 154. The n-type InGaAs layer 152, the n-type InP layer 153, and the $p^+$-type InP layer 154 from a mesa shape. A p-type electrode 156 is formed on the upper surface of the $p^+$-type InP layer 154 except for a window 155. An n-type electrode 157 is formed on the lower surface of the $n^+$-type InP layer 151. This APD also includes a passivation film 158. When the p-type electrode 156 and the n-type electrode 157 are reverse-biased and light is radiated through the window 155, this light is absorbed by the n-type InGaAs layer 152 (which serves as a light absorption layer), causing photoelectric conversion. That is, electrons and holes formed by the n-type InGaAs layer 152 to constitute pairs transit toward the n-type electrode 157 and the p-type electrode 156, respectively. Since the n-type InP layer 153 (which serves as a multiplication layer) has a strong electric field, an avalanche phenomenon in which a large number of electron-hole pairs are formed takes place while the holes are running, giving rise to a multiplication effect for forming a plurality of electron-hole pairs for one photon. This consequently makes it possible to detect even weak incident light. In this conventional structure, however, a practical multiplication factor is small, approximately two times. In addition, excess multiplication noise is generated by fluctuations inherent in the multiplication process, leading to a decrease in the S/N ratio.

As an APD for optical communications made in consideration of these two problems, F. Capasso et al. have proposed a low-noise APD which is manufactured by using primarily a Group III–V compound semiconductor in accordance with, e.g., a molecular beam epitaxy (MBE) method, and which can be used in optical communication systems, in Japanese Laid-Open Patent Application No. 58-157179 or IEEE Electron Device Letters, the EDL 3rd ed. (1982), pp. 71–73.

The characteristic feature of this element is a multilayered heterojunction structure which is formed by stacking semiconductor layers whose band gap is changed continuously from a narrow side to a broad side by changing the composition ratio of their material (for example, if the material is a Group III–V compound semiconductor, the composition ratio of a Group III semiconductor to a Group V semiconductor), and which encourages ionization by using a step transition portion (to be abbreviated as a step-back structure hereinafter) of an energy band formed. A schematic structure of the element proposed will be described below with reference to FIGS. 5A to 5C.

FIG. 5A is a longitudinal sectional view of this element. Referring to FIG. 5A, five step-back structure layers 201, 203, 205, 207, and 209 serving as a multiplication layer are sandwiched between a p-type semiconductor layer 211, which serves as a light absorption layer, and an n-type semiconductor layer 215. An electrode 213 is in ohmic contact with the p-type semiconductor layer 211, and an electrode 214 is in ohmic contact with the n-type semiconductor layer 215.

FIG. 5B is a view showing the energy band structure of band-gap inclined layers of this element when no bias is applied. In FIG. 5B, three band-gap inclined layers are illustrated. Each layer has a composition by which a band gap is changed linearly from a narrow band gap $Eg_2$ to a wide band gap $Eg_3$.

The sizes of step backs of a conduction band and a valence band are indicated by ΔEc and ΔEv, respectively. As will be described later, the ΔEc is set to be larger than the ΔEv principally in order to facilitate ionization of electrons.

FIG. 5C is a view showing the energy band structure of this element when a reverse bias voltage is applied to the element. Note that this reverse bias voltage need not be a strong electric field compared to the APD described above with reference to FIG. 4.

When light is incident from the p-type semiconductor layer 211, this light is absorbed by the p-type semiconductor layer and the individual step-back structure layers, and photoelectric conversion is performed in the same manner as in the above-mentioned APD. Electrons and holes thus formed to constitute pairs transit toward the n-type semiconductor layer 215 and the p-type semiconductor layer 211, respectively. The difference of this element from the APD shown in FIG. 4 is that free electrons are produced when the energy step ΔEc (in the case of electrons; the ΔEv in the case of holes) of each step-back structure increases to be higher than the ionization energy, and this produces electron-hole pairs, bringing about a multiplying effect. Since the individual step-back structure layers have the identical function, a multiplication of $2^n$, of course, results for a layer number n. As an example, by setting ideally ΔEc>ΔEv≅0, it is possible to reduce the ionization degree of holes to be much smaller than that of electrons.

That is, since energy discontinuity in heterojunction portions 202, 204, and 206 in which the band gap steps back abruptly helps ionization, ionization occurs selectively in the vicinity of this step back to multiply carriers.

With this structure, fluctuations in a portion where ionization takes place are reduced, and this reduces fluctuations inherent in the multiplication process. This consequently makes it possible to realize a low-noise APD which is improved in an S/N ratio by reducing excess noise, and which therefore can be used in optical communication systems.

In the manufacture of the PIN type photodiode as described above, however, an isolation step is introduced to drive a plurality of elements simultaneously. This conventionally gives rise to a problem that device characteristics, particularly a dark current characteristic, is degraded significantly as compared with that obtained by a single element. FIG. 6 shows a comparison between the dark current-voltage characteristics of an element (a) formed through the isolation step and an element (b) not subjected to the isolation step. As shown in FIG. 6, the ratio of an increase in the dark current to an increase in the voltage is higher in the element (a) subjected to the isolation step; that is, the increase is 10 to 100 times larger, as a current value, for an applied voltage of 5 V.

This phenomenon will be described below by taking the above two types of the isolation methods as examples.

In the first method, i.e., the method of isolating only a lower heavily doped impurity layer, after a lower heavily doped impurity layer is deposited on a substrate in a vacuum chamber, the substrate is removed from the vacuum chamber before being subjected to photolithography. Therefore, the surface of the lower heavily doped impurity layer is exposed to the atmosphere and subjected to coating and peeling of a photoresist. The result is a large number of structural defects of a semiconductor formed in the interface between the lower heavily doped impurity layer and an I layer.

Such structural defects will be described with reference to FIGS. 7A to 7C. FIGS. 7A, 7B, and 7C are a plan view, a sectional view, and an energy band diagram, respectively, of a PIN photodiode. Since these structural defects function as formation centers of carriers as indicated by X in FIGS. 7B and 7C, an applied voltage to the PIN photodiode increases. Therefore, an abrupt increase in a dark current is brought about if an electric field applied to the interface is enhanced.

In the second method, i.e., the method of isolating a whole photoconductive film, there is no increase in a dark current caused by formation of carriers in the interface. However, as shown in FIGS. 8A to 8C, this isolation produces edges in portions surrounding pixels as indicated by X even in an I layer.

FIGS. 8A, 8B, and 8C are a plane view, a sectional view, and an energy band diagram, respectively, of this PIN photodiode.

Structural defects of a semiconductor also exist in such an edge portion, but the quantity of defects changes greatly in accordance with a formation process of edges. For example, if edges are formed by performing isolation through reactive ion etching, a large number of structural defects are produced in the same manner as described above by physical shocks of ions.

If, on the other hand, edges are formed by performing isolation through wet-etching, a defect level increases due to formation of a discontinuous portion in a semiconductor lattice. This increase, however, is very small compared to that caused by the physical shocks during the reactive ion etching, and so an increase in the dark current is only about several times that when no isolation is performed.

It is, however, often common practice to use a strong acid in the wet-etching for photoconductive films, and a photoresist regularly used has only a resistance to such an extent that it can withstand the etching for about one or two minutes, while a time required to complete the isolation is 10 to 20 minutes. That is, the wet-etching is practically inapplicable as the method of isolation.

For this reason, the formation of edges is generally performed by the reactive ion etching, and so a number of structural defect levels result. Since all of these structural defects serve as production centers of carriers and an electric field is applied to an I layer at any instant, a resulting dark current is very large.

A lift-off process is also usable as the method of isolating a whole photoconductive film. In this case, however, in order to remove unnecessary portions from a photoconductive film, deposition of the photoconductive film is performed with an organic resist coated on a substrate. Therefore, large quantities of impurities such as O, C, and N are mixed in the photoconductive film, producing a number of impurity levels, which cause a dark current, throughout the film.

As described above, when the conventional PIN photodiodes are arranged one-dimensionally or two-dimensionally to be used as a line sensor or an area sensor, it is difficult to prevent a degradation in characteristics, i.e., an increase in a dark current.

In addition, there are several technical problems to be solved to put the APD explained with reference to FIGS. 5A to 5D into practical use.

Technical problems to be solved in respect of performance of the element are as follows.

(1) Since incident light is absorbed by the p-type semiconductor layer and the multiplication layer, the multiplication factor changes in accordance with the wavelength of the incident light. Therefore, this APD is unsuitable as a reading element.

(2) Since the forbidden band widths of the light absorption layer and the multiplication layer are small, a dark current during operation is large, and this leads to large noise.

(3) The material of the APD is limited because the APD is used in optical communications. Therefore, the wavelength of light which the APD can respond to is approximately 800 to 1,600 nm, i.e., the APD cannot respond to light having another wavelength, e.g., visible light.

Technical problems posed in the manufacture of the element are as follows.

(1) In the formation of the step-back structure using a compound semiconductor, composition modulation is difficult to perform, and the sizes of the ΔEc and ΔEv are limited. This imposes limitations on noise reduction.

(2) Group III–V and II–IV compound semiconductors used as materials have problems as industrial materials, such as toxicity and cost.

(3) A compound semiconductor formation method requires an ultra high vacuum and film formation at high temperatures (approximately 500 to 650° C.) and also has difficulty in formation of films having large areas. These problems make this method unsuitable as a method of manufacturing a reading element.

Furthermore, when the APD is used as a solid-state image pickup element, noise is produced by leakage of a dark current between pixels if a plurality of APDs are unisolated.

This element isolation is conventionally performed by etching all layers of the APD by using, e.g., reactive ion etching. However, this reactive ion etching poses various problems, such as degradation of device performance, so some improvement has been requested.

The above APD is useful as a discrete light-receiving element for optical communications which operates upon application of a strong electric field. If, however, this APD is to be used extensively as a photoelectric conversion device, such as a video camera or a scanner, which performs a storage operation, the following problems arise in some cases.

(1) Since the conventional APD uses a Group III–V or II–VI compound semiconductor as its constituent material, problems such as toxicity and cost of such a material as an industrial material are brought about.

(2) The formation of a single-crystal compound semiconductor as the material of the APD requires film formation using an ultra-high-vacuum apparatus at high temperatures (about 500° C. or more). It is therefore difficult to apply the element to a photoelectric conversion device with a large area and is impossible to stack the element on a semiconductor substrate on which a signal processing circuit or the like is already formed. This limits the range of applications of the APD.

(3) To realize a low-noise APD, it is necessary to increase the ionization degree of a step-back heterojunction portion, and, for this purpose, use of a material in which energy discontinuity of a step-back portion in only one of a valence band and a conduction band is large is required. However, crystalline compound semiconductors meeting this requirement are limited. Furthermore, to realize an APD of lower noise in which a thermally generated dark current which causes noise is also reduced, the above requirement must be satisfied by the use of a material having a large minimum forbidden band width (desirably higher than 1.0 eV). No crystalline compound semiconductor meeting this requirement exists.

(4) When a storage operation is performed, an electric field applied to the APD decreases with an increase in a carrier storage amount. As shown in FIG. 49C, therefore, a spike and a notch are produced in the step-back heterojunction portion of the multiplication layer consisting of an I-type semiconductor. This decreases effective band discontinuity in the step-back heterojunction portion to decrease the ionization degree and also produces energy discontinuity in a direction in which transition of carriers is inhibited. The results are a decrease in the multiplication factor, deterioration in the linearity of an incident light quantity-to-output characteristic, and a reduction in a response speed.

(5) When a plurality of carrier multiplication layers are formed by using a non-single-crystal material such that a forbidden band is inclined continuously, diffusion of hydrogen in a film occurs due to the difference in bonding energy or the like in a heterojunction portion between a minimum forbidden band and a maximum forbidden band. As a result, defect levels such as dangling bonds are produced to cause recombination of carriers, and this may lead to a decrease in the multiplication factor.

SUMMARY OF THE INVENTION

It is an object of the present invention to provide the structure of a photoelectric conversion device which solves the above problems of conventional photoelectric conversion devices, and a method of manufacturing the same.

It is another object of the present invention to provide a structure capable of performing isolation without increasing a dark current in a photoelectric conversion device in which a plurality of pixels are arranged by pixel isolation, particularly in a PIN photoelectric conversion device, thereby providing a highly reliable photoelectric conversion device.

It is still another object of the present invention to provide a photoelectric conversion device in which interelement isolation is performed with little degradation in device performance by preventing production of noise.

It is still another object of the present invention to provide a photoelectric conversion device including a plurality of photoelectric conversion elements of a step-back structure in which a variation in the manufacture is reduced to realize a small variation in an ionization degree.

It is still another object of the present invention to provide a photoelectric conversion device in which defect levels in the interface of a step-back heterojunction portion of a multiplication layer are reduced, and spikes and notches in the heterojunction portion are eliminated, thereby improving the transit properties of carriers and reducing recombination of carriers, and which therefore has a high multiplication factor and a high response speed, is useful in industrial applications, can be stacked on a semiconductor substrate on which a circuit is already formed, and is applicable to a wide variety of fields.

According to one aspect of the present invention, there is provided a method of manufacturing a photoelectric conversion device which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and the heavily doped impurity layer and the electrode layer formed below the semiconductor layer not doped with or doped slightly with an impurity for controlling a conductivity type are isolated into individual pixels, wherein the surface of the heavily doped impurity layer to be isolated into individual pixels is chemically etched in a vapor phase in a vacuum chamber, and then the semiconductor layer not doped with or doped slightly with an impurity for controlling a conductivity type is deposited without breaking the vacuum.

According to another aspect of the present invention, there is provided a method of manufacturing a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, hydrogen plasma processing is performed for the edges of the photoconductive film exposed by the reactive ion etching.

According to still another aspect of the present invention, there is provided a method of manufacturing a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein the photoconductive film is isolated into individual pixels through a lift-off process using a metal film as a lift-off pattern, in which a metal film of a type different from that of the electrode (lower electrode) formed below pixels is deposited before the deposition of the photoconductive film and left in regions corresponding to portions to be removed from the photoconductive film, and, after the photoconductive film is deposited, the metal film is etched away to remove the portions of the photoconductive film deposited on the metal film.

According to still another aspect of the present invention, there is provided a method of manufacturing a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, the edges of the photoconductive film exposed by the reactive ion etching are etched away by wet-etching.

According to still another aspect of the present invention, there is provided a method of manufacturing a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, the edges of the photoconductive film exposed by the reactive ion etching are chemically etched in a vapor phase in a vacuum chamber.

According to still another aspect of the present invention, there is provided a photoelectric conversion device comprising: a plurality of photoelectric conversion units; and a signal output unit having at least one of storage means for storing electrical signals generated by the photoelectric conversion units, scanning means for scanning electrical signals generated by the photoelectric conversion units, and reading means for reading out electrical signals generated by the photoelectric conversion units, each of the photoelectric conversion units having a structure in which a light absorption layer for absorbing light and a multiplication layer formed by stacking one or a plurality of step-back structure layers, which multiply carriers produced upon absorption of light, and in which a forbidden band width changes continuously from a minimum forbidden band width $Eg_2$ to a maximum forbidden band width $Eg_3$, are sandwiched between a charge injection inhibiting layer stacked on the light absorption layer and a substrate having the signal output unit thereon and a charge injection inhibiting function, wherein the layer with the maximum forbidden band width $Eg_3$ consists of non-single-crystal carbon.

According to still another aspect of the present invention, there is provided a method of manufacturing a photoelectric conversion device in which a light absorption layer and a carrier multiplication layer consist of a non-single-crystal material, and the carrier multiplication layer is constituted by a plurality of layers in which a forbidden band width is inclined continuously, wherein after a minimum forbidden band width layer of the carrier multiplication layer is formed, a thin maximum forbidden band width layer is formed to terminate the surface of the maximum forbidden band width layer with hydrogen atoms.

According to still another aspect of the present invention, there is provided a method of manufacturing a photoelectric conversion device in which a light absorption layer and a carrier multiplication layer consist of a non-single-crystal material, and the carrier multiplication layer is constituted by a plurality of layers in which a forbidden band width is inclined continuously, wherein after a minimum forbidden band width layer of the carrier multiplication layer is formed, the interface of the minimum forbidden band width layer is terminated with hydrogen atoms.

BRIEF DESCRIPTION OF THE DRAWINGS

FIG. 5A is a schematic longitudinal sectional view showing a conventional optical communication APD with a step-back structure;

FIG. 5B is a view showing the structure of an energy band of a band-gap inclined layer when no bias is applied;

FIG. 5C is a view showing the structure of an energy band when a reverse bias voltage is applied;

FIG. 5D is an energy band diagram showing a heterojunction of a conventional multiplication layer;

DETAILED DESCRIPTION OF THE PREFERRED EMBODIMENTS

The above objects of the present invention are achieved by a method of manufacturing a photoelectric conversion device which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and the heavily doped impurity layer and the electrode layer formed below the semiconductor layer not doped with or doped slightly with an impurity for controlling a conductivity type are isolated into individual pixels, wherein the surface of the heavily doped impurity layer to be isolated into individual pixels is chemically etched in a vapor phase in a vacuum chamber, and then the semiconductor layer not doped with or doped slightly with an impurity for controlling a conductivity type is deposited without breaking the vacuum.

The present invention can realize a method of manufacturing a photoelectric conversion device with high reliability resulting from a small dark current by using the above method.

Figure 1:
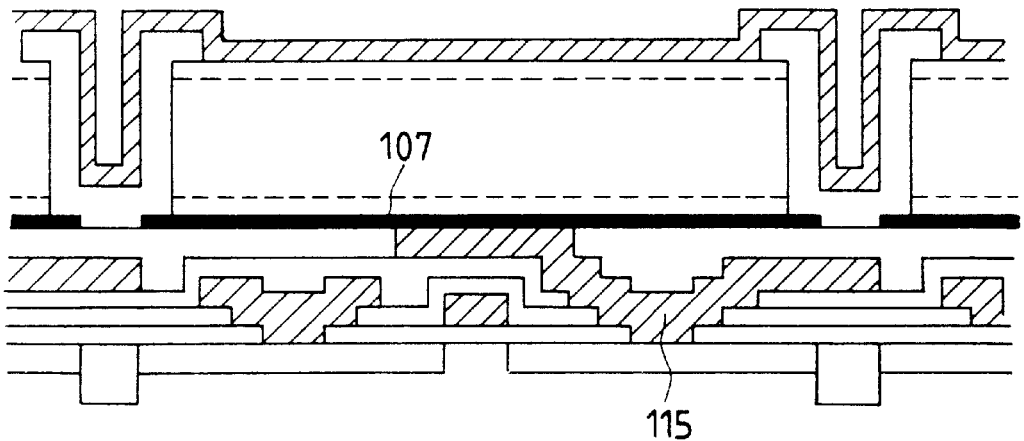
FIGS. 1, 2, and 3 are schematic sectional views each for explaining an example of a conventional area sensor.
Figure 2:
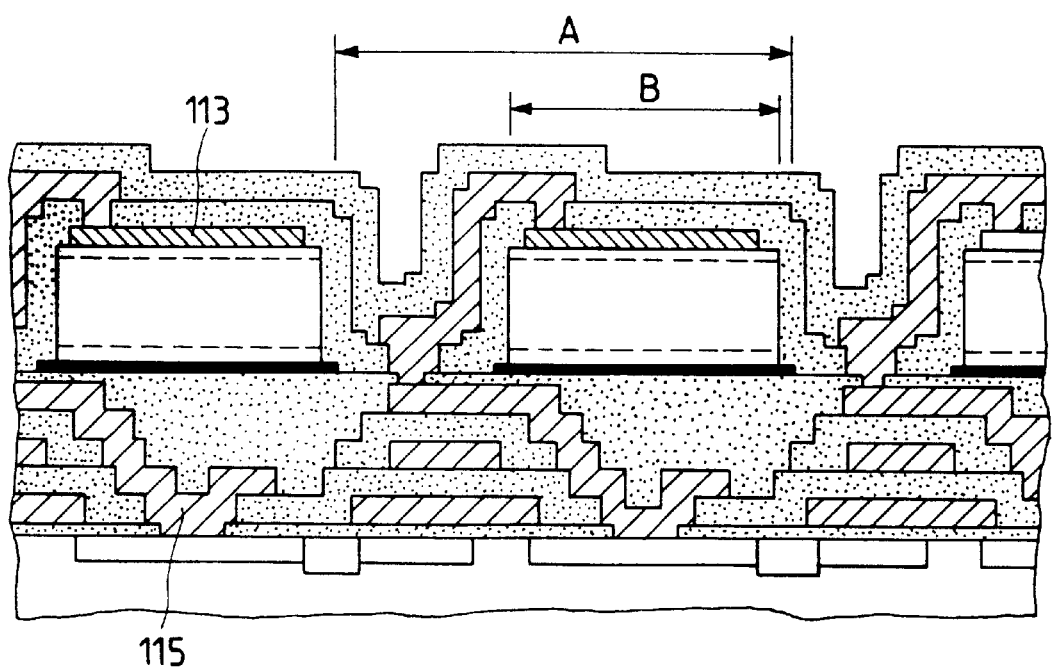
Figure 3:
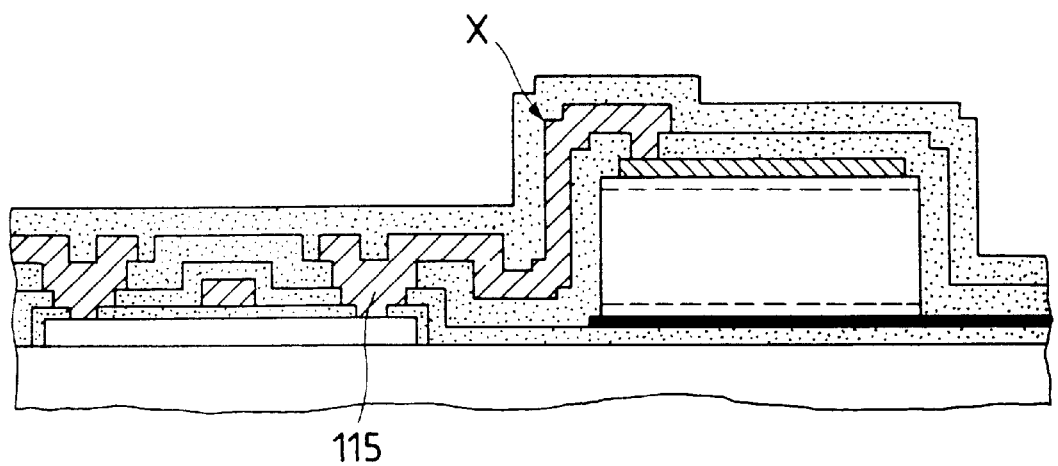
Figure 4:
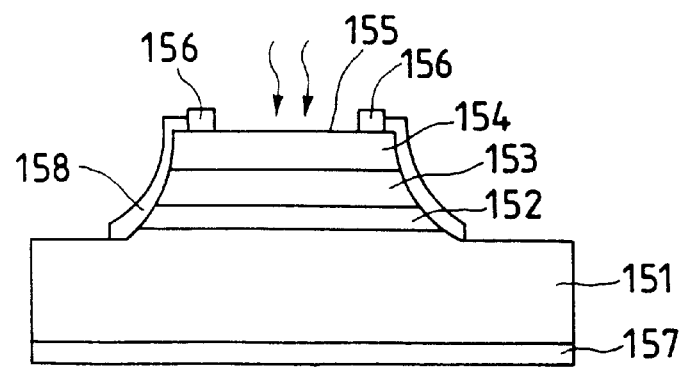
FIG. 4 is a schematic longitudinal sectional view for explaining the structure of a conventional APD for optical communications.
Figure 6:
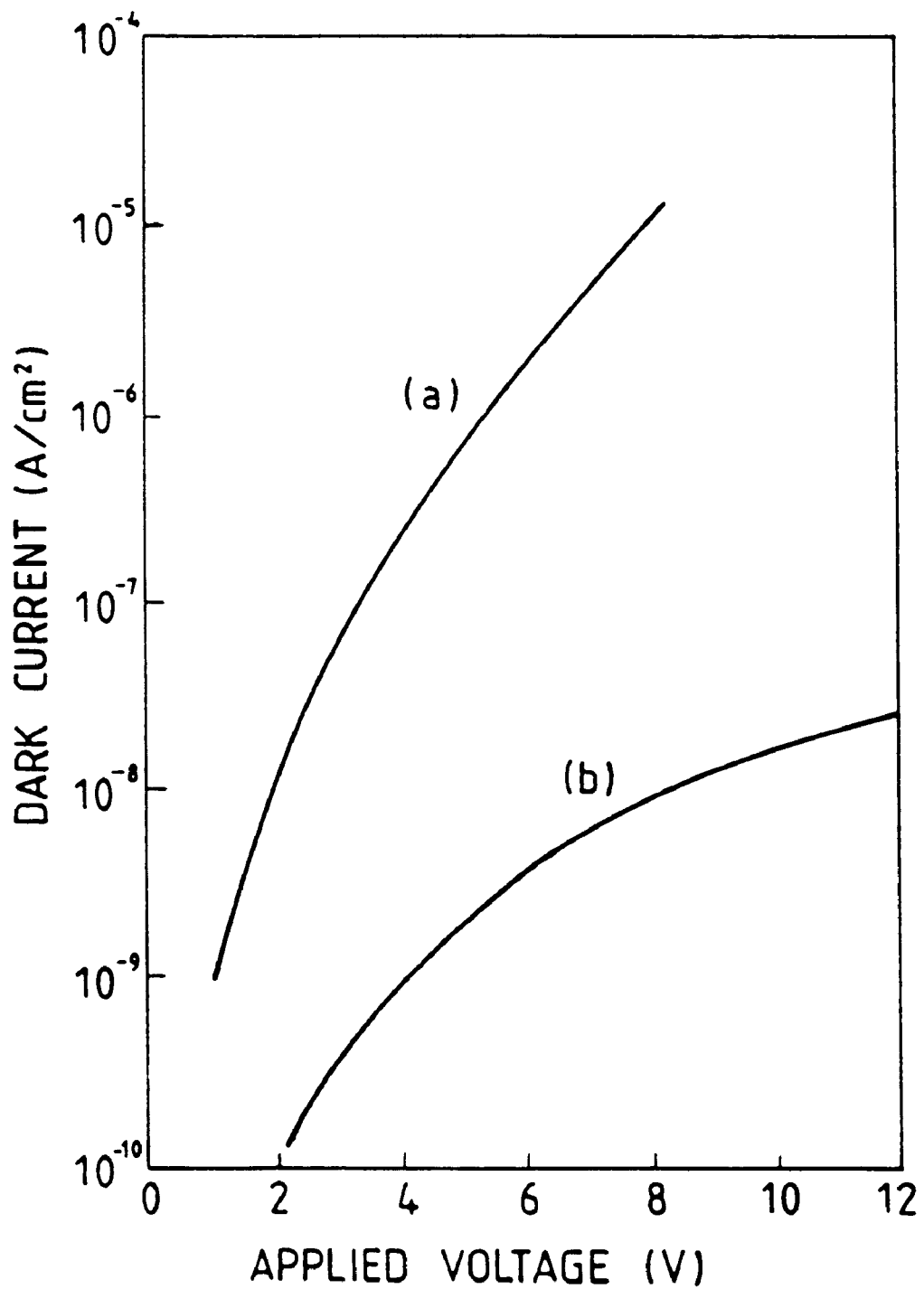
FIG. 6 is a graph for explaining a conventional problem in dark current characteristics.
Figure 7A:
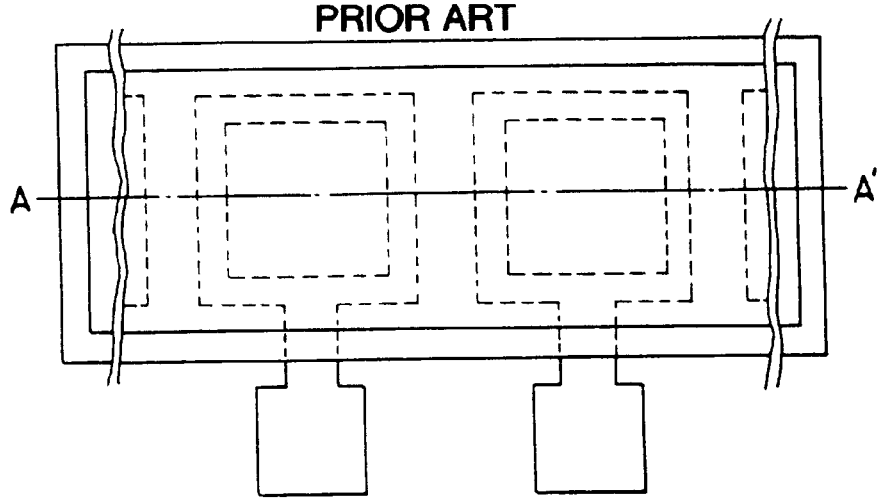
FIGS. 7A to 7C are views for explaining a mechanism which causes the conventional problem.
Figure 7B:
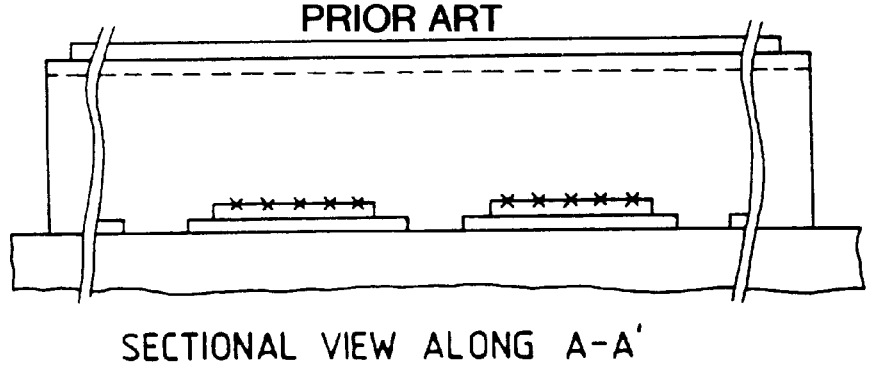
Figure 7C:
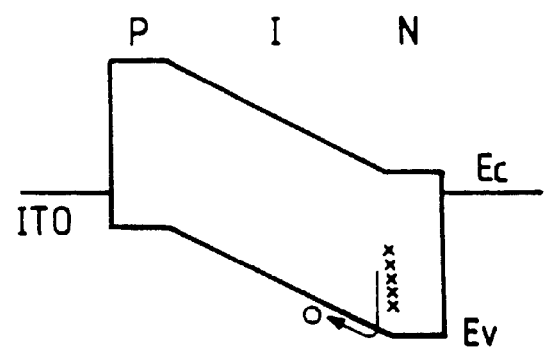
Figure 8A:
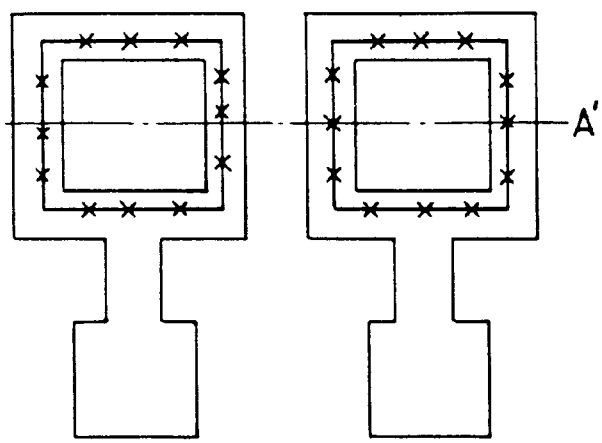
FIGS. 8A to 8C are views for explaining a mechanism which causes the conventional problem.
Figure 8B:
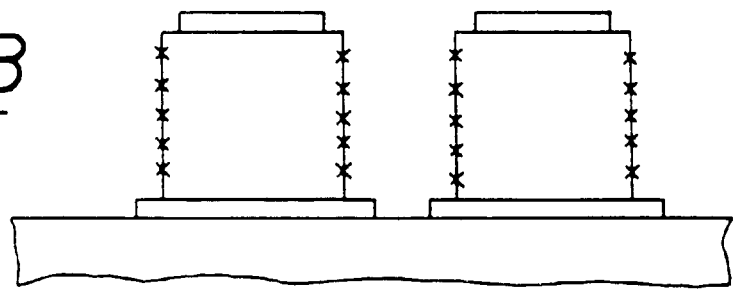
Figure 8C:
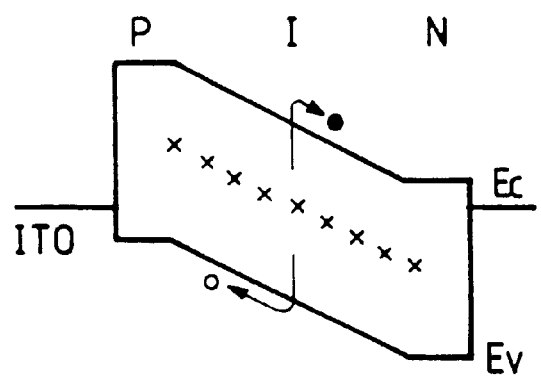
Figure 9:
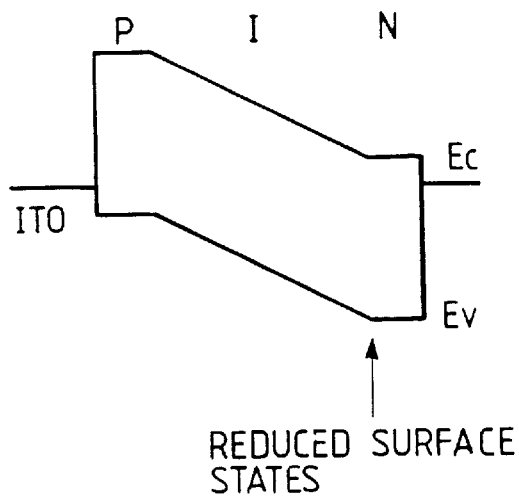
FIG. 9 is a view for explaining how the effect of the present invention prevents a dark current.

FIG. 9 is an energy band diagram obtained when a lower heavily doped impurity layer is of an n-type in the present invention. As described above, many semiconductor defects are present on the surface of the N layer after the layer is isolated into individual pixels, and so no good junction surface can be formed even if the surface is processed by wet-etching in the atmosphere or plasma etching in a vacuum chamber. In the present invention, however, since the vacuum is not broken between surface processing of the N layer and deposition of the I layer, no change of properties such as oxidation takes place in the surface layer. In addition, no semiconductor defects are induced because etching of the present invention is not one using high-energy particles, such as plasma etching. Therefore, the N/I interface can be obtained in a good state equivalent to that obtained when the N and I layers are formed continuously. This makes it possible to manufacture an element (device) having few carrier formation centers which cause an increase in a dark current.

As a result, there can be provided a photoelectric conversion element for which the isolation step required for a one-dimensional or two-dimensional arrangement can be performed easily, while taking advantage of the merit of a PIN photodiode, i.e., a small dark current. This similarly applies to an element in which isolation is performed for the P layer.

The above objects of the present invention are achieved by a method of manufacturing a photoelectric conversion device which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, hydrogen plasma processing is performed for the edges of the photoconductive film exposed by the reactive ion etching.

The present invention can realize a method of manufacturing a photoelectric conversion device, which minimizes an increase in a dark current in the isolation step, through the use of the above method.

Figure 10:
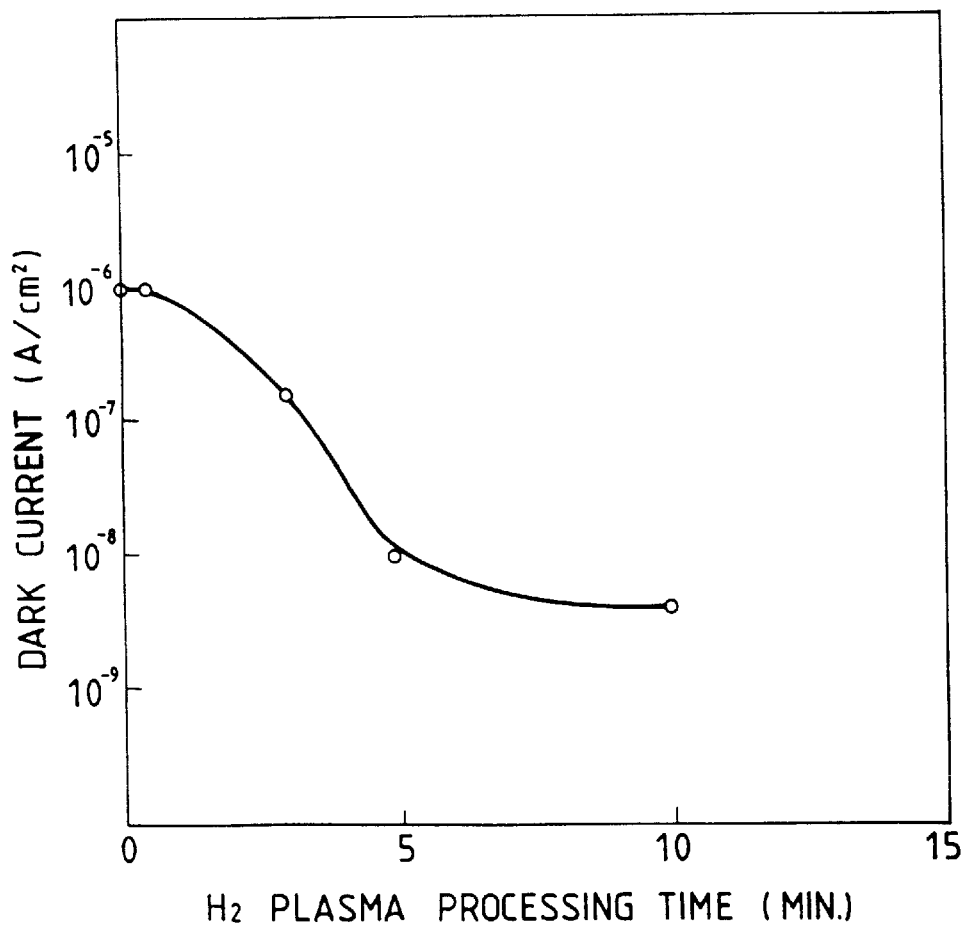
FIG. 10 is a graph showing the relationship between the processing time and the dark current in hydrogen plasma processing.

FIG. 10 is a graph showing a plot of the magnitude of a dark current when the time of hydrogen plasma processing of the present invention was changed between zero and ten minutes. As shown in FIG. 10, a decrease in the dark current became significant when about 30 seconds had elapsed and almost saturated in five minutes.

Figure 11:
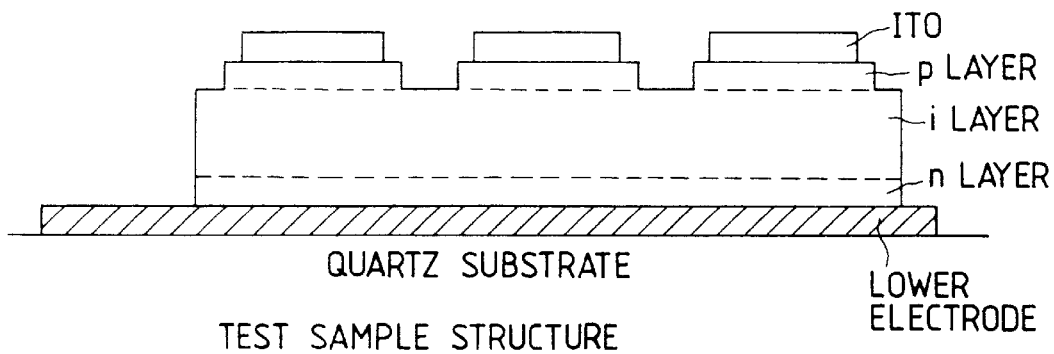
FIG. 11 is a schematic sectional view showing the arrangement of a test sample of a photoelectric conversion device in which only an upper impurity layer is subjected to wet-etching.

A value indicated by a broken line in FIG. 10 plots a dark current of a test sample formed by performing wet-etching for only an upper impurity layer (P layer) as shown in FIG. 11. The increase in the dark current obtained by performing etching for five minutes or more by the present invention was only ten times or less that in the dark current of the test sample.

The value of the dark current was about 1,000 to 10,000 times smaller than a light current with respect to a standard light quantity, i.e., a sufficient S/N ratio was obtained.

This makes it possible to provide a photoelectric conversion element for which the isolation step required for a one-dimensional or two-dimensional arrangement can be performed easily, while taking advantage of the merit of a PIN photodiode, i.e., a small dark current.

The above objects of the present invention are achieved by a method of manufacturing a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below pixels are isolated into individual pixels, wherein the photoconductive film is isolated into individual pixels through a lift-off process using a metal film as a lift-off pattern, in which a metal film of a type different from that of the electrode (lower electrode) formed below pixels is deposited before the deposition of the photoconductive film and left in regions corresponding to portions to be removed from the photoconductive film, and, after the photoconductive film is deposited, the metal film is etched away to remove the portions of the photoconductive film deposited on the metal film.

The present invention realizes a method of manufacturing a photoelectric conversion device with high reliability derived from a small dark current by the use of the above method.

That is, since no organic substance adheres to the substrate during deposition of the photoconductive film, no mixing of impurities such as O, C, and N into the photoconductive film takes place, and this prevents generation of impurity levels which cause a dark current. For this reason, the magnitude of a dark current was only several times larger than that of the test sample in which no isolation was performed for the I layer as shown in FIG. 11. In addition, the dark current was 10,000 times smaller than a light current with respect to a standard light quantity, indicating a satisfactory S/N ratio.

Furthermore, a probability that defective pixels are produced by incomplete lift-off was low, and a value of about 85 or larger was obtained as the yield.

This makes it possible to provide a photoelectric conversion element for which the isolation step required for a one-dimensional or two-dimensional arrangement can be performed easily, while taking advantage of the merit of a PIN photodiode, i.e., a small dark current.

The above objects of the present invention are achieved by a method of manufacturing a photoelectric conversion device which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, the edges of the photoconductive film exposed by the reactive ion etching are etched away by wet-etching.

By using the above method, the present invention realizes a method of manufacturing a photoelectric conversion device which minimizes an increase in a dark current in the isolation step.

Figure 12:
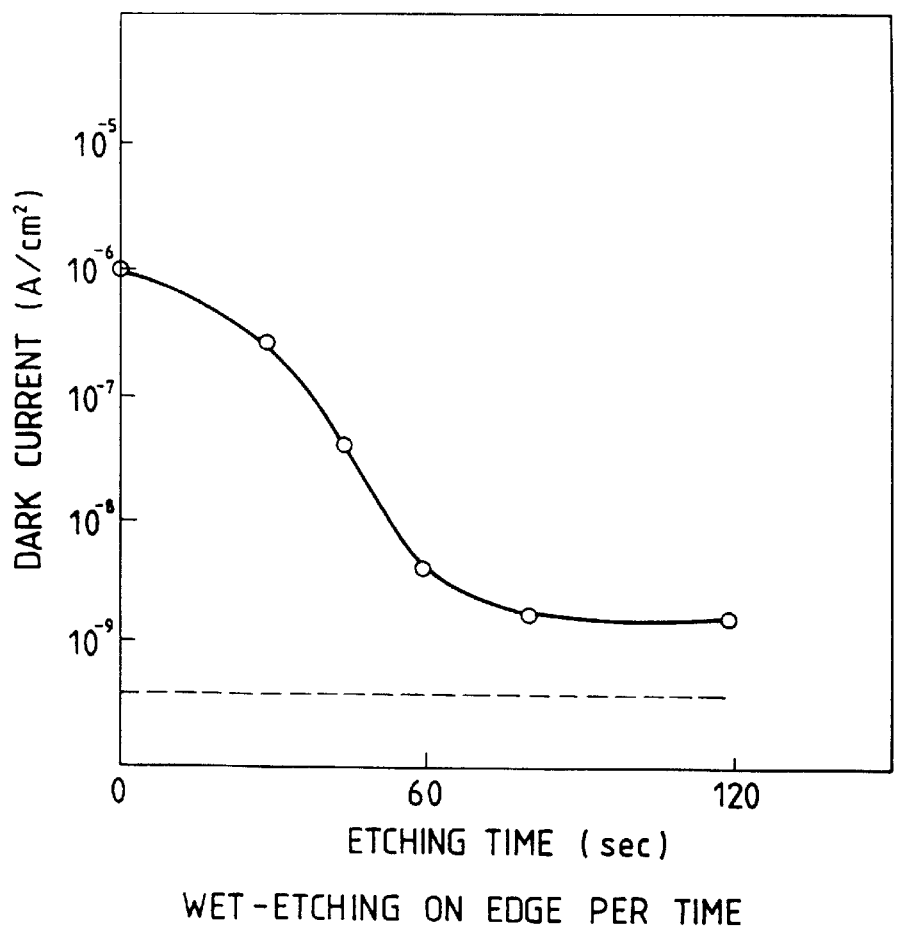
FIG. 12 is a graph showing the relationship between the etching time and the dark current in wet-etching on an edge.

FIG. 12 is a graph plotting the magnitude of a dark current when the time of wet-etching was changed from zero to two minutes in the present invention. As shown in FIG. 12, the dark current reduced significantly when approximately 30 seconds had elapsed and almost saturated in one minute.

A value indicated by a broken line in FIG. 12 plots a dark current of a test sample in which wet-etching was performed for only an upper impurity layer as shown in FIG. 11. The dark current obtained by performing etching for two or more minutes according to the present invention was small, only about several times larger than the dark current of the test sample. In addition, the value of the dark current was about 10,000 times smaller than that of a light current with respect to a standard light quantity, so a sufficient S/N ratio was obtained. Furthermore, almost no damage was found in a resist before two minutes elapsed.

This makes it possible to provide a photoelectric conversion element for which the isolation step required for a one-dimensional or two-dimensional arrangement can be performed easily, while taking advantage of the merit of a PIN photodiode, i.e., a small dark current.

The above objects of the present invention are achieved by a method of manufacturing a photoelectric conversion device which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, the edges of the photoconductive film exposed by the reactive ion etching are chemically etched in a vapor phase in a vacuum chamber.

When the photoconductive film consists of amorphous silicon hydride, the above isolation step is realized more reliably by performing the etching of the edges of the photoconductive film through a chemical reaction using a gas mixture of silane and fluorine, and by controlling the chemical reaction by adjusting the mixing ratio of silane to fluorine and the temperature of the substrate.

The present invention realizes a method of manufacturing a photoelectric conversion device, which minimizes an increase in a dark current in the isolation step, by using the above method.

Figure 13:
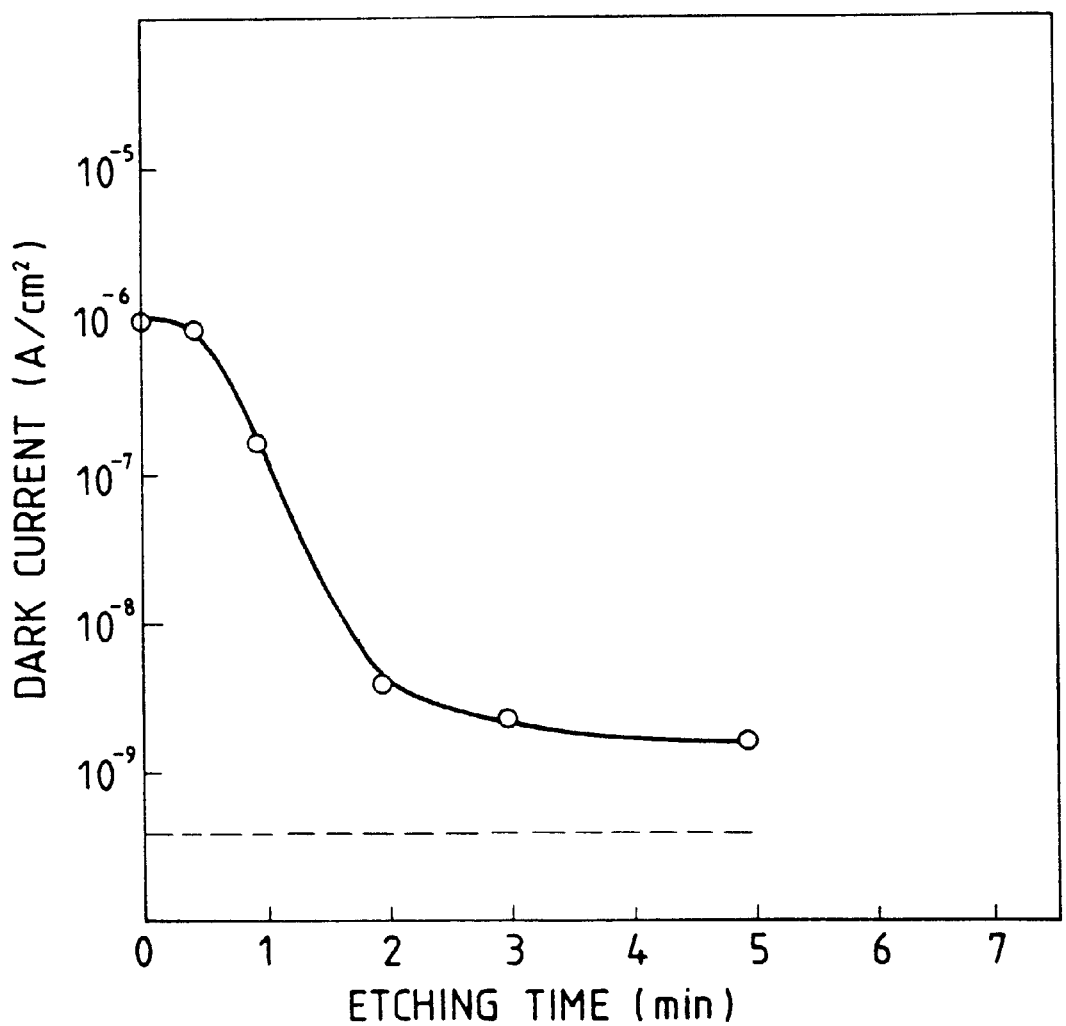
FIG. 13 is a graph showing the relationship between the etching time and the dark current in vapor phase chemical etching.

FIG. 13 is a graph which plots the magnitude of a dark current when the time of the vapor phase chemical etching was changed from zero to five minutes in the present invention. As can be seen from FIG. 13, the reduction in the dark current became significant when about 30 seconds had elapsed and almost saturated in two minutes.

A value indicated by a broken line in FIG. 13 plots a dark current of a test sample formed by performing wet-etching for only an upper impurity layer as shown in FIG. 11. The dark current obtained by performing the etching for two or more minutes according to the present invention was small, only about several times as large as the dark current of the test sample. In addition, the value of the dark current was approximately 10,000 times smaller than a light current with respect to a standard light quantity, demonstrating that a satisfactorily high S/N ratio was obtained.

Consequently, there can be provided a photoelectric conversion element for which the isolation step required for a one-dimensional or two-dimensional arrangement can be performed easily, while taking advantage of the merit of a PIN photodiode, i.e., a small dark current.

The above objects of the present invention can be achieved by a photoelectric conversion device comprising: a plurality of photoelectric conversion units; and a signal output unit having at least one of storage means for storing electrical signals generated by the photoelectric conversion units, scanning means for scanning electrical signals generated by the photoelectric conversion units, and reading means for reading out electrical signals generated by the photoelectric conversion units, each of the photoelectric conversion units having a structure in which a light absorption layer for absorbing light and a multiplication layer formed by stacking one or a plurality of step-back structure layers, which multiply carries produced upon absorption of light, and in which a forbidden band width changes continuously from a minimum forbidden band width $Eg_2$ to a maximum forbidden band width $Eg_3$, are sandwiched between a charge injection inhibiting layer stacked on the light absorption layer and a substrate having the signal output unit thereon and a charge injection inhibiting function, wherein the layer with the maximum forbidden band width $Eg_3$ consists of non-single-crystal carbon.

The structure of the photoelectric conversion unit and the energy band structure of the above photoelectric conversion device will be described below with reference to FIGS. 14A to 14C.

Figure 14A:
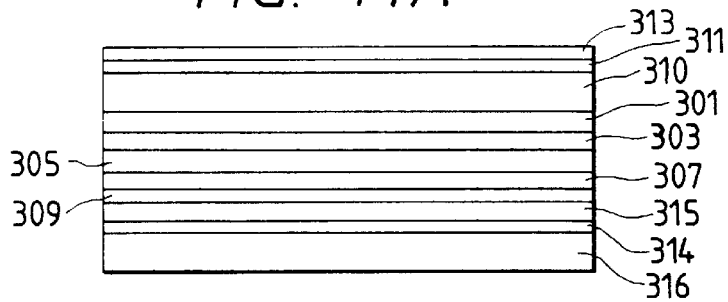
FIG. 14A is a schematic sectional view showing the structure of a photoelectric conversion unit of a photoelectric conversion device according to the present invention.

FIG. 14A is a schematic sectional view showing the structure of the photoelectric conversion unit of the photoelectric conversion device according to the present invention. Referring to FIG. 14A, an independent light absorption layer 310 and a plurality of step-back structure layers 301, 303, 305, 307, and 309 serving as the multiplication layer are sandwiched between a p-type semiconductor layer 311 serving as the charge injection inhibiting layer and an n-type semiconductor layer 315. The p-type semiconductor layer 311 is electrically connected to an electrode 313, and the n-type semiconductor layer 315 is electrically connected to an electrode 314. This structure is formed on a glass substrate 316. Note that the p-type semiconductor layer 311 serving as the charge injection inhibiting layer may of course consist of a metal which forms a Schottky junction with an adjacent semiconductor layer from which an identical effect can be expected. Note also that the step-back structure layers need not be five layers but may be one or more layers.

Figure 14B:
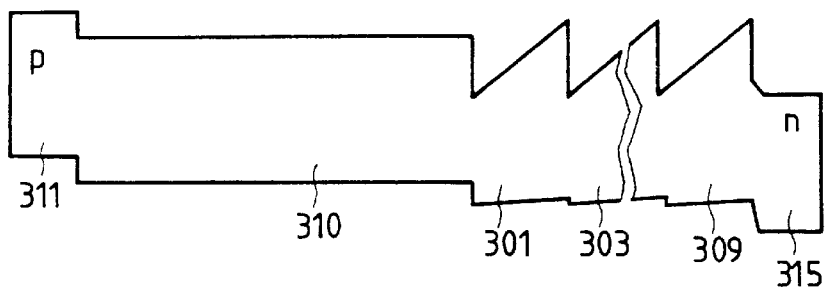
FIG. 14B is an energy band diagram of the photoelectric conversion unit shown in FIG. 14A when no bias is applied.

FIG. 14B is an energy band diagram of the above photoelectric conversion unit when no bias or a weak electric field is applied.

Figure 14C:
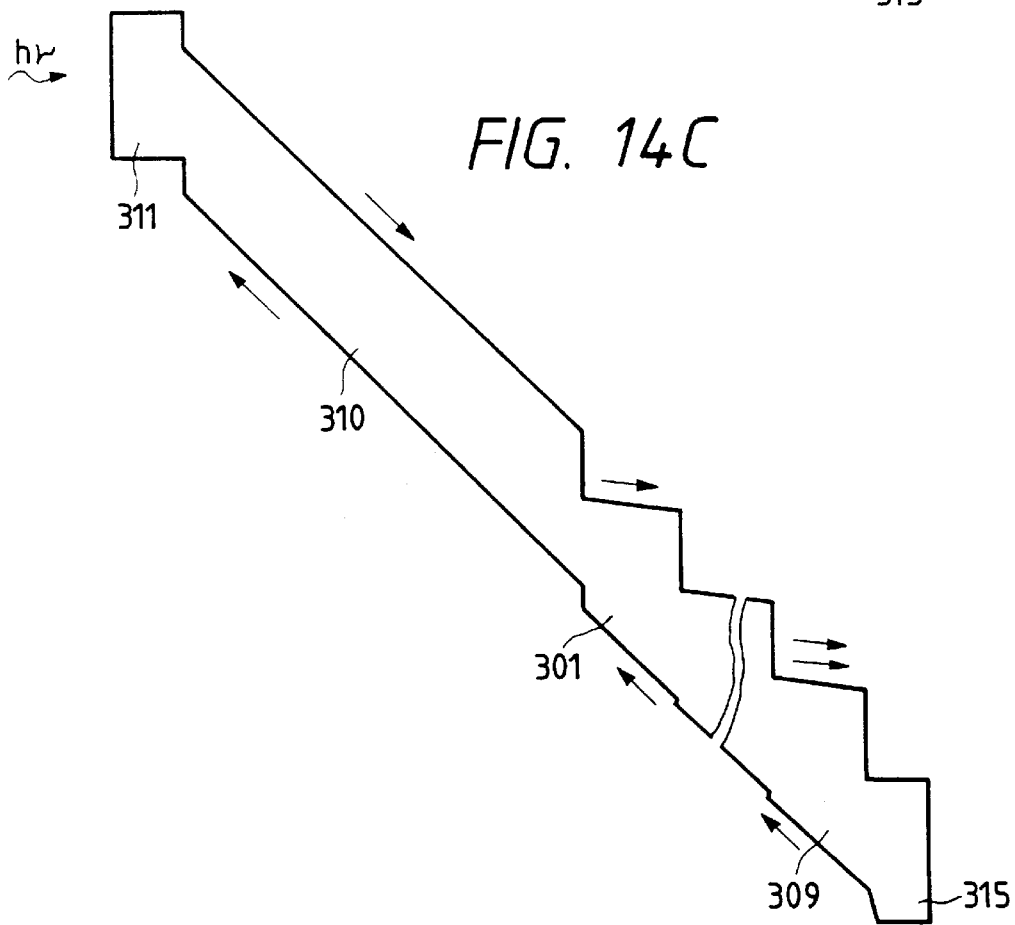
FIG. 14C is an energy band diagram of the photoelectric conversion unit shown in FIG. 14A when a reverse bias is applied.

FIG. 14C is an energy band diagram of the above photoelectric conversion unit when a reverse bias or a strong electric field is applied.

Although the operation principle of the multiplication mechanism is similar to that of the prior art proposed by Capasso et al., the photoelectric conversion unit of the photoelectric conversion device according to the present invention has the following effects.

(1) Since the discrete light absorption layer 310 is sandwiched between the step-back layers 301 to 309 and the p-type semiconductor layer 311 serving as the charge injection inhibiting layer, incidence of light on the multiplication layer is reduced, and this decreases a variation in the multiplication factor caused by incidence of light to the multiplication layer.

(2) The multiplication layer is constituted by the step-back structure layers with a large ΔEc (in the case of multiplication of electrons; the ΔEv is large in the case of multiplication of holes). This reduces noise and realizes a satisfactorily large multiplication factor.

(3) A non-single-crystal material is desirable as the material of an element according to the present invention. The non-single-crystal material means a polycrystalline material or an amorphous material, and this amorphous material includes a so-called fine-crystal structure.

More specifically, examples of the amorphous material are amorphous silicon (to be abbreviated a-Si(H,X) hereinafter) compensated by hydrogen and/or a halogen element, amorphous silicon germanium (to be abbreviated a-SiGe(H,X) hereinafter), amorphous silicon carbide (to be abbreviated a-SiC(H,X) hereinafter), polycrystalline silicon (poly-Si), polycrystalline silicon germanium (poly-SiGe), and polycrystalline silicon carbide (poly-SiC). The amorphous silicon includes one that has crystallinity by which an X-ray diffraction image of a thin film consisting of that amorphous silicon has peaks specified by Miller indices Si [111], [220], and [311] in addition to a halo pattern.

Since the material of the element is the non-single-crystal material as described above, it is possible to form an element easily at low temperatures (e.g., 200 to 300° C.) on a large-area substrate by using a plasma CVD process or the like. In addition, control of a forbidden band width can be performed easily through, e.g., composition modulation. This makes it possible not only to form the multiplication layer with the step-back structure relatively easily but to discourage thermal diffusion of atoms caused by heat or the like, yielding a step-back structure that is relatively reliable. That is, problems taking place in stacking multiple layers can be reduced.

In addition, particularly, the charge injection inhibiting layer can be made of, e.g., a material having a relatively large forbidden band width or amorphous silicon with crystallinity by which a large doping effect can be obtained. This can reduce a dark current.

(4) Since amorphous silicon hydride has a large light absorption coefficient, the film thickness of the light absorption layer can be decreased.

(5) The degree of freedom of the forbidden band width of the light absorption layer also increases for the same reason as described in item (3) above. Therefore, it is possible to manufacture a photoelectric conversion element which is highly sensitive to incident light with various wavelengths.

Furthermore, the photoelectric conversion unit according to the present invention is formed by sandwiching the light absorption layer and the multiplication layer between the charge injection inhibiting layer stacked on the light absorption layer and the substrate on which the signal output unit is formed and which has a charge injection inhibiting function. Since, therefore, the substrate with the charge injection inhibiting function on the side of the multiplication layer is already in a patterned state, it is unnecessary to perform interelement isolation by using reactive ion etching or the like. This can prevent problems occurring in a process, such as those caused by reactive ion etching, and an increase in leakage of a dark current upon isolation of elements.

The present inventors, however, have made extensive studies and has found that even the photoelectric conversion device described above has the following problem in attempting to further improve the performance of the device.

That is, it is found that variations readily take place in the manufacture of the photoelectric conversion device, since the energy step ΔEc of the step-back structure formed by a plasma CVD process or the like depends on the composition ratio of an alloy of Si and C. The result is a large variation in the ionization degree, which is a serious problem in a photoelectric conversion device constituted by a plurality of elements.

According to the above photoelectric conversion device, however, in the multiplication layer which multiplies carriers produced upon absorption of light and is formed by stacking one or a plurality of step-back structure layers in which a forbidden band width changes continuously from the minimum forbidden band width $Eg_2$ to the maximum forbidden band width $Eg_3$, the material constituting the maximum forbidden band width $Eg_3$ is a non-single-crystal material consisting of C and H rather than an alloy consisting of Si, C, and H. Therefore, a variation in the composition ratio of Si to C is reduced to increase the evenness of the energy step of the step-back structure, and this can achieve a further improvement of the performance.

The use of the non-single-crystal material also makes it possible to form a multiplication layer in which the minimum forbidden band width is larger (e.g., higher than 1.0 eV) and the energy discontinuity of the step-back heterojunction portion is large in only one of valence and conduction bands. It is therefore possible to realize a low-noise, high-efficiency multiplication operation in which not only excess noise but dark current noise is small.

In order to achieve further improvements in the performance, in a photoelectric conversion device in which a light absorption layer and a carrier multiplication layer consist of non-single-crystal materials, and the carrier multiplication layer is constituted by a plurality of layers in which a forbidden band width is inclined continuously, it is preferable that after a narrow forbidden band of the carrier multiplication layer is formed, the interface be terminated with hydrogen atoms by H plasma processing.

Figure 15:
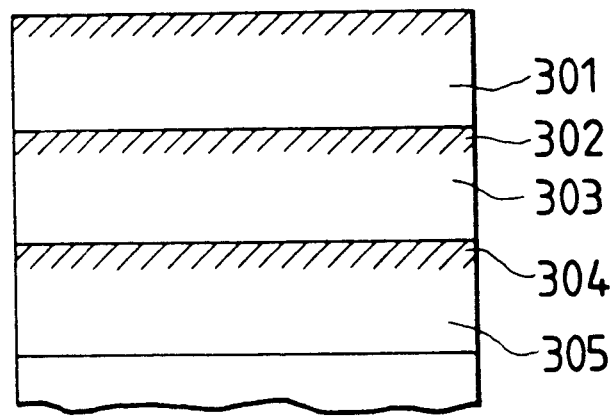
FIGS. 15 and 16 are schematic sectional views each showing the structure of a multiplication layer according to the present invention.

This photoelectric conversion device will be described below with reference to FIG. 15. FIG. 15 is a schematic view showing an example of the multilayered structure of the multiplication layer of the present invention. Referring to FIG. 15, after narrow forbidden bands are formed by forming forbidden band width inclined layers 301, 303, and 305, their interfaces are terminated with hydrogen atoms by forming layers 302 and 304.

With the above arrangement, even if a storage operation is performed and an electric field applied to the multiplication layer lowers with an increasing carrier storage amount, neither spikes nor notches are produced in the step-back heterojunction portion of the multiplication layer as shown in FIG. 15. Therefore, the band discontinuity in the step-back heterojunction portion can be maintained even by a low electric field, achieving a large ionization degree equivalent to that obtained upon application of a high electric field. In addition, no energy discontinuity occurs in a direction in which transition of carriers is interfered with. As a result, the storage operation can be performed with a high multiplication factor, a high linearity of incident light quantity-to-output characteristics, and a high response speed. The energy discontinuity amount with which transition of carriers is not interfered is preferably 0.2 eV or less, and more preferably 0.1 eV or less at room temperature.

According to the above arrangement, therefore, the light absorption layer and the multiplication layer are made of non-single-crystal semiconductor materials, and an impurity is doped to the multiplication layer, thereby maintaining the difference between a Fermi level and a vacuum energy level in the vicinity of the heterojunction portion substantially constant. This realizes a photoelectric conversion device in which spikes and notches in the heterojunction portion are eliminated and performance is not degraded even during the storage operation, and which has a high multiplication factor and a high response speed, is useful in industrial applications, and can be stacked on a semiconductor substrate on which a circuit is already formed.

In addition, in the carrier multiplication layer in which the forbidden band of the non-single-crystal material is inclined continuously, after the minimum forbidden band width is formed, the surface of this minimum forbidden band width region is terminated with hydrogen atoms. This suppresses occurrence of defect levels, such as dangling bonds, which are caused by diffusion of hydrogen in a film into the heterojunction portion. As a result, the transit properties of carriers are improved, making high-efficiency multiplication possible.

Furthermore, in the photoelectric conversion device described above, after a narrow forbidden band of the carrier multiplication layer is formed, it is preferable that a thin wide-forbidden-band layers be formed and the surface of this wide forbidden band be terminated with hydrogen ions by H plasma processing.

Figure 16:
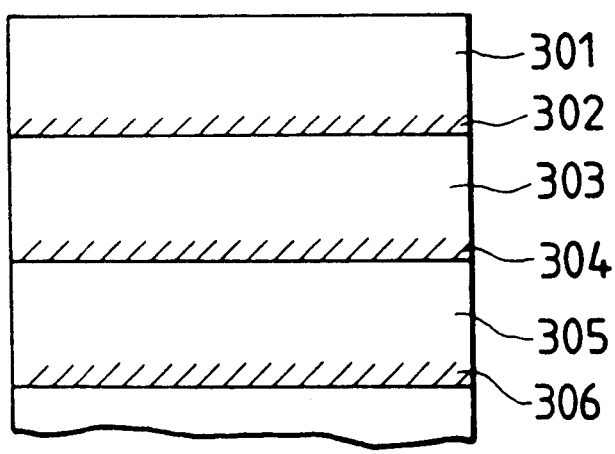

FIG. 16 is a schematic view showing the multilayered structure of the multiplication layer according to the present invention. Referring to FIG. 16, after narrow forbidden bands are formed by forming forbidden band width inclined layers 301, 303, and 305, thin wide-forbidden-band layers are formed, and their surfaces are terminated with hydrogen atoms by forming layers 302, 304, and 306.

In addition, in the carrier multiplication layer in which the forbidden band of the non-single-crystal material is inclined continuously, after a minimum forbidden band width is formed, a thin maximum forbidden band width is formed, and the surface of this maximum forbidden band width is terminated with hydrogen atoms. This prevents extraction of hydrogen from the minimum forbidden band width layer, thereby discouraging occurrence of defect levels, such as dangling bonds, which are caused by diffusion of hydrogen in a film into the heterojunction portion. As a result, the transit properties of carriers are improved, making high-efficiency multiplication possible.

The embodiments and the examples according to the present invention will be described below.

Embodiment 1

This embodiment is realized by a photoelectric conversion device which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and the heavily doped impurity layer and the electrode layer formed below the semiconductor layer not doped with or doped slightly with an impurity for controlling a conductivity type are isolated into individual pixels, wherein the surface of the heavily doped impurity layer to be isolated into individual pixels is chemically etched by a gas mixture of $SiH_4$ and $F_2$ in a vacuum chamber, and then the semiconductor layer not doped with or doped slightly with an impurity for controlling a conductivity type is deposited without breaking the vacuum.

In the present invention, the substrate on which the above photoelectric conversion element is formed is not limited to glass, a semiconductor substrate, or a metal but may be any material, provided that the material has a heat resistance against about 300° C.

Figure 17:
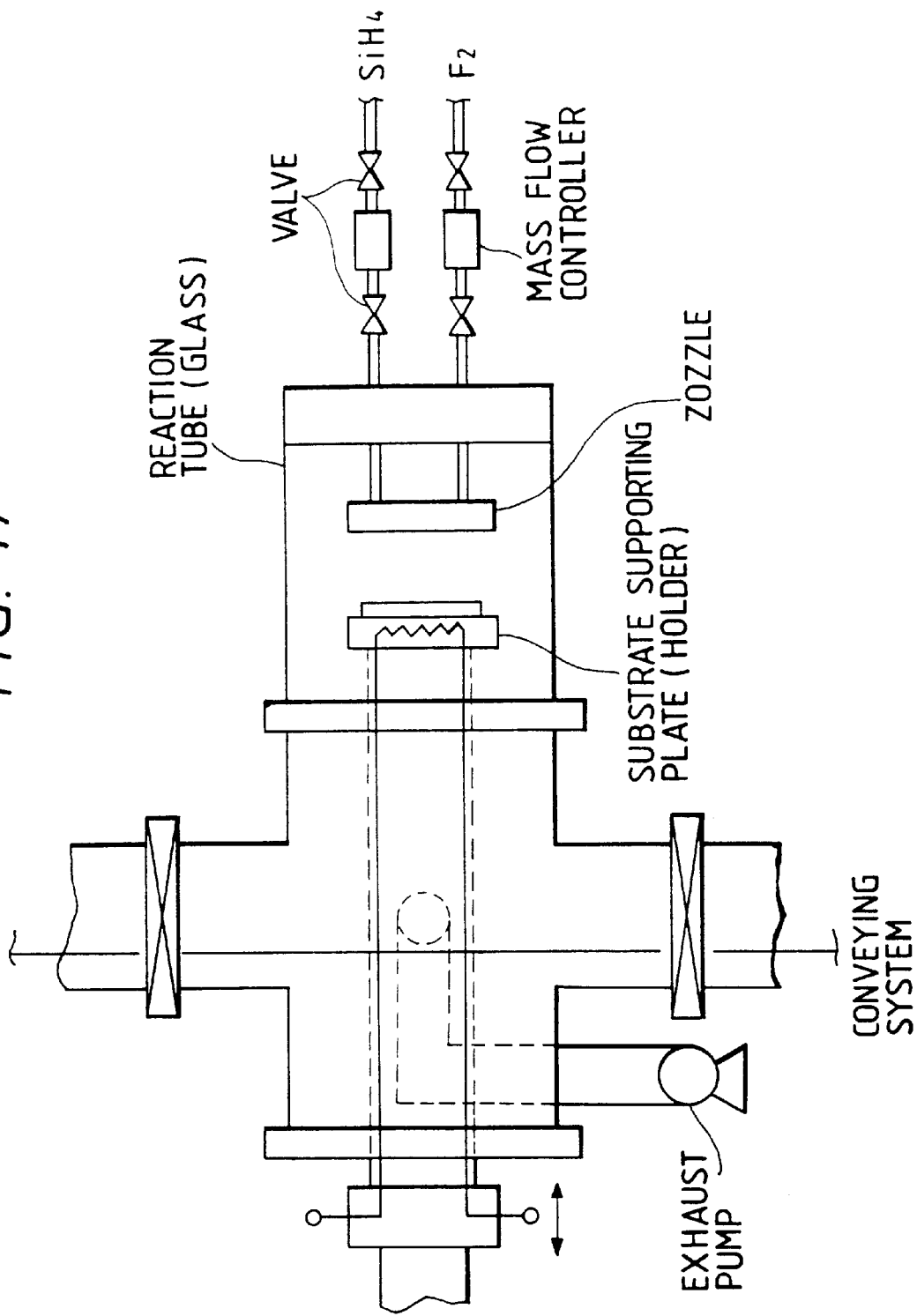
FIG. 17 is a schematic view showing the arrangement of an apparatus for performing a vapor phase chemical reaction according to the present invention.

FIG. 17 shows the outline of a reaction apparatus used in the present invention. The reaction is performed in a reaction tube 300 mm in diameter which consists of pyrex or quartz. Gases to be used in the reaction are introduced to the entrance of the reaction tube via mass flow controllers and supplied from a nozzle provided on one side of the reaction tube. The gases thus supplied are blown against a substrate supported by a movable arm on the other side of the tube. The gases used are exhausted from a portion below the arm for supporting the substrate by an exhaust system. The substrate is conveyed by a conveying system from a film formation chamber adjacent to the reaction chamber via a gate valve. A holder which supports the substrate is moved to the reaction position by the arm. In FIG. 17, the conveyance chamber is placed above the exhaust system. When the gate valve is opened, a substrate holder conveyed from another film formation chamber is stopped at a position where the movable arm is contracted in the reaction chamber, and placed on the arm automatically. The holder can be moved to a position in front of the nozzle by extending the arm (FIG. 17). In addition, since a heater is embedded in the distal end of the arm, the substrate can be heated.

Figure 18:
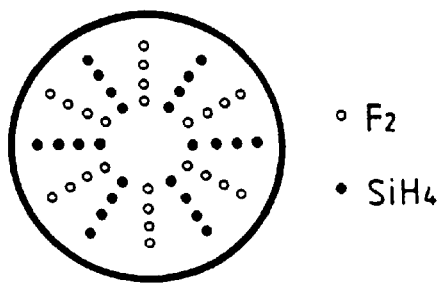
FIG. 18 is a front view showing a reaction gas supply nozzle.

As shown in FIG. 18, nozzle holes 1 mm in diameter are formed radially from the center of the circular surface of the gas supply nozzle, and silane and fluorine are injected from every other array of the holes.

Figure 19:
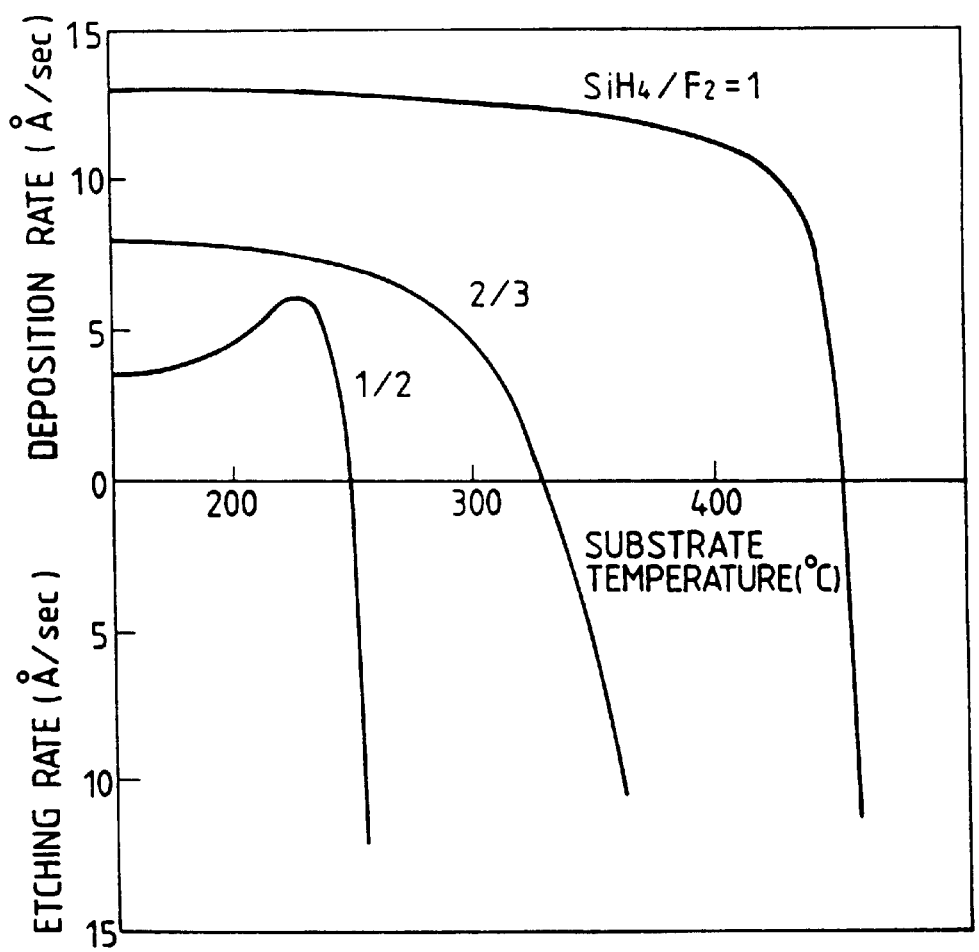
FIG. 19 is a graph showing the basic characteristics of a reaction used in the present invention.

In the present invention, the flow rate ratio of $SiH_4$ to $F_2$ of the gas mixture used in etching and the substrate temperature are determined in accordance with a correlation as shown in FIG. 19. As is apparent from FIG. 19, the tendency of the reaction is such that film deposition is performed at relatively stable rates for several different gas ratios at low temperatures, but, when the substrate temperature rises, the deposition rate decreases abruptly from a certain temperature, and deposition finally changes to etching of the film. This change from deposition to etching occurs abruptly when the $SiH_4/F_2$ ratio is 1/2 or lower, and consequently control using the temperature entirely loses its precision. If the ratio is 1 or higher, on the other hand, the change also takes place abruptly, and a temperature range within which the change occurs exceeds 450° C. This ratio is therefore impractical in a process for handling amorphous silicon hydride.

Figure 20:
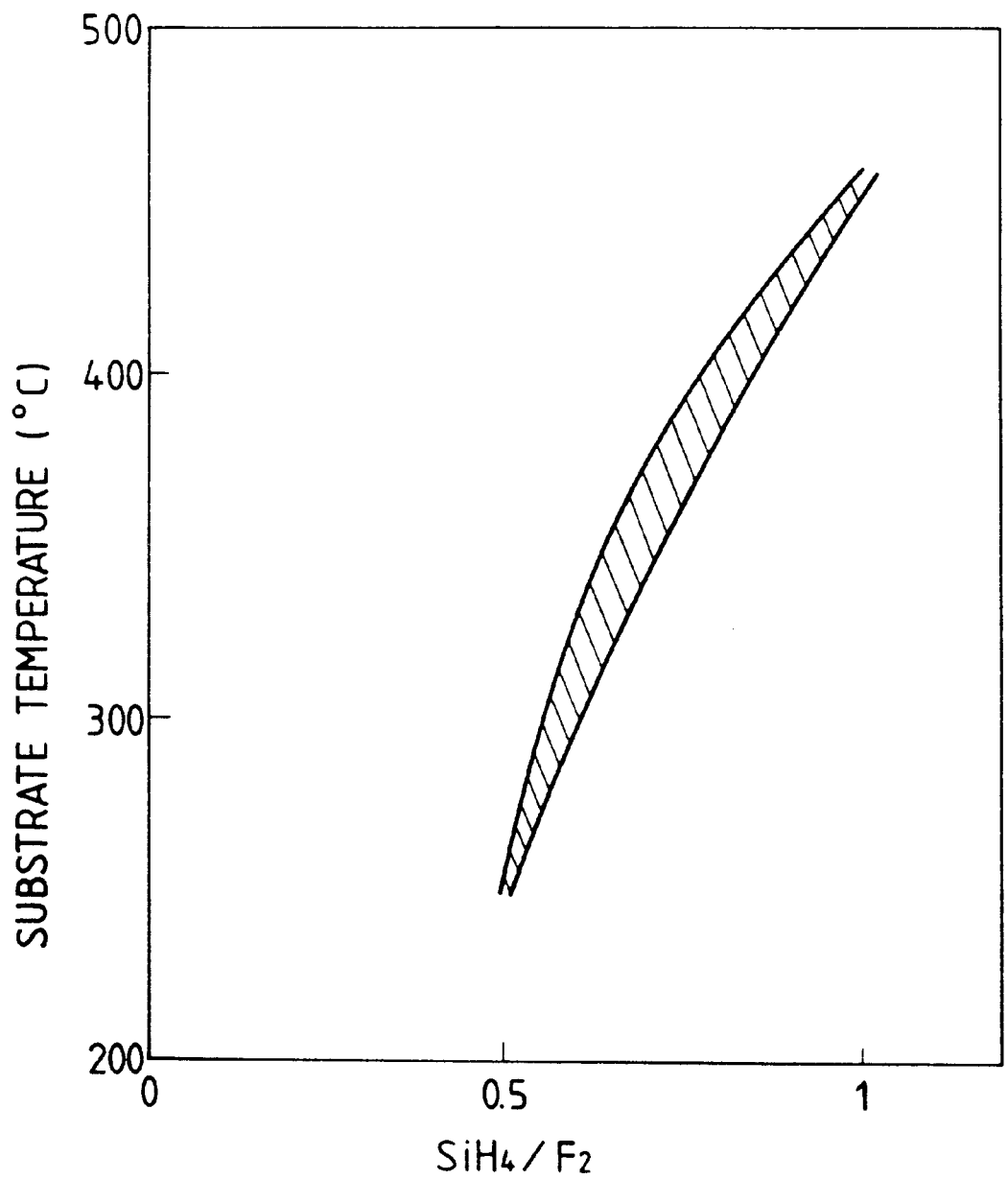
FIG. 20 is a graph showing conditions for performing etching by using the reaction shown in FIG. 19.

It is therefore desirable to set the $SiH_4/F_2$ gas ratio between 1/2 and 1. In addition, since the etching thickness is about 1,000 Å, an etching rate of 1 to 10 Å/sec is suitable in respect of time control. When these conditions are taken into account, the substrate temperature preferably falls within the range indicated by a hatched portion in FIG. 20.

Example 1-1

Figure 21A:
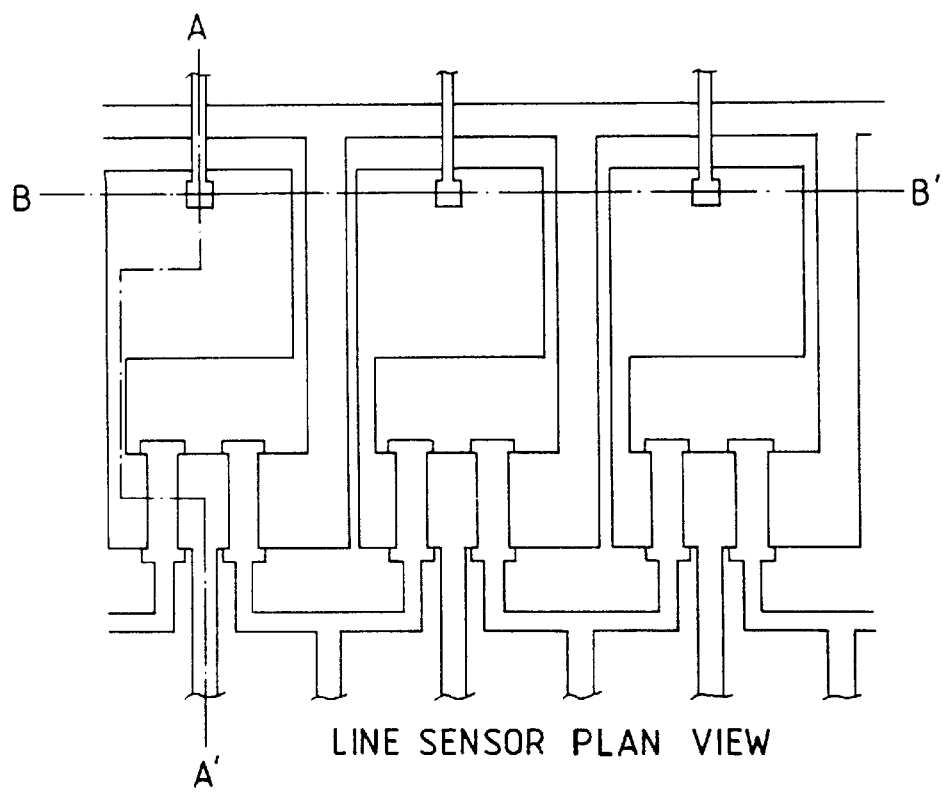
FIGS. 21A to 21C and 29A to 29C are schematic views each showing the structure of a line sensor according to an embodiment of the present invention.
Figure 21B:
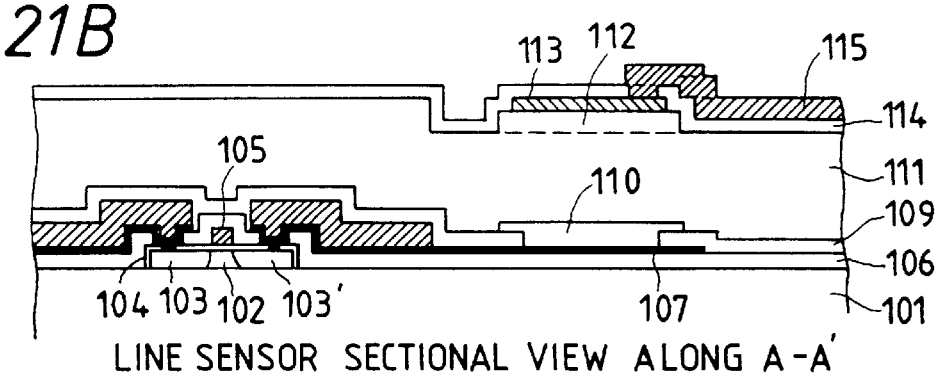
Figure 21C:
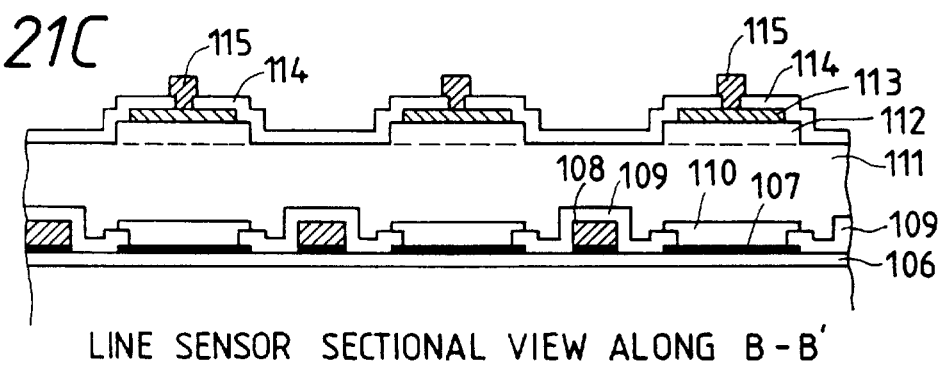

FIG. 21A is a schematic plan view showing a photoelectric conversion device according to this example, FIG. 21B is a sectional view taken along a line A–A' in FIG. 21A, and FIG. 21C is a sectional view taken along a line B–B' in FIG. 21A.

As shown in FIG. 21B, deposition was performed for 10 minutes at an $SiH_4$ gas flow rate of 50 SCCM, a substrate temperature of 620° C., and an internal pressure of 0.3 Torr by using a regular LP-CVD process, thereby forming a 1,000-Å thick polysilicon layer 102 on a quartz substrate 101.

The resultant polysilicon layer was etched into a desired shape by conventional photolithography.

Thereafter, thermal oxidation was performed in an $O_2$ atmosphere at 900° C. for 2.5 hours to form a 500-Å thick oxide film 104 on the surface of the polysilicon layer 102.

Subsequently, deposition was performed for 30 minutes at an $SiH_4$ gas flow rate of 50 SCCM, a substrate temperature of 620° C., and an internal pressure of 0.3 Torr by using the conventional LP-CVD process, thereby forming a polysilicon layer 105 having a thickness of 3,000 Å. $B^-$ ions were implanted in the entire surface of the resultant polysilicon layer at a dose of 8E15 $cm^{-2}$ and 60 keV through a regular ion implantation process. The $B^-$ ions implanted were then diffused by performing annealing in an $N_2$ atmosphere at 800° C., imparting the p conductivity type to the polysilicon layer 105. Thereafter, the polysilicon layer 105 was etched into a desired shape by the conventional photolithographic step, thereby forming a gate electrode of a MOS transistor.

$P^+$ions were then implanted in the entire surface of the resultant structure at a dose of 5E15 $cm^{-2}$ and 160 keV by the regular ion implantation, and annealing was performed in an $N_2$ atmosphere at 800° C. to diffuse the $P^+$ ions thus implanted, forming source and drain electrodes 103 and 103' of the MOS transistor.

The description of the manufacturing process will be continued with reference to FIGS. 22A to 22I.

Subsequently, deposition was performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and the oxide film 104 were etched into a desired shape by the conventional photolithography, forming holes for extracting the source and drain electrodes.

On top of the resultant structure, a 2,000-Å thick Cr layer 107 and a 1,000-Å thick Al layer 108 were deposited by sputtering. Thereafter, etching was performed to obtain a desired shape by the conventional photolithography such that the Al layer was removed from prospective pixel formation portions and left on steps of the holes for extraction from the MOS transistor, forming lower electrodes.

Figure 22A:
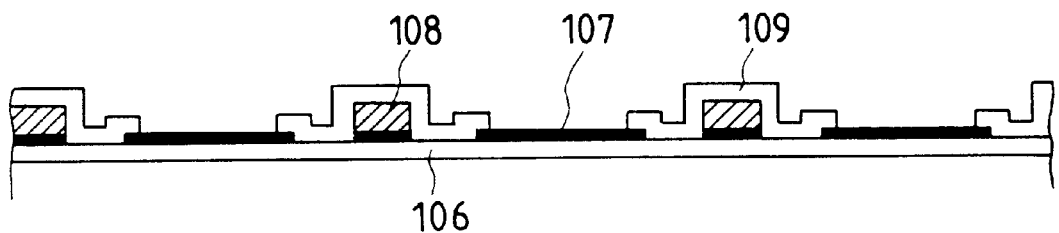
FIGS. 22A to 22I, 30A to 30H, 32A to 32I, 33A to 33F, 34A to 34F, and 35A to 35F are sectional views each showing a step of a method of manufacturing a photoelectric conversion device according to an embodiment of the present invention.

Subsequently, an 8,000-Å thick SiN layer 109 was formed by performing deposition for 160 minutes at $SiH_4$, $HN_3$, and $H_2$ gas flow rates of 0.5, 14.4, and 4.5 SCCM, respectively, a substrate temperature of 200° C., an RF power of 3.5 W, and an internal pressure of 0.15 Torr by the use of the plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 22A).

Figure 22B:
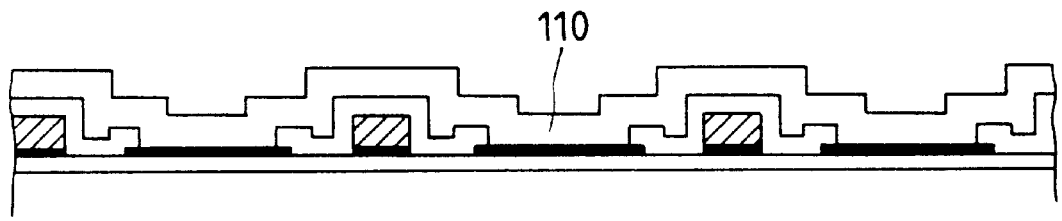
Figure 22C:
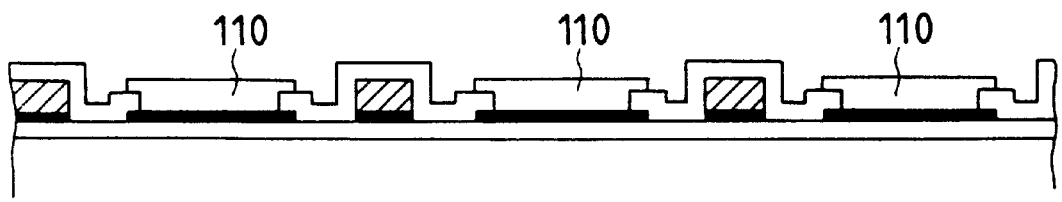
Figure 24:
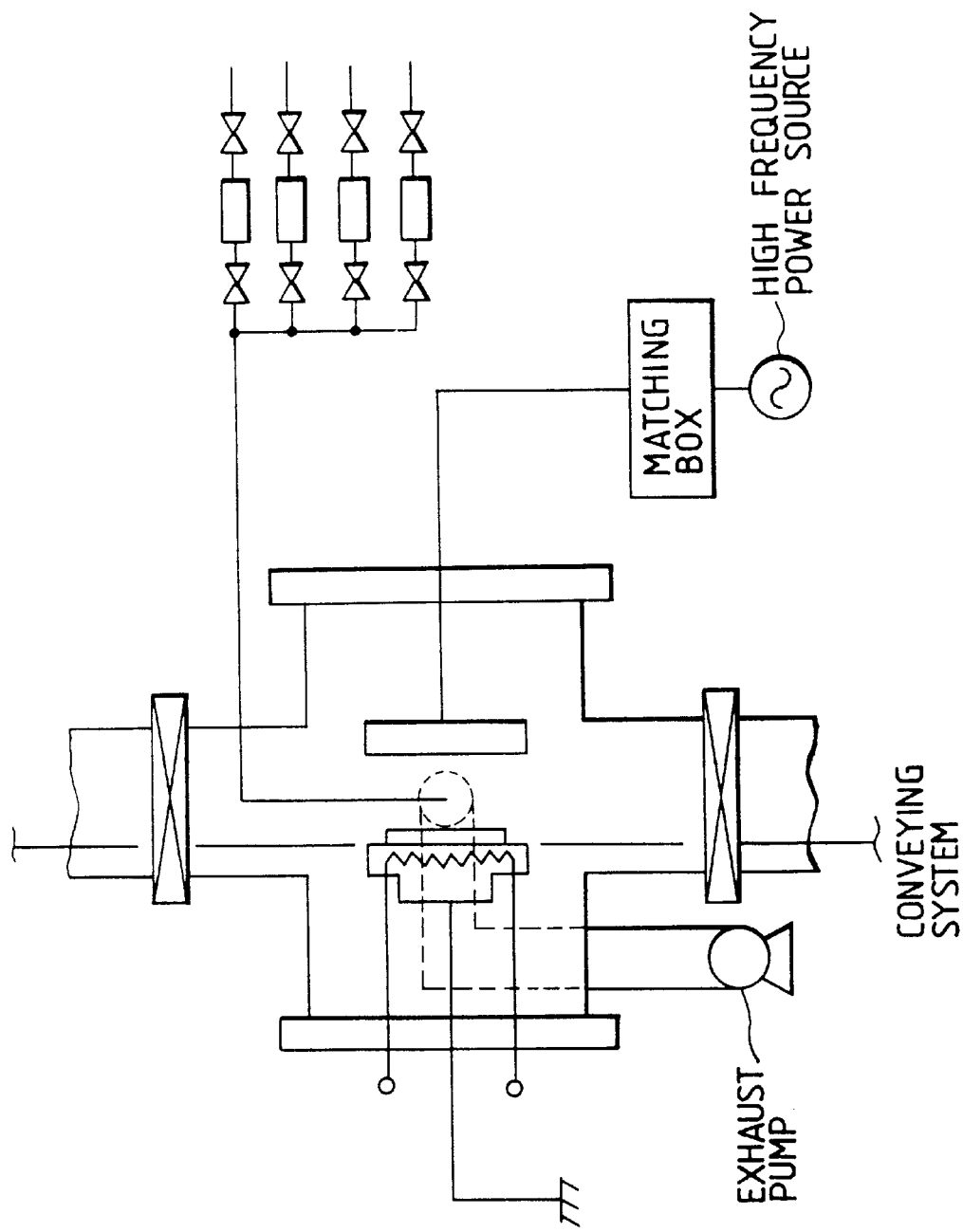
FIG. 24 is a schematic view showing the arrangement of a general apparatus for depositing a photoconductive film.

Thereafter, in a parallel-plate capacitive-coupling glow discharge apparatus shown in FIG. 24, deposition was performed for 30 minutes at an $SiH_4$ gas flow rate of 0.5 SCCM, a gas flow rate of $H_2$-diluted 100-ppm $PH_3$ of 50 SCCM, a substrate temperature of 300° C., an RF power of 18 W, and an internal pressure of 0.15 Torr by using the conventional plasma CVD process, thereby forming an $n^+$-type fine-crystal silicon ($n^+$-$\mu$c-Si:H) layer 110 having a thickness of 1,000 Å (FIG. 22B). The $n^+$-$\mu$c-Si:H layer 110 was then etched into a desired shape by the conventional photolithography, thereby performing pixel isolation (FIG. 22C).

Figure 22D:
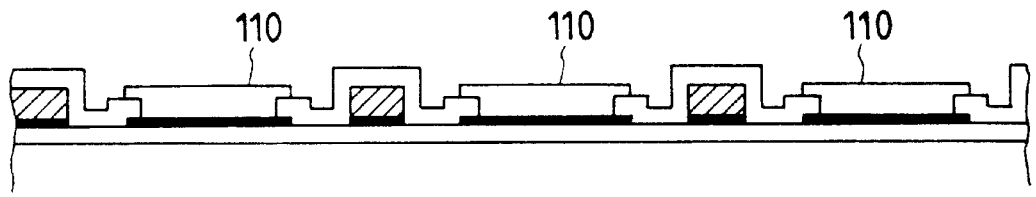
Figure 23:
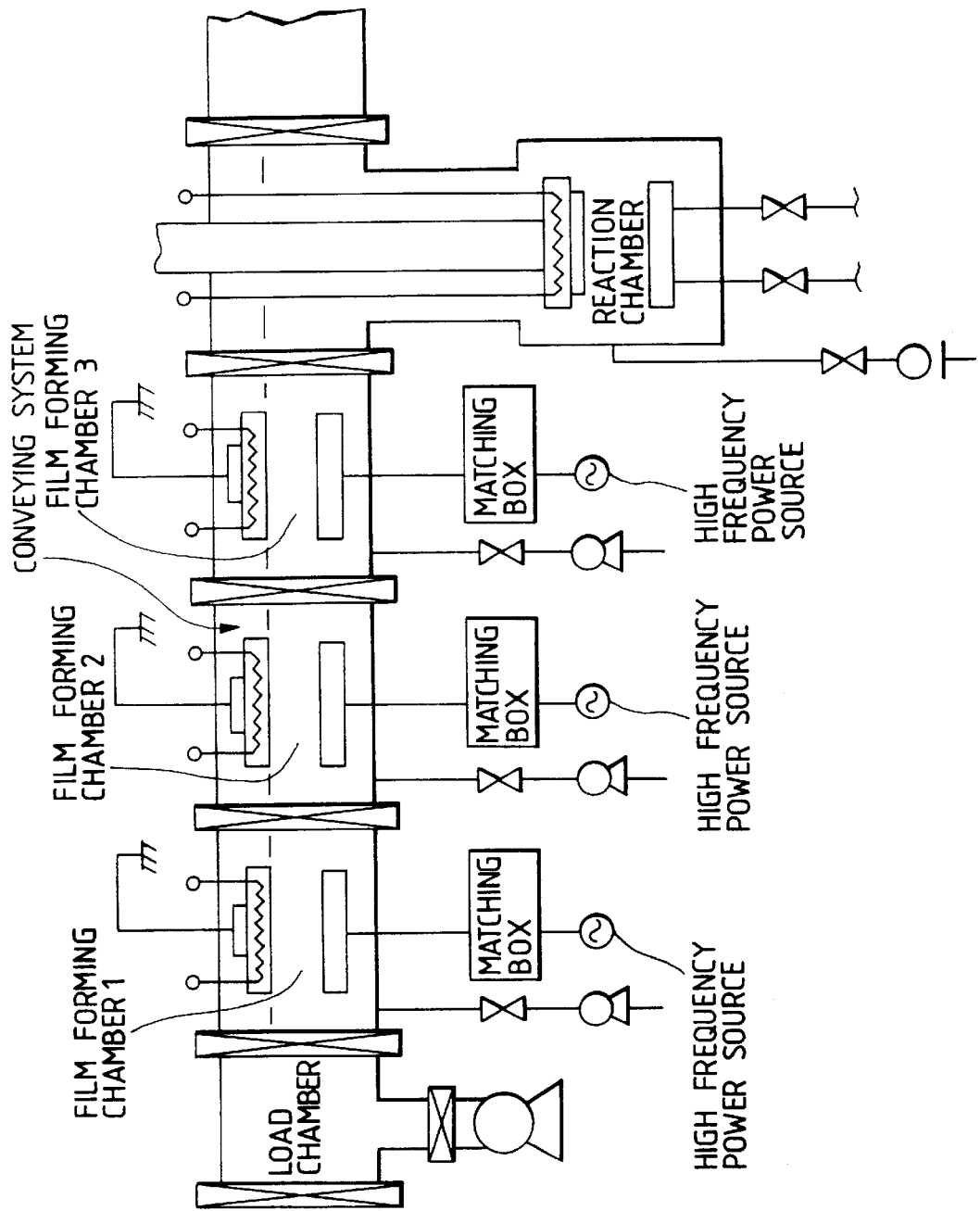
FIG. 23 is a schematic view showing an arrangement when a deposition apparatus and a reaction apparatus are used in a load-lock arrangement.

Subsequently, the resultant substrate was placed in a reaction apparatus coupled with the glow discharge apparatus shown in FIG. 24 by an arrangement as shown in FIG. 23, and a reaction was performed for 50 seconds at $SiH_4$ and $F_2$ gas flow rates of 240 and 360 SCCM, respectively, a substrate temperature of 340° C., and an internal pressure of 0.55 Torr. Consequently, the surface of the $n^+$-$\mu$c-Si:H layer 110 was etched by a depth of 100 Å (FIG. 22D).

The substrate was then moved to the apparatus shown in FIG. 24 without breaking the vacuum, and deposition was performed for 280 minutes at $SiH_4$ and $H_2$ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of $SiH_4$, $H_2$-diluted 100-ppm $B_2H_6$, and $H_2$ of 0.5, 25, and 25 SCCM, respectively, a substrate temperature of 200° C., an RF power of 18.0 W, and an internal pressure of 0.15 Torr. As a result, a $p^+$-type fine-crystal silicon ($p^+$-$\mu$c-Si:H) layer 112 having a thickness of 1,000 Å was formed.

Figure 22E:
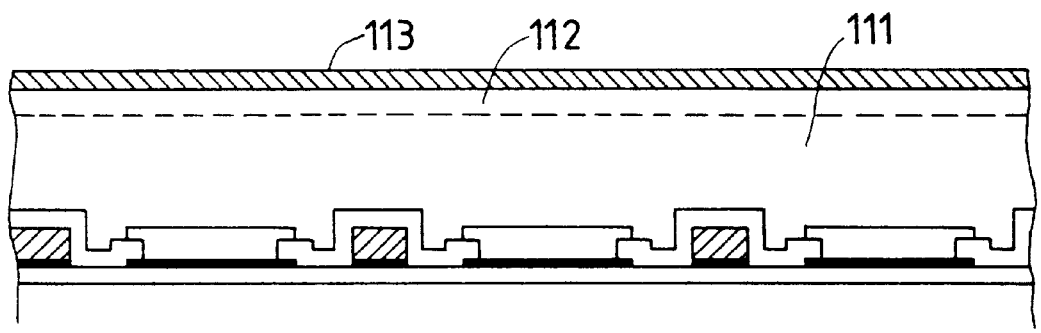
Figure 22F:
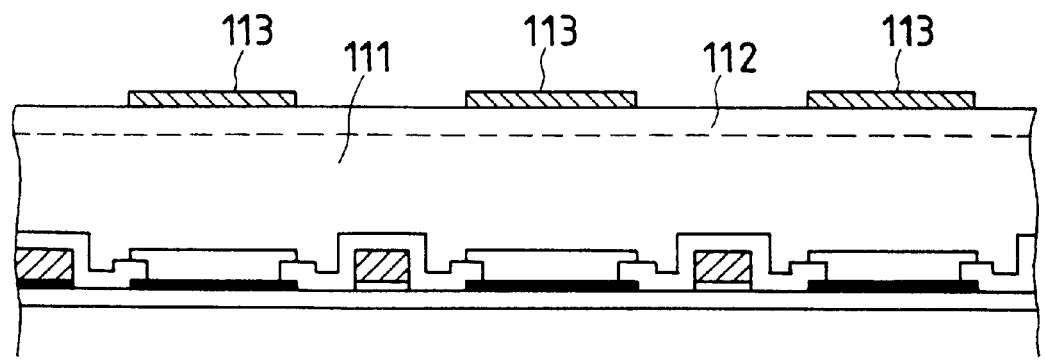
Figure 22G:
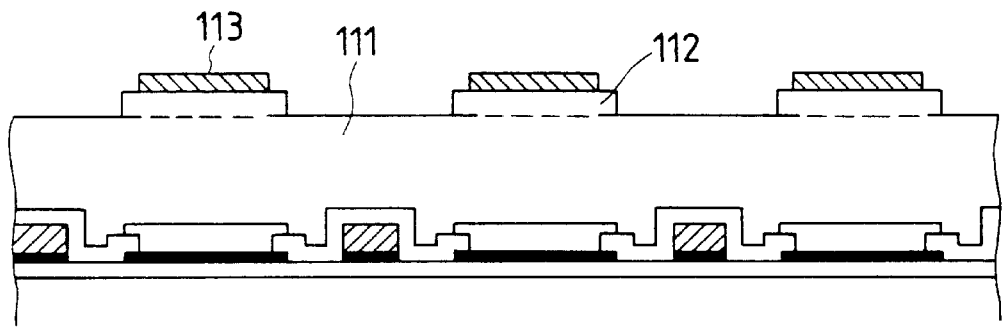

Thereafter, a 700-Å thick transparent electrode ITO layer 113 was formed by the conventional sputtering process (FIG. 22E). Subsequently, this ITO layer and the $p^+$-$\mu$c-Si:H layer were etched into a desired shape by the conventional photolithographic step, forming upper pixel regions of photodiodes (FIGS. 22F and 22G).

Figure 22H:
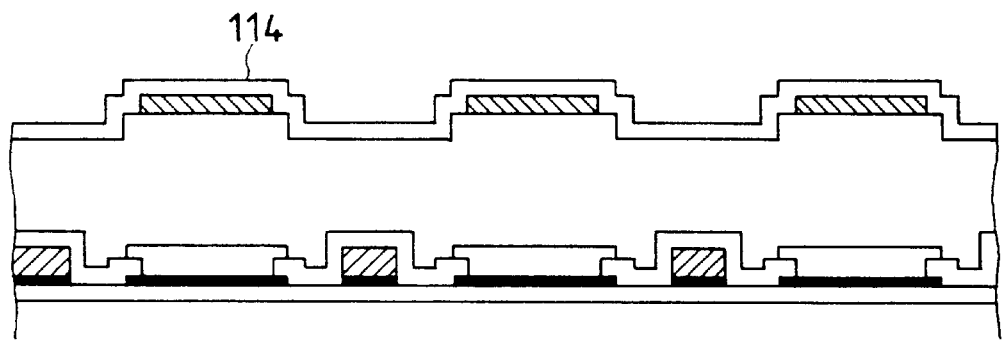

Thereafter, an SiN layer 114 having a thickness of 8,000 Å was formed through deposition performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD (FIG. 22H).

This SiN layer 114 was then etched into a desired shape by the conventional photolithographic process, forming holes for extracting upper wiring electrodes.

Figure 22I:
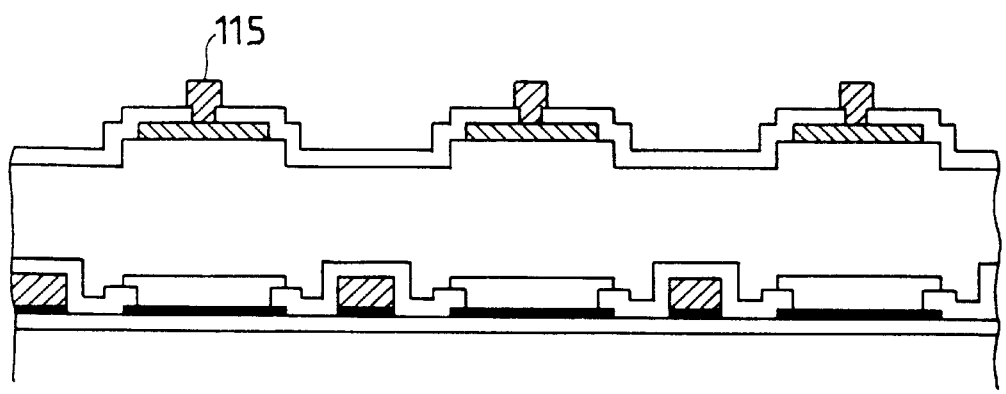

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention (FIG. 22I).

This photoelectric conversion device had an S/N ratio of 70 dB, while the S/N ratio of a photoelectric conversion device manufactured through exactly the same process except that no step of etching the surface of the $n^+$-$\mu$c-Si:H layer 110 by using a gas mixture of $SiH_4$ and $F_2$ was performed was only 40 dB due to an increase in a dark current. This demonstrates that the process of the present invention realized the photoelectric conversion device whose characteristics were not much degraded by a dark current.

In addition, no plasma was used in the interface processing method according to the present invention which was performed after isolation of pixels. Therefore, no deterioration in characteristics was induced since the underlying circuit was not adversely affected by physical shocks of ions.

Embodiment 2

This embodiment is realized by a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, hydrogen plasma processing is performed for the edges of the photoconductive film exposed by the reactive ion etching.

In addition, when the electrode (upper electrode) formed on top of the photoconductive film consists of a transparent conductive film, the present invention can be realized more reliably by coating the transparent conductive film with a metal film before the hydrogen plasma processing, and by removing the metal film by wet-etching after the hydrogen plasma processing.

In this embodiment, like in the above embodiment, the substrate on which the above photoelectric conversion element is formed is not limited to glass, a semiconductor substrate, or a heat-resistant resin but may be any material as long as the material has a heat resistance against about 300° C.

The conditions of the hydrogen plasma processing performed in the present invention are determined as follows.

First, the hydrogen plasma processing is performed in a conventional parallel-plate capacitive-coupling glow discharge apparatus by supplying an RF power of 13.56 MHz.

Discharge is performed with a distance between parallel plate electrodes of normally 25 to 75 mm.

An internal pressure during the discharge is determined by a correlation with the interelectrode distance. Assuming that the interelectrode distance is dE (mm) and the internal pressure is Pr (Torr), their product is so determined as to fall within the following range:

10≦dE·Pr≦80 (mm·Torr)

As an example, if dE=50 mm, the value of Pr is so determined as to fall within the range of 0.2 to 1.6 (Torr).

Figure 25:
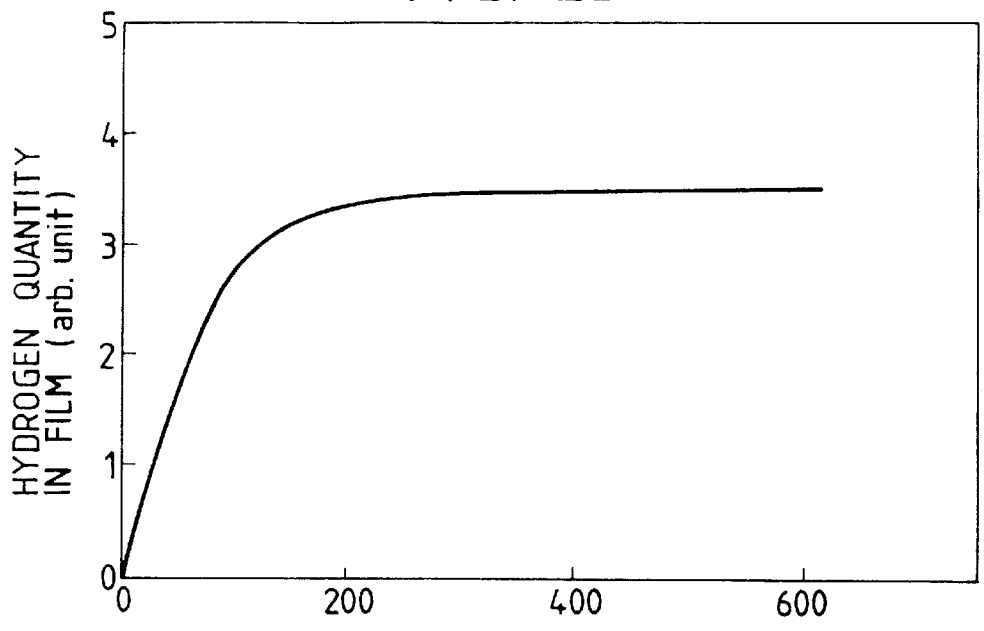
FIG. 25 is a graph showing the relationship between the power and the hydrogen quantity in a film in hydrogen plasma processing.

As shown in FIG. 25, when the RF power is increased to be 100 mW/cm$^2$ or higher, the quantity of hydrogen adhering to a film saturates. The minimum value of the power is therefore determined to be 100 mW/cm$^2$. The maximum value of the power, on the other hand, need only be determined so as not to exceed the power of reactive ion etching for performing pixel isolation. Since a power supplied to reactive ion etching is commonly about 120 mW/cm$^2$ for CF$_4$ gas, the maximum value of the power for hydrogen is preferably set at approximately 4.5 W/cm$^2$.

Figure 26:
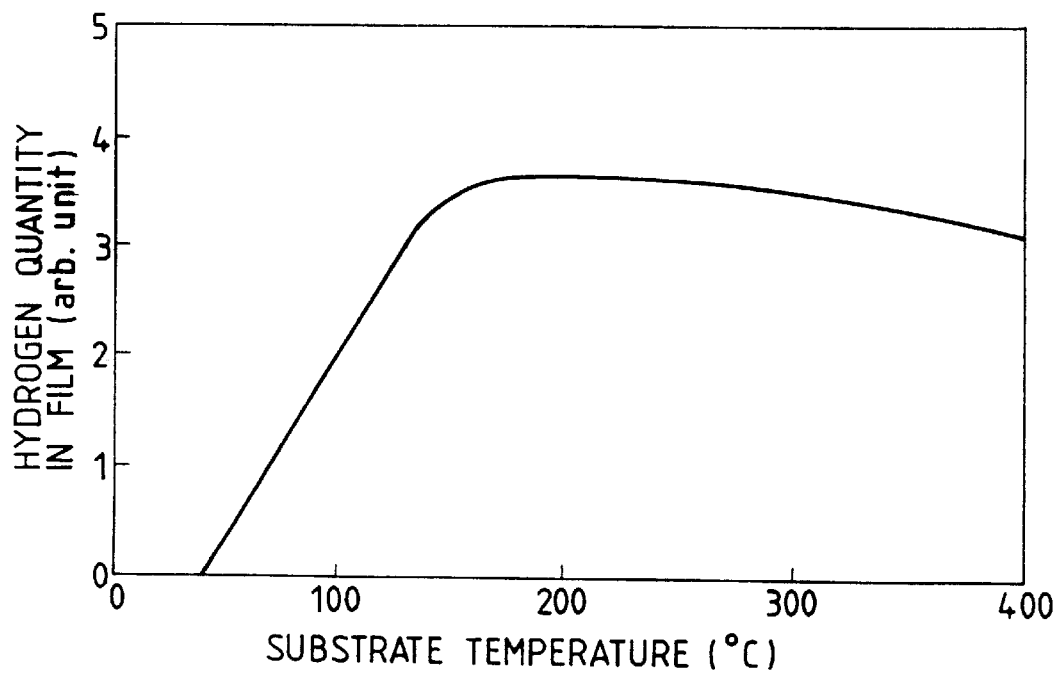
FIG. 26 is a graph showing the relationship between the substrate temperature and the hydrogen quantity in a film in hydrogen plasma processing.

As shown in FIG. 26, the hydrogen quantity in a film begins to increase at a substrate temperature of about 100° C. The hydrogen quantity then saturates once at about 150° C. and begins to decrease gradually at temperatures higher than 300° C. Therefore, the substrate temperature is set between preferably 100 and 300° C., and more preferably 150 and 300° C.

Figure 27:
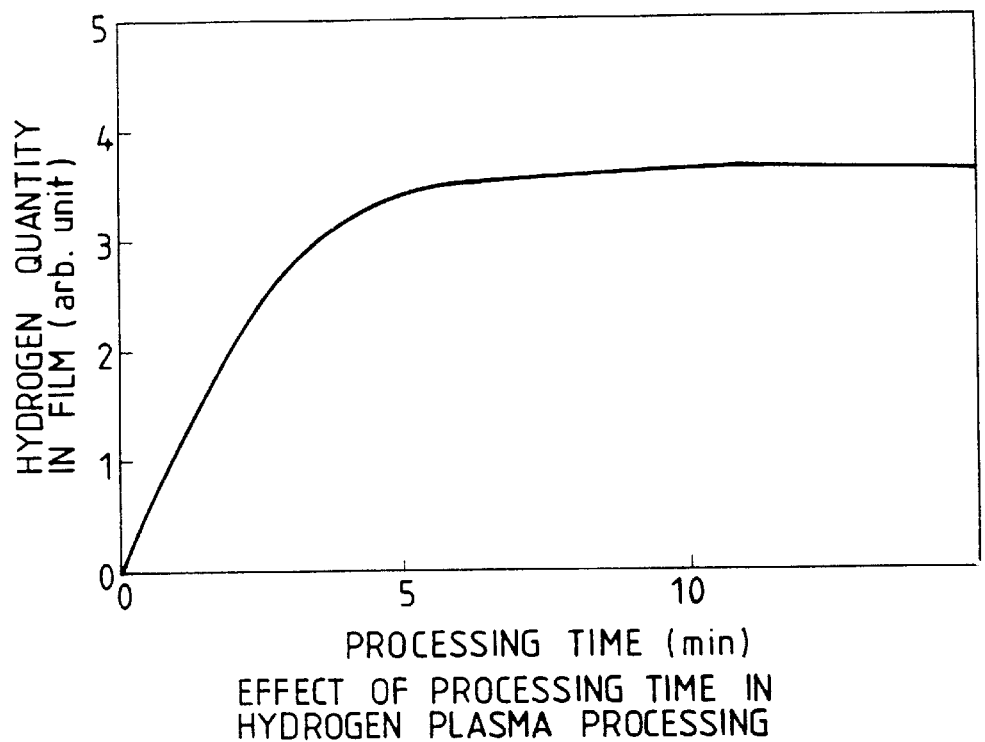
FIG. 27 is a graph showing the relationship between the processing time and the hydrogen quantity in a film in hydrogen plasma processing.

The time of the hydrogen plasma processing depends on a depth to which hydrogen is to be adhered, as shown in FIG. 27. That is, defect levels formed by physical shocks during reactive ion etching are concentrated in a range within 500 Å from the surface, and it is apparent from FIG. 27 that adhesion of hydrogen to a thickness of 500 Å is completed in about five minutes. This indicates that the hydrogen plasma processing time is preferably five minutes or more, and more preferably ten minutes or more.

Figure 28:
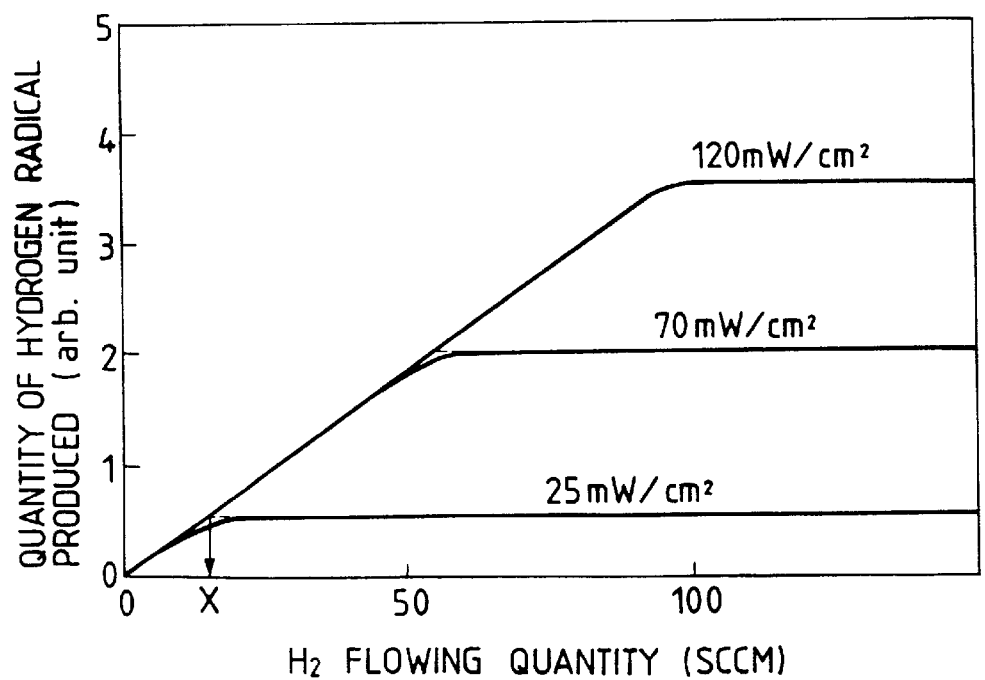
FIG. 28 is a graph showing the relationship between the $H_2$ flow rate and the hydrogen radical production amount in hydrogen plasma processing.

The hydrogen gas flow rate during the hydrogen plasma processing will be described below. As shown in FIG. 28, the amount of hydrogen radicals produced changes in accordance with the power. Referring to FIG. 28, the hydrogen radical amount is determined by gas supply rate determination at low flow rates, and by gas decomposition rate determination in a saturation state at high flow rates. Since the supply rate determination is more desirable in order for hydrogen radicals to reach the surface to be processed, the hydrogen radical amount is determined by the maximum value of gas supply for each value of power. In addition, the minimum gas flow rate is determined because a necessary supply number of hydrogen radicals exists. Assuming that the minimum gas flow rate is at a point X, a hydrogen radical density flow rate at the point X is Hx (the number of radicals/cm$^2$·sec), the power is Pw (W/cm$^2$), the internal pressure is Pr (Torr), a chamber volume is Vol (l), an interelectrode distance is dE (mm), and an electrode area is S (cm$^2$), a gas flow rate v (SCCM) is obtained by the following relations.

First, since the number of gas particles passing per unit volume is a necessary amount (Hx) of the hydrogen radical density or more, i.e., is not determined by supply rate determination, the minimum gas flow rate is determined by the following relation:

$$\eta \cdot \frac{\frac{v}{60}}{1000 \cdot Vol} \geq 22.4 \cdot 1000 \cdot \frac{Hx}{6.02E23} \Big/ \frac{dE}{10} \quad (1)$$

where η is the generation efficiency of hydrogen radicals.

On the other hand, since the power applied across the electrodes is equal to or larger than the dissociation energy of gas particles existing between the electrodes, i.e., is not determined by decomposition rate determination, the maximum gas flow rate is determined by:

$$\eta \cdot Pw \cdot S \cdot 1000 \cdot Vol \cdot \frac{\frac{Pr}{760}}{\frac{v}{60}} \geq Ed \cdot 1.6E-19 \cdot 6.02E23 \cdot S \cdot \frac{dE}{10} \cdot \frac{Pr}{760} \Big/ (22.4 \cdot 1000)$$

Rewriting the above relation to:

$$v = \leq \frac{\eta \cdot Pw \cdot Vol \cdot 1000 \cdot 22.4 \cdot 1000 \cdot 60}{Ed \cdot 1.6E-19 \cdot 6.02E23(0.1 \cdot dE)} \quad (2)$$

where Ed is the dissociation energy per hydrogen molecule.

For example, 15≦v≦95 (SCCM) is obtained for

Hx=1E15 ions/cm$^2$·sec
Pw=0.1 W/cm$^2$
Pr=0.5Torr
S=314 cm$^2$
dE=50 mm
Vol=10l
Ed=8.8 eV
η=0.3.

Example 2-1

This example will be described below with reference to FIGS. 29A to 29C.

Figure 29A:
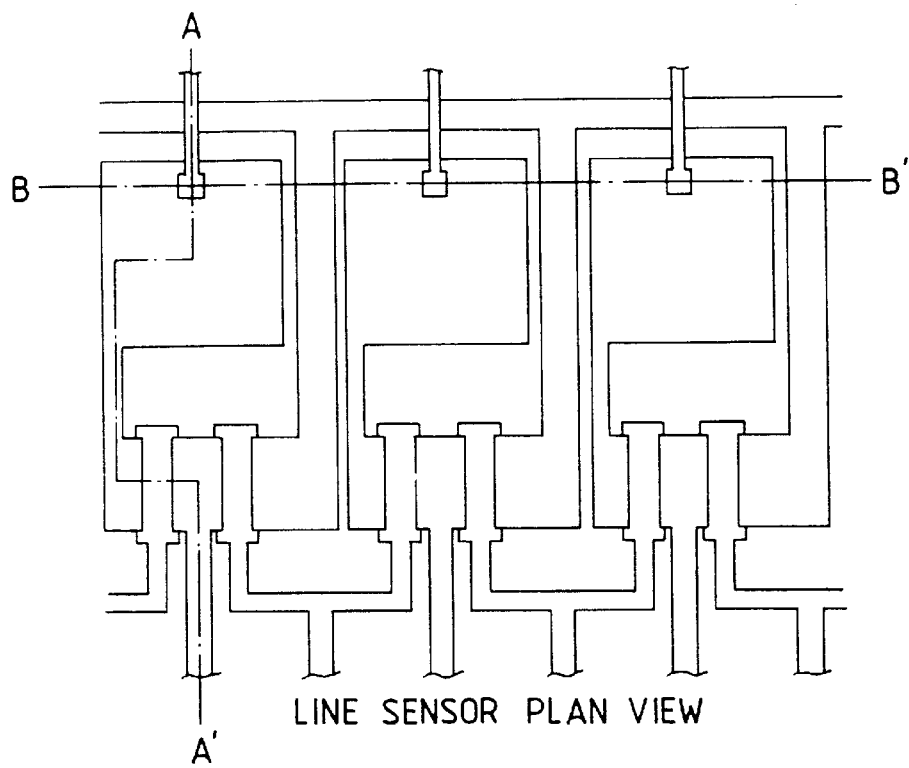
Figure 29B:
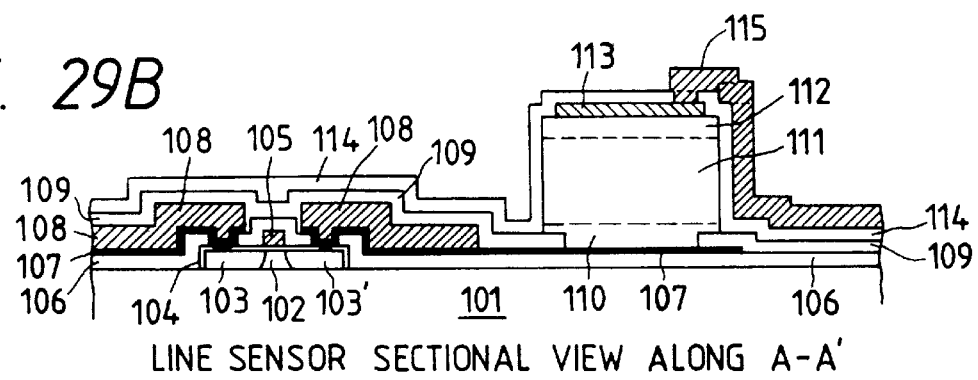
Figure 29C:
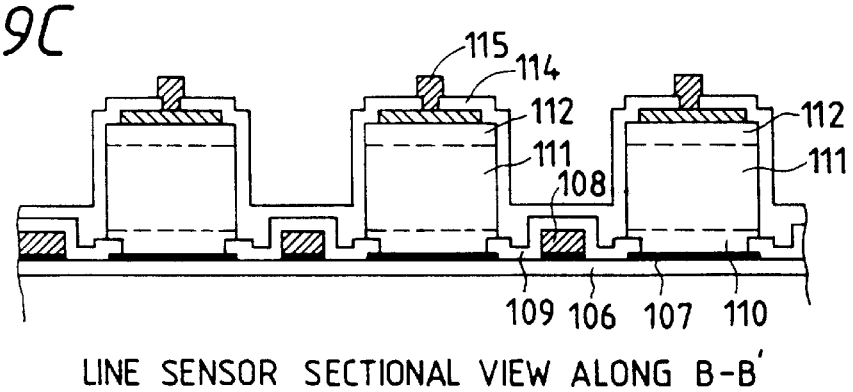

FIG. 29A is a plan view showing a line sensor according to this example, FIG. 29B is a sectional view taken along a line A–A' in FIG. 29A, and FIG. 29C is a sectional view taken along a line B–B' in FIG. 29A.

As shown in FIG. 29B, deposition was performed for 10 minutes at an SiH$_4$ gas flow rate of 50 SCCM, a substrate temperature of 620° C., and an internal pressure of 0.3 Torr by using a conventional LP-CVD process, thereby forming a 1,000-Å thick polysilicon layer 102 on a quartz substrate 101. The resultant polysilicon layer was etched into a desired shape by conventional photolithography. Thereafter, thermal oxidation was performed in an O$_2$ atmosphere at 900° C. for 2.5 hours, forming a 500-Å thick oxide film 104 on the surface of the polysilicon layer 102.

Subsequently, deposition was performed for 30 minutes at an SiH$_4$ gas flow rate of 50 SCCM, a substrate temperature of 620° C., and an internal pressure of 0.3 Torr by using the conventional LP-CVD process, thereby forming a polysilicon layer 105 having a thickness of 3,000 Å. B⁻ ions were implanted in the entire surface of the resultant polysilicon layer at a dose of 8E15 cm⁻² and 60 keV through a conventional ion implantation process. The B⁻ ions implanted were then diffused by performing annealing in an N₂ atmosphere at 800° C., imparting the p conductivity type to the polysilicon layer 105.

Thereafter, the polysilicon layer 105 was etched into a desired shape by the conventional photolithographic step, thereby forming a gate electrode of a MOS transistor.

P⁺ ions were then implanted in the entire surface of the resultant structure at a dose of 5E15 cm⁻² and 160 kev by the conventional ion implantation, and annealing was performed in an N₂ atmosphere at 800° C. to diffuse the P⁺ ions thus implanted, forming source and drain electrodes 103 and 103' of the MOS transistor.

The description of the manufacturing process will be continued with reference to FIGS. 30A to 30H.

Subsequently, deposition was performed for 160minutes at SiH₄, NH₃, and H₂ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and the oxide film 104 were etched into a desired shape by the conventional photolithography, forming holes for extracting the source and drain electrodes.

On top of the resultant structure, a 2,000-Å thick Cr layer 107 and a 1,000-Å thick Al layer 108 were deposited by sputtering. Thereafter, etching was performed to obtain a desired shape by the conventional photolithography such that the Al layer was removed from prospective pixel formation portions and left on steps of the holes for extraction from the MOS transistor, forming lower electrodes.

Figure 30A:
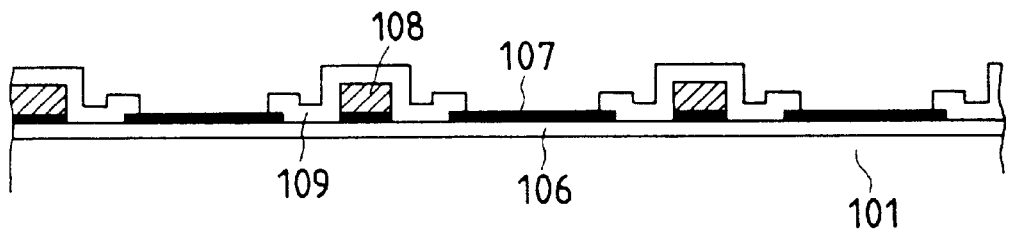

Subsequently, an 8,000-Å thick SiN layer 109 was formed by performing deposition for 160 minutes at SiH₄, HN₃, and H₂ gas flow rates of 0.5, 14.4, and 4.5 SCCM, respectively, a substrate temperature of 200° C., an RF power of 3.5 W, and an internal pressure of 0.15 Torr by the use of the conventional plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 30A).

Figure 30B:
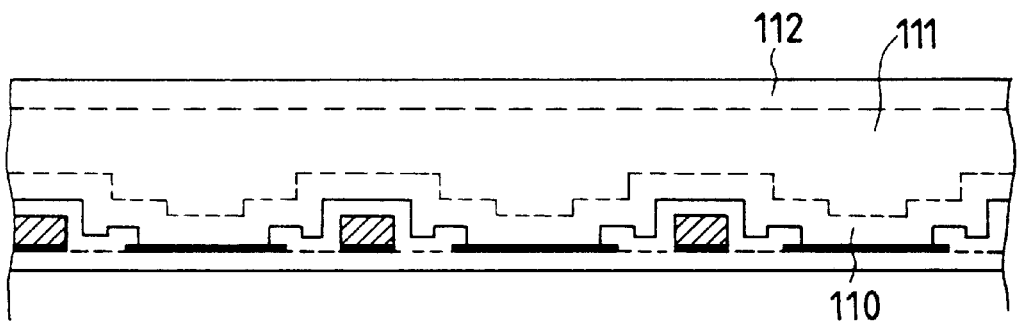
Figure 31:
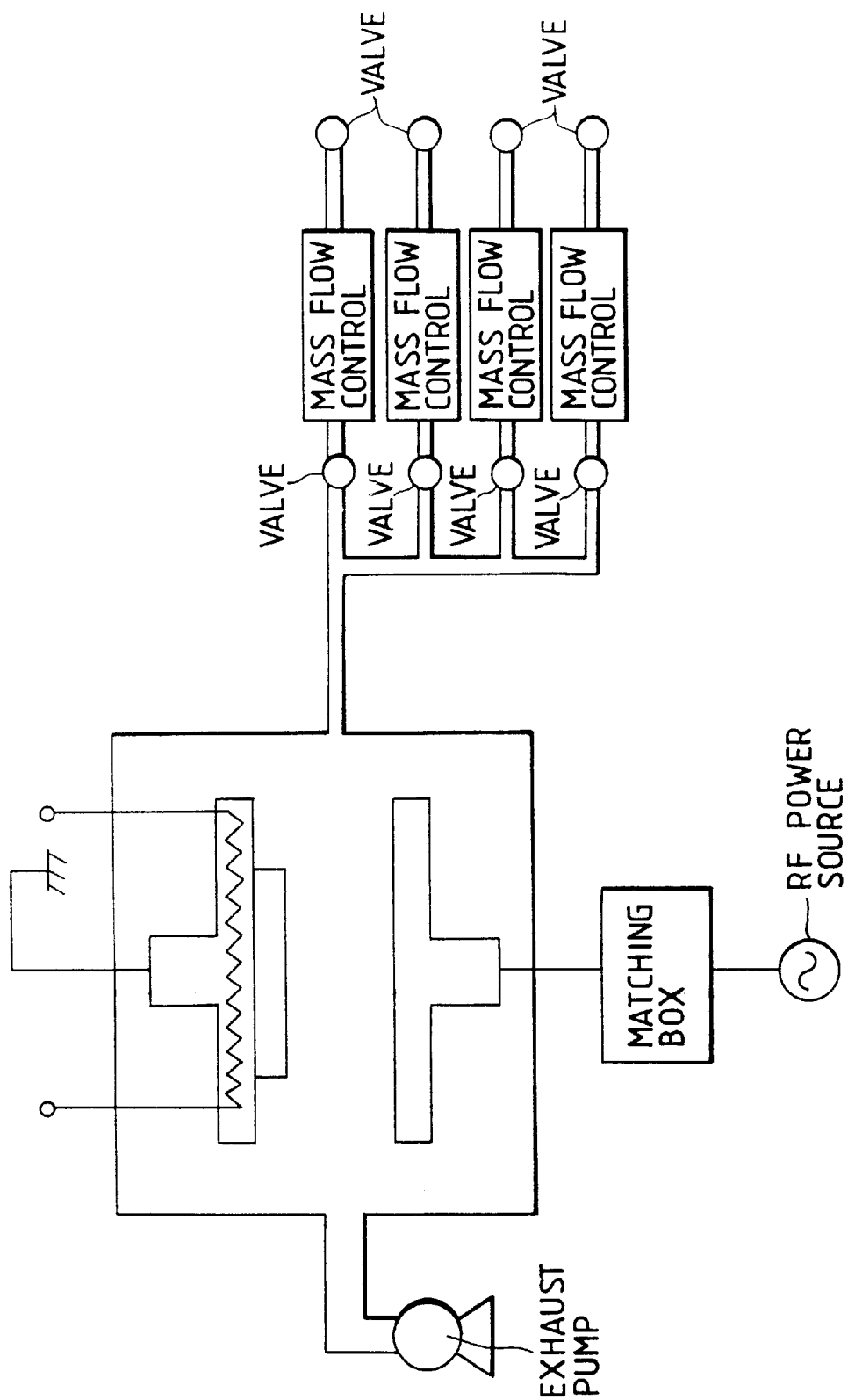
FIG. 31 is a schematic view showing the arrangement of a parallel-plate glow discharge apparatus.

Thereafter, in a parallel-plate glow discharge apparatus (volume: 10 l; electrode area: 200 mm²) as shown in FIG. 31, deposition was performed for 30 minutes at an SiH₄ gas flow rate of 0.5 SCCM, a gas flow rate of H₂-diluted 100-ppm PH₃ of 50 SCCM, a substrate temperature of 300° C., an RF power of 18 W, and an internal pressure of 0.15 Torr by using the conventional plasma CVD process, thereby forming an n⁺-type fine-crystal silicon (n⁺-μc-Si:H) layer 110 having a thickness of 1,000 Å. Subsequently, deposition was performed without breaking the vacuum for 280 minutes at SiH₄ and H₂ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of SiH₄, H₂-diluted 100-ppm B₂H₆, and H₂ of 0.5, 25, and 25 SCCM, respectively, a substrate temperature of 200° C., an RF power of 18.0 W, and an internal pressure of 0.15 Torr. As a result, a p⁺-type fine-crystal silicon (p⁺-μc-Si:H) layer 112 having a thickness of 1,000 Å was formed (FIG. 30B).

Figure 30C:
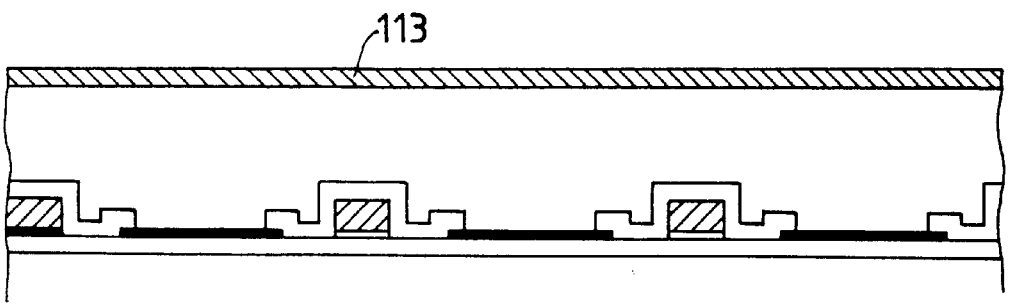
Figure 30D:
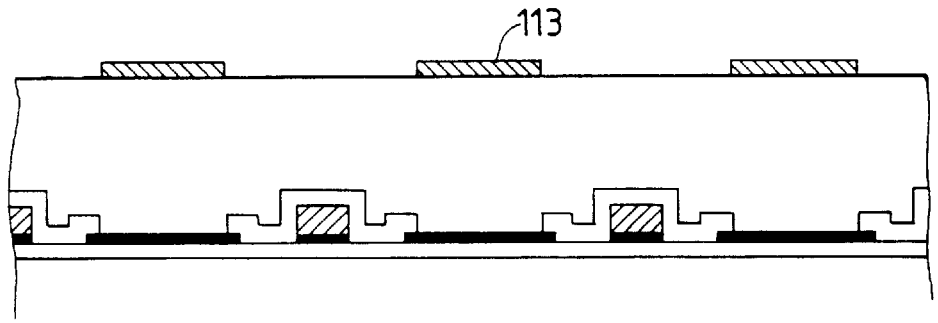

Thereafter, a 700-Å thick transparent electrode ITO layer 113 was formed by the conventional sputtering process (FIG. 30C). This ITO layer was then etched into a desired shape by the conventional photolithographic step, forming upper electrodes of photodiodes (FIG. 30D).

Figure 30E:
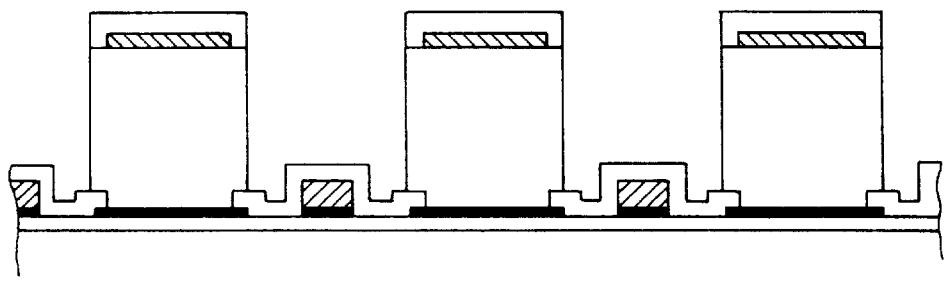

Thereafter, a resist pattern was printed through the conventional photolithographic step using a resist, and the n⁺-μc-Si:H layer 110, the i-a-Si:H layer 111, and the p⁺-μc-Si:H layer 112 were etched into a desired shape by reactive ion etching (RIE) (FIG. 30E).

Figure 30F:
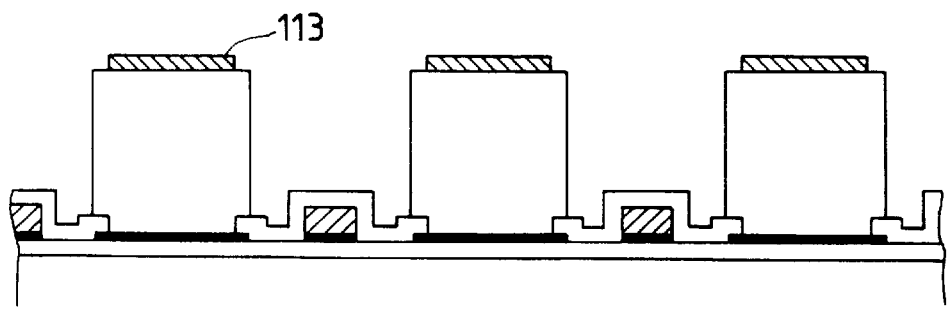

After the resist was removed, the resultant substrate was again set in the apparatus in which the layers 110, 111, and 112 were deposited, and discharge was performed for 10 minutes at an H₂ gas flow rate of 50 SCCM, a substrate temperature of 200° C., an RF power of 40.0 W, and an internal pressure of 0.75 Torr (FIG. 30F).

Figure 30G:
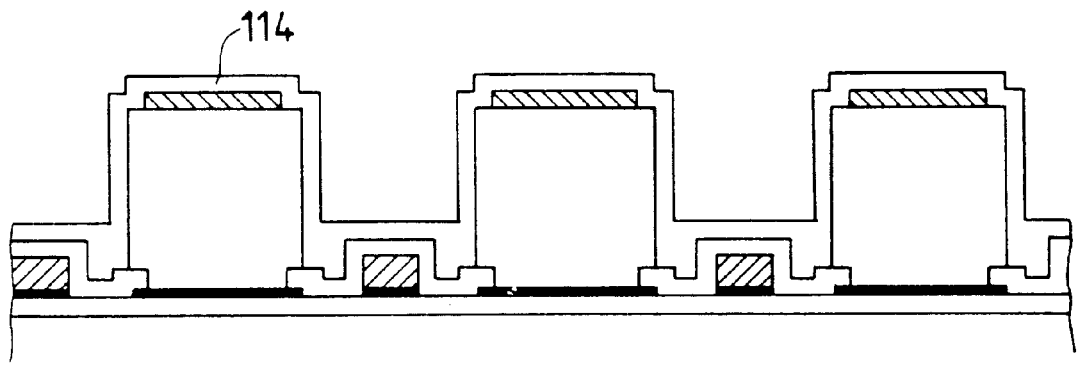

Thereafter, an SiN layer 114 having a thickness of 8,000 Å was formed through deposition performed for 160 minutes at SiH₄, NH₃, and H₂ gas flow rates of 0.5, 14.4, and 4.5 SCCM, respectively, a substrate temperature of 200° C., an RF power of 3.5 W, and an internal pressure of 0.15 Torr by the use of the conventional plasma CVD. This SiN layer 114 was then etched into a desired shape by the conventional photolithographic process, forming holes for extracting upper wiring electrodes (FIG. 30G).

Figure 30H:
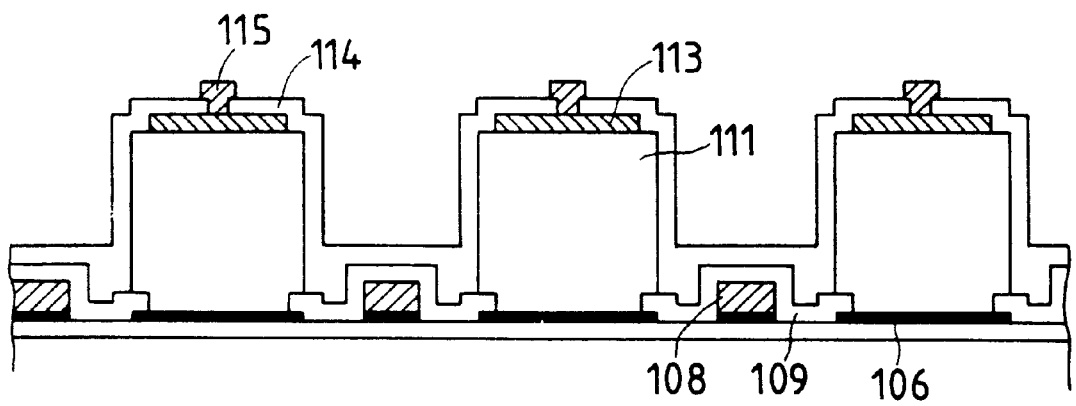

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention (FIG. 30H).

This photoelectric conversion device manufactured by the above process had an S/N ratio of 60 dB, while the S/N ratio of a photoelectric conversion device manufactured through exactly the same process except that no hydrogen plasma processing was included was only 37 dB due to an increase in a dark current. This demonstrates that the process of the present invention realized the photoelectric conversion device whose characteristics were not much degraded by a dark current.

Example 2-2

Still another example of the present invention will be described below.

The manufacturing steps of this example are identical with those of the above example up to the step of forming the source and drain electrodes of a MOS transistor shown in FIG. 29B. Therefore, the subsequent manufacturing steps will be described below with reference to the sectional views shown in FIGS. 32A to 32I.

Deposition was performed for 160 minutes at SiH₄, NH₃, and H₂ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and an oxide film 104 were etched into a desired shape by the conventional photolithography, forming holes for extracting the source and drain electrodes.

On top of the resultant structure, a 2,000-Å thick Cr layer 107 and a 1,000-Å thick Al layer 108 were deposited by sputtering. Thereafter, etching was performed to obtain a desired shape by the conventional photolithography such that the Al layer was removed from prospective pixel formation portions and left on steps of the holes for extraction from the MOS transistor, forming lower electrodes.

Figure 32A:
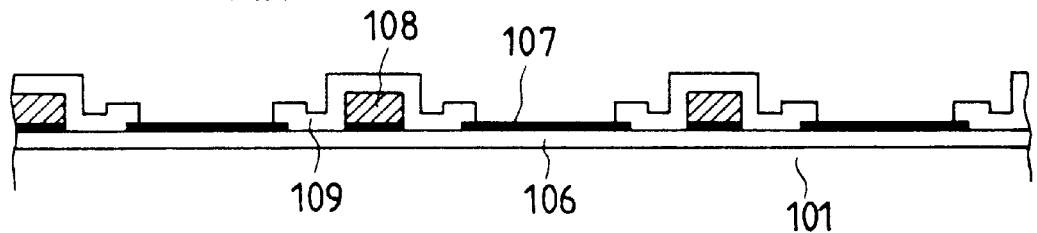

Subsequently, an 8,000-Å thick SiN layer 109 was formed by performing deposition for 160 minutes at $SiH_4$, $HN_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 32A).

Figure 32B:
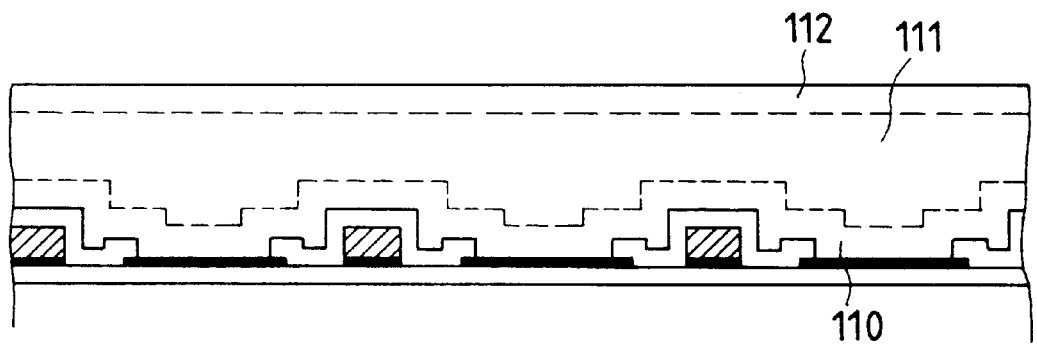

Thereafter, deposition was performed for 30 minutes at an $SiH_4$ gas flow rate of 0.5 SCCM, a gas flow rate of $H_2$-diluted 100-ppm $PH_3$ of 50 SCCM, a substrate temperature of 300° C., an RF power of 18 W, and an internal pressure of 0.15 Torr by using the conventional plasma CVD process, thereby forming an n$^+$-type fine-crystal silicon (n$^+$-µc-Si:H) layer 110 having a thickness of 1,000 Å. Subsequently, deposition was performed without breaking the vacuum for 280 minutes at $SiH_4$ and $H_2$ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of $SiH_4$, $H_2$-diluted 100-ppm $B_2H_6$, and $H_2$ of 0.5, 25, and 25 SCCM, respectively, a substrate temperature of 200° C., an RF power of 18.0 W, and an internal pressure of 0.15 Torr. As a result, a p$^+$-type fine-crystal silicon (p$^+$-µc-Si:H) layer 112 having a thickness of 1,000 Å was formed (FIG. 32B).

Figure 32C:
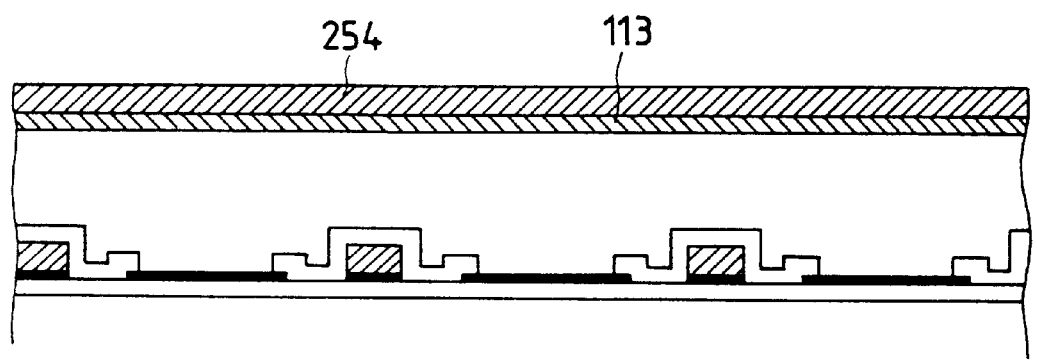
Figure 32D:
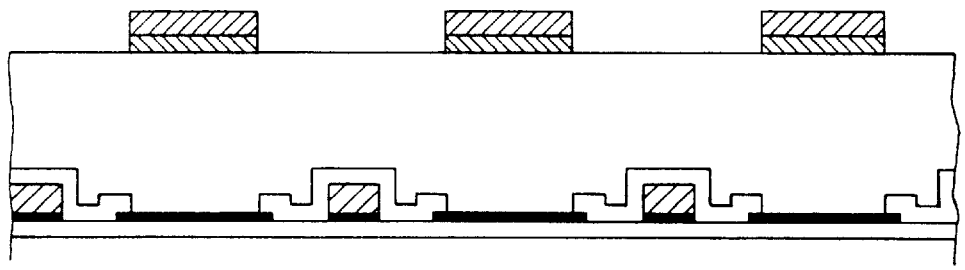

Thereafter, a 700-Å thick transparent electrode ITO layer 113 and a 3,000-Å thick coating Al layer 214 were formed by the conventional sputtering process (FIG. 32C). Subsequently, these Al and ITO layers were etched into a desired shape by the photolithographic step, forming upper electrodes of photodiodes (FIG. 32D).

Figure 32E:
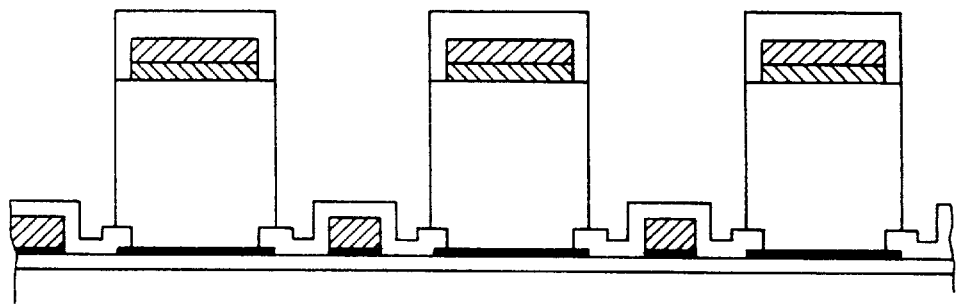

Thereafter, a resist pattern was printed through the conventional photolithographic step using a resist, and the n$^+$-µc-Si:H layer 110, the i-a-Si:H layer 111, and the p$^+$-µc-Si:H layer 112 were etched into a desired shape by reactive ion etching (RIE) (FIG. 32E).

Figure 32F:
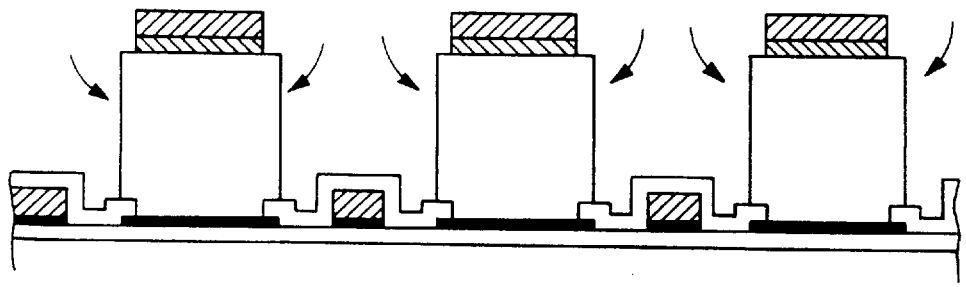
Figure 32G:
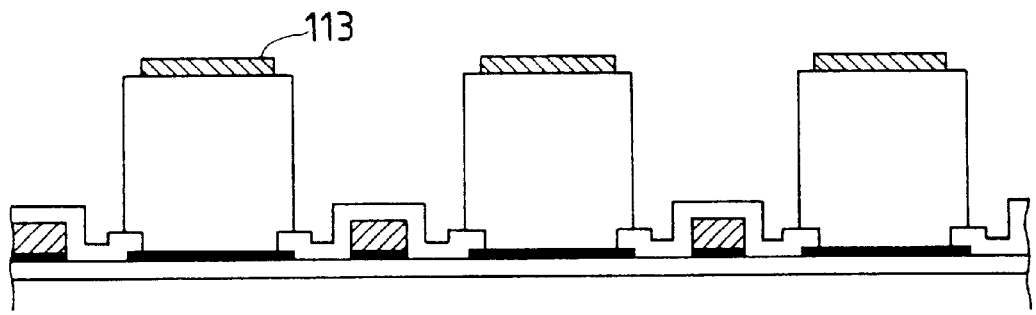

After the resist was removed, the resultant substrate was again set in an apparatus in which the layers 110, 111, and 112 were deposited, and discharge was performed for 5 minutes at an $H_2$ gas flow rate of 50 SCCM, a substrate temperature of 200° C., an RF power of 40.0 W, and an internal pressure of 0.75 Torr (FIG. 32F). Subsequently, the coating Al layer 214 was entirely removed by conventional wet-etching (FIG. 32G).

Figure 32H:
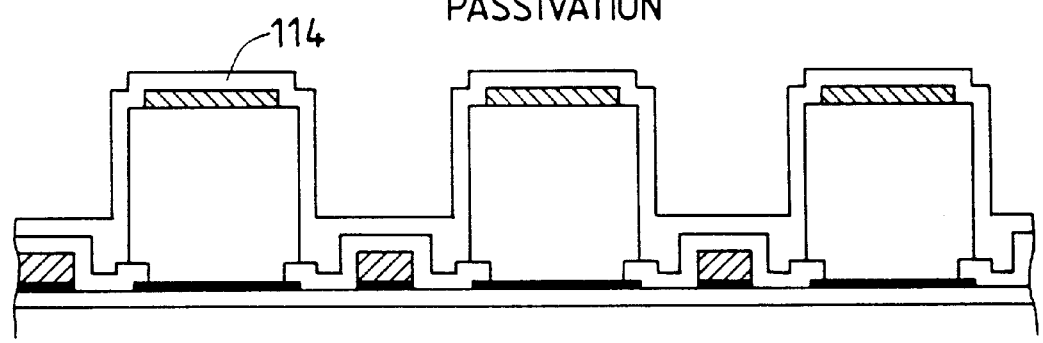

Thereafter, an SiN layer 114 having a thickness of 8,000 Å was formed through deposition performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD. This SiN layer 114 was then etched into a desired shape by the conventional photolithographic process, forming holes for extracting upper wiring electrodes (FIG. 32H).

Figure 32I:
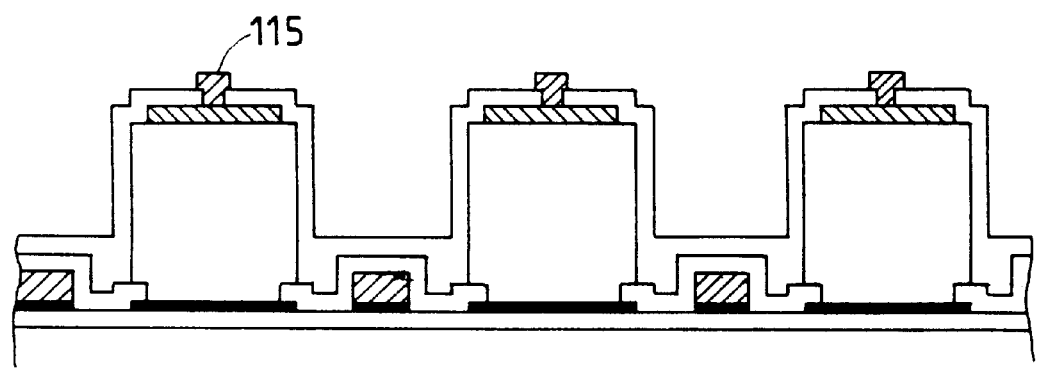

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention (FIG. 32I).

The photoelectric conversion device manufactured by the above process had an S/N ratio of 65 dB, while the S/N ratio of a photoelectric conversion device manufactured through exactly the same process except that no hydrogen plasma processing was included was only 40 dB due to an increase in a dark current. This demonstrates that the process of the present invention realized the photoelectric conversion device whose characteristics were not much degraded by a dark current.

Embodiment 3

This embodiment is realized by a method of manufacturing a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein the photoconductive film is isolated into individual pixels through a lift-off process using a metal film as a lift-off pattern, in which a single or two-layered metal film of a type different from that of the electrode (lower electrode) formed below pixels is deposited before the deposition of the photoconductive film and left in regions corresponding to portions to be removed from the photoconductive film, and, after the photoconductive film is deposited, the metal film is etched away to remove the portions of the photoconductive film deposited on the metal film.

If the metal film used as the lift-off pattern in the above lift-off process is a single-layered film, this single-layered film is made by using a low-melting metal. If the metal film is a two-layered film, the lower layer of this two-layered film is made by using a low-melting metal, and its upper layer is made by using a refractory metal. In addition, the film thickness of the low-melting metal film is set to be larger than that of the photoconductive film. This can realize the present invention more reliably.

The metals used in the present invention are desirably selected from metals to be described below.

That is, examples of the low-melting metal are metals of Groups IB to IIIB and Group IA, and Sn and Pb of Group IVB. Representative examples are Al, Mg, Cu, Ag, Zn, and Cd. Silicides formed by these metals can also be used as the low-melting metal.

These metals are formed by conventional vapor deposition, sputtering, and CVD processes. Silicides of these metals are preferably formed by sputtering.

The film thickness need only be larger than that of the photoconductive film and is preferably 10,000 Å or more since the film thickness of the photoconductive film is normally 7,000 to 10,000 Å.

The refractory metal includes transition metals of Group IIIA to Group VIIA and Group VIII. Representative examples are Ti, Ta, Cr, Mo, W, Ni, Pd, and Pt.

These metals are formed by conventional vapor deposition, sputtering, and CVD processes. Silicides of these metals are preferably formed by sputtering.

The film thickness is determined by the magnitude of a stress which is produced upon heating or cooling by the

Example 3-1

The manufacturing steps of this example are identical with those of Example 2-1 up to the formation of source and drain regions 103 and 103' of a MOS transistor shown in FIG. 29B.

The subsequent manufacturing steps, therefore, will be described below with reference to the sectional views shown in FIGS. 33A to 33F.

Deposition was performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and an oxide film 104 were etched into a desired shape by the conventional photolithography, forming holes for extracting the source and drain electrodes.

On top of the resultant structure, a 2,000-Å thick Cr layer 107 and a 1,000-Å thick Al layer 108 were deposited by sputtering. Thereafter, etching was performed to obtain a desired shape by the conventional photolithography such that the Al layer was removed from prospective pixel formation portions and left on steps of the holes for extraction from the MOS transistor, forming lower electrodes.

Figure 33A:
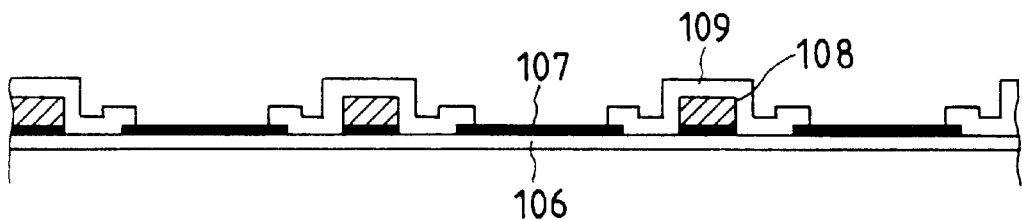
Figure 33B:
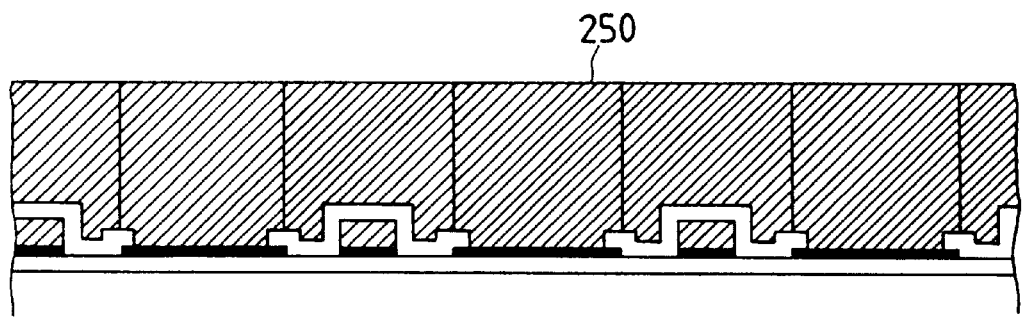

Subsequently, an 8,000-Å thick SiN layer 109 was formed by performing deposition for 160 minutes at $SiH_4$, $HN_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 33A).

Figure 33C:
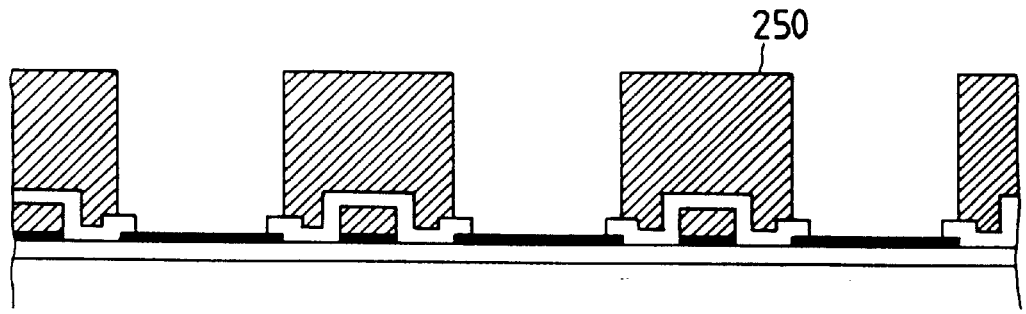

Subsequently, a 10,000-Å thick Al layer 250 was deposited (FIG. 33B) and then etched into a desired shape by the conventional photolithography so that the Al was left in regions from which a photoconductive film was to be removed (FIG. 33C).

Thereafter, deposition was performed for 30 minutes at an $SiH_4$ gas flow rate of 0.5 SCCM, a gas flow rate of $H_2$-diluted 100-ppm $PH_3$ of 50 SCCM, a substrate temperature of 300° C., an RF power of 18 W, and an internal pressure of 0.15 Torr by using the conventional plasma CVD process, thereby forming an n$^+$-type fine-crystal silicon (n$^+$-μc-Si:H) layer 110 having a thickness of 1,000 Å. Subsequently, deposition was performed without breaking the vacuum for 280 minutes at $SiH_4$ and $H_2$ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of $SiH_4$, $H_2$-diluted 100-ppm $B_2H_6$, and $H_2$ of 0.5, 25, and 25 SCCM, respectively, a substrate temperature of 200° C., an RF power of 18.0 W, and an internal pressure of 0.15 Torr. As a result, a p$^+$-type fine-crystal silicon (p$^+$-μc-Si:H) layer 112 having a thickness of 1,000 Å was formed.

Figure 33D:
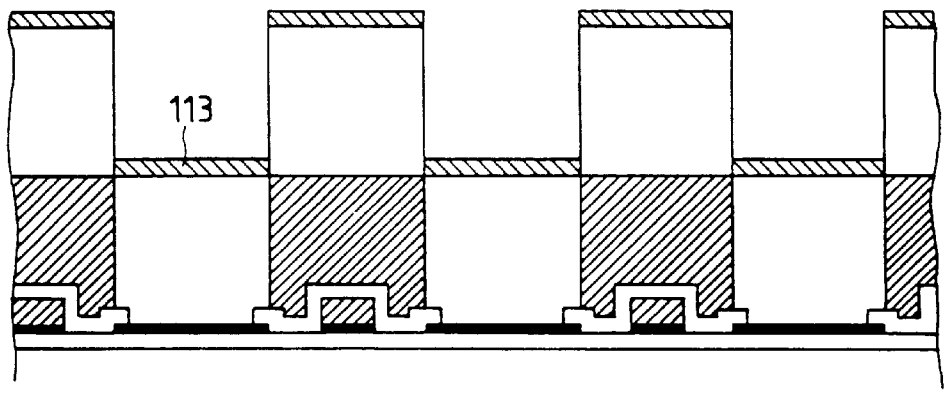
Figure 33E:
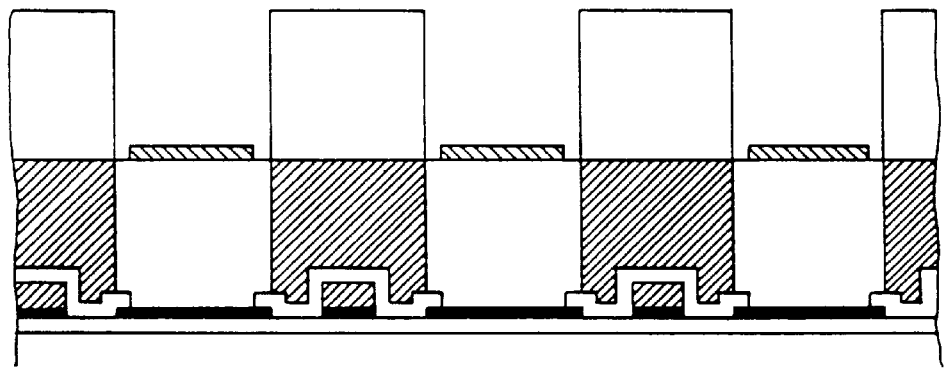

Thereafter, a 700-Å thick transparent electrode ITO layer 113 was formed by the conventional sputtering process (FIG. 33D). Subsequently, this ITO layer was etched into a desired shape by the conventional photolithographic step, forming upper electrodes of photodiodes (FIG. 33E).

Figure 33F:
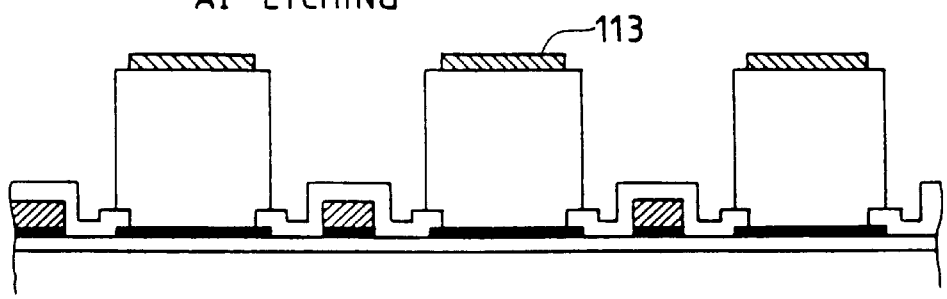

Thereafter, a conventional Al etchant was used to etch the Al layer formed below the n$^+$-μc-Si:H layer 110 to remove the n$^+$-μc-Si:H layer 110, the i-a-Si:H layer 111, and the p$^+$-μc-Si:H layer 112 located on the Al layer by lift-off, performing pixel isolation of the photoconductive film (FIG. 33F).

Thereafter, an SiN layer 114 having a thickness of 8,000 Å was formed through deposition performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD in the same manner as shown in FIG. 30G.

This SiN layer 114 was then etched into a desired shape by the conventional photolithographic process, forming holes for extracting upper wiring electrodes.

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention.

The photoelectric conversion device manufactured by the above process had an S/N ratio of 70 dB, while the S/N ratio of a photoelectric conversion device manufactured through exactly the same process except that pixel isolation was performed by reactive ion etching instead of lift-off was only 40 dB due to an increase in a dark current. This demonstrates that the process of the present invention realized the photoelectric conversion device whose characteristics were not much degraded by a dark current. In addition, the yield of the photoelectric conversion device manufactured by the above method exceeded 85%, indicating that a high reliability was also obtained in the manufacturing method.

Example 3-2

Following the same procedures as in the above example, source and drain regions 103 and 103' of a MOS transistor shown in FIG. 29B were formed.

The subsequent manufacturing steps will be described below with reference to the sectional views shown in FIGS. 34A to 34F.

Deposition was performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and an oxide film 104 were etched into a desired shape by the conventional photolithography, forming holes for extracting the source and drain electrodes.

On top of the resultant structure, a 2,000-Å thick Cr layer 107 and a 1,000-Å thick Al layer 108 were deposited by sputtering. Thereafter, etching was performed to obtain a desired shape by the conventional photolithography such that the Al layer was removed from prospective pixel formation portions and left on steps of the holes for extraction from the MOS transistor, forming lower electrodes.

Figure 34A:
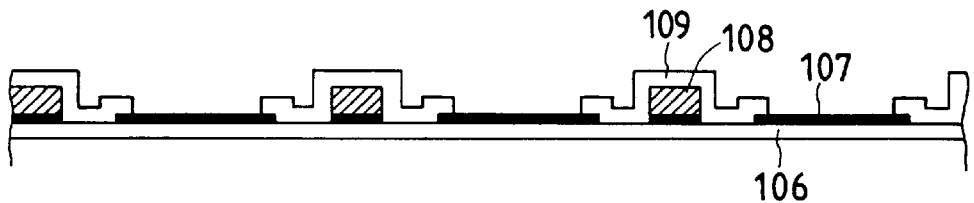
Figure 34B:
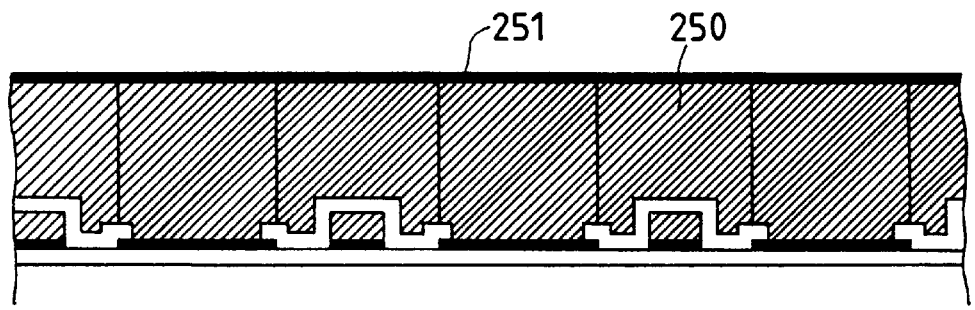
Figure 34C:
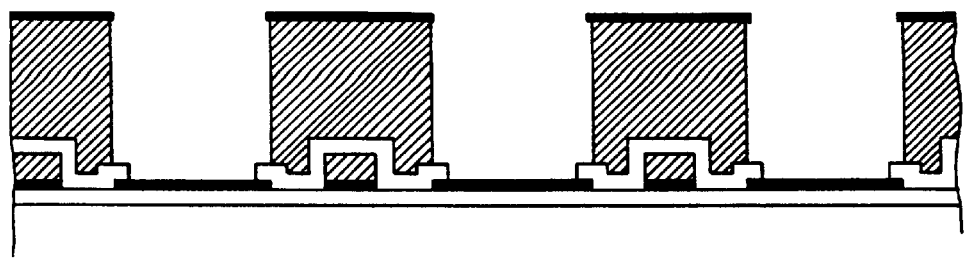

Subsequently, an 8,000-Å thick SiN layer 109 was formed by performing deposition for 160 minutes at $SiH_4$, $HN_3$, and H₂ gas flow rates of 0.5, 14.4, and 4.5 SCCM, respectively, a substrate temperature of 200° C., an RF power of 3.5 W, and an internal pressure of 0.15 Torr by the use of the conventional plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 34A).

Subsequently, a 10,000-Å thick Al layer 250 and a 1,000-Å thick Ti layer 251 were deposited (FIG. 34B) and then etched into a desired shape by the conventional photolithography so that the Ti and Al were left in regions from which a photoconductive film was to be removed. In this case, the etching of Al was performed longer by 100 seconds than a time of just-etch to carry on side-etch so that the upper Ti was left in the form of an overhang (FIG. 33C).

Thereafter, deposition was performed for 30 minutes at an $SiH_4$ gas flow rate of 0.5 SCCM, a gas flow rate of $H_2$-diluted 100-ppm $PH_3$ of 50 SCCM, a substrate temperature of 300° C., an RF power of 18 W, and an internal pressure of 0.15 Torr by using the conventional plasma CVD process, thereby forming an $n^+$-type fine-crystal silicon ($n^+$-$\mu c$-Si:H) layer 110 having a thickness of 1,000 Å. Subsequently, deposition was performed without breaking the vacuum for 280 minutes at $SiH_4$ and $H_2$ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of $SiH_4$, $H_2$-diluted 100-ppm $B_2H_6$, and $H_2$ of 0.5, 25, and 25 SCCM, respectively, a substrate temperature of 200° C., an RF power of 18.0 W, and an internal pressure of 0.15 Torr. As a result, a $p^+$-type fine-crystal silicon ($p^+$-$\mu c$-Si:H) layer 112 having a thickness of 1,000 Å was formed.

Figure 34D:
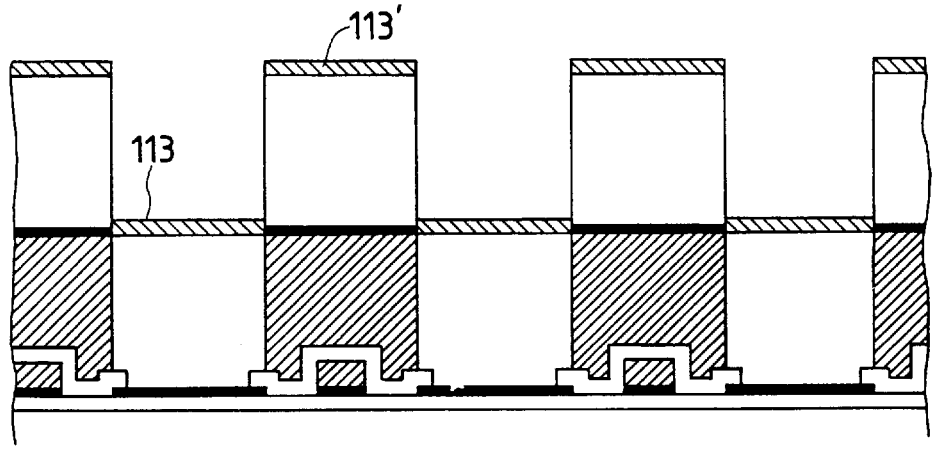
Figure 34E:
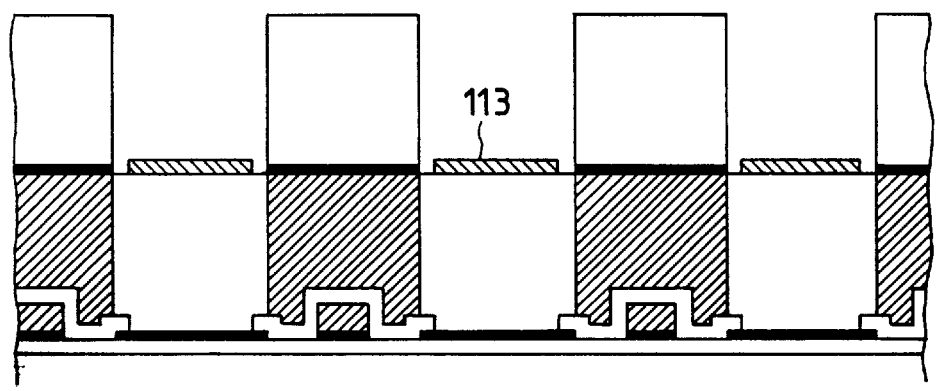

Thereafter, 700-Å thick transparent electrode ITO layers 113 and 113' were formed by the conventional sputtering process (FIG. 34D). Subsequently, these ITO layers were etched into a desired shape by the conventional photolithographic step, forming upper electrodes of photodiodes (FIG. 34E).

Figure 34F:
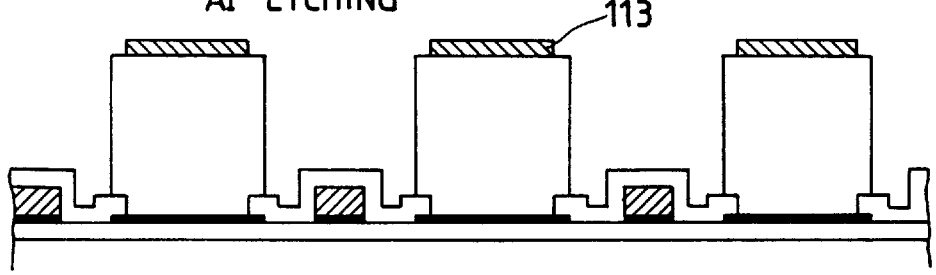

Thereafter, a conventional Al etchant was used to etch the Al layer formed below the Ti layer 251 to remove the $n^+$-$\mu c$-Si:H layer 110, the i-a-Si:H layer 111, and the $p^+$-$\mu c$-Si:H layer 112 located on the Al layer by lift-off, performing pixel isolation of a photoconductive film (FIG. 34F).

Thereafter, an SiN layer 114 having a thickness of 8,000 Å was formed through deposition performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD. This SiN layer 114 was then etched into a desired shape by the conventional photolithographic process, forming holes for extracting upper wiring electrodes.

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention.

The photoelectric conversion device manufactured by the above process had an S/N ratio of 70 dB, while the S/N ratio of a photoelectric conversion device manufactured through exactly the same process except that pixel isolation was performed by reactive ion etching instead of lift-off was only 40 dB due to an increase in a dark current. This demonstrates that the process of the present invention realized the photoelectric conversion device whose characteristics were not much degraded by a dark current. In addition, the yield of the photoelectric conversion device manufactured by the above method exceeded 95%, indicating that reliability in the manufacture was also high.

Embodiment 4

This embodiment is realized by a photoelectric conversion device having a structure formed by one-dimensionally or two-dimensionally arranging photoelectric conversion elements, each of which has a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the photoconductive film and the electrode formed below the photoconductive film are isolated into individual pixels, wherein after the step of isolating the photoconductive film into individual pixels is performed by reactive ion etching, the edges of the photoconductive film exposed by the reactive ion etching are etched away by wet-etching.

As the material of the photoconductive film used in the present invention, a non-single-crystal tetrahedral semiconductor, particularly amorphous silicon hydride consisting primarily of silicon and containing at least hydrogen or a halogen element is used extensively. In addition, alloys of amorphous silicon hydride such as amorphous silicon hydride germanium and amorphous silicon hydride carbon are also often used.

When the photoconductive film as described above is used in the present invention, an etchant for use in the wet-etching for etching away the edges exposed by the reactive ion etching consists of either:

(1) a solution containing at least hydrofluoric acid (HF), nitric acid ($HNO_3$), acetic acid ($CH_3COOH$), and water ($H_2O$); or (2) a solution containing at least hydrofluoric acid (HF), nitric acid ($HNO_3$), and water ($H_2O$). The respective mixing ratios of these solutions are as follows:

(1) For $((HF_x, HNO_{3\ 1-x})_y, CH_3COOH_{1-y})_z$ and $H_2O_{1-z}$, x=0.07 to 0.3
y=0.04 to 0.2
z=0.98 to 0.9.

(2) For $(HF_x, HNO_{3\ 1-x})_z$ and $H_2O_{1-z}$, x=0.07 to 0.3
y=0.04 to 0.2.

The above solutions may further contain iodine ($I_2$) or bromine ($Br_2$).

It is desirable that the above mixing ratios be half to twice the following mixing ratio of an etchant that the present inventors use normally:

HF (49%, diluted with water):$HNO_3$ (70%, diluted with water):$CH_3COOH$ (100%)=1:5:44, that is,

HF:$HNO_3$:$CH_3COOH$:$H_2O$=1:7:88:4

Example 4-1

Following the same procedures as in the above example, source and drain regions 103 and 103' of a MOS transistor shown in FIG. 29B were formed.

The subsequent manufacturing steps will be described below with reference to the sectional views shown in FIGS. 35A to 35F.

Deposition was performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and an oxide film 104 were etched into a desired shape by conventional photolithography, forming holes for extracting the source and drain electrodes.

On top of the resultant structure, a 2,000-Å thick Cr layer 107 and a 10,000-Å thick Al layer 108 were deposited by sputtering. Thereafter, etching was performed to obtain a desired shape by the conventional photolithography such that the Al layer was removed from prospective pixel formation portions and left on steps of the holes for extraction from the MOS transistor, forming lower electrodes.

Figure 35A:
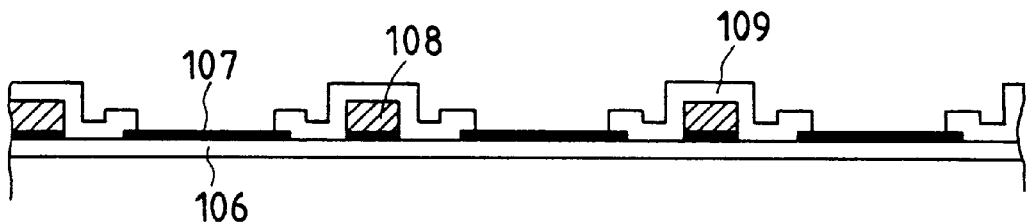

Subsequently, an 8,000-Å thick SiN layer 109 was formed by performing deposition for 160 minutes at $SiH_4$, $HN_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 35A).

Figure 35B:
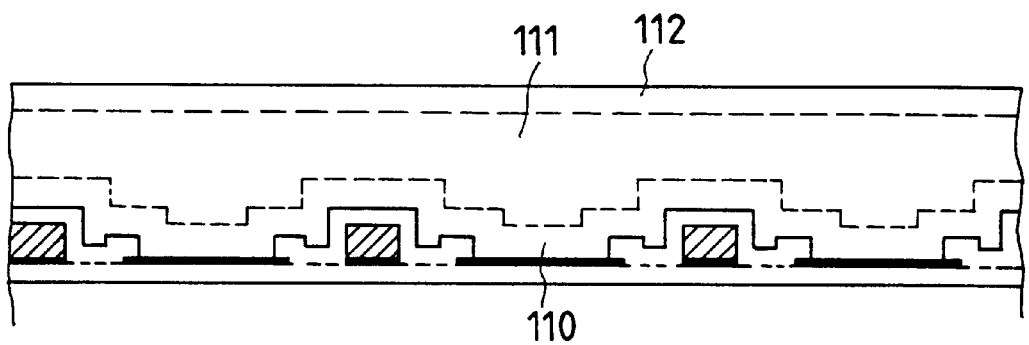
Figure 35C:
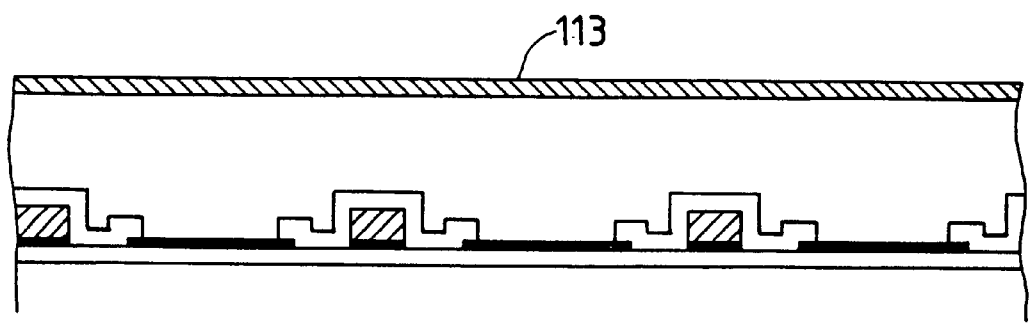

Thereafter, deposition was performed for 30 minutes at an $SiH_4$ gas flow rate of 0.5 SCCM, a gas flow rate of $H_2$-diluted 100-ppm $PH_3$ of 50 SCCM, a substrate temperature of 300° C., an RF power of 18 W, and an internal pressure of 0.15 Torr by using the conventional plasma CVD process, thereby forming an $n^+$-type fine-crystal silicon ($n^+$-$\mu c$-Si:H) layer 110 having a thickness of 1,000 Å. Subsequently, deposition was performed without breaking the vacuum for 280 minutes at $SiH_4$ and $H_2$ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of $SiH_4$, $H_2$-diluted 100-ppm $B_2H_6$, and $H_2$ of 0.5, 25, and 25 SCCM, respectively, a substrate temperature of 200° C., an RF power of 18.0 W, and an internal pressure of 0.15 Torr. As a result, a $p^+$-type fine-crystal silicon ($p^+$-$\mu c$-Si:H) layer 112 having a thickness of 1,000 Å was formed (FIG. 35B).

Figure 35D:
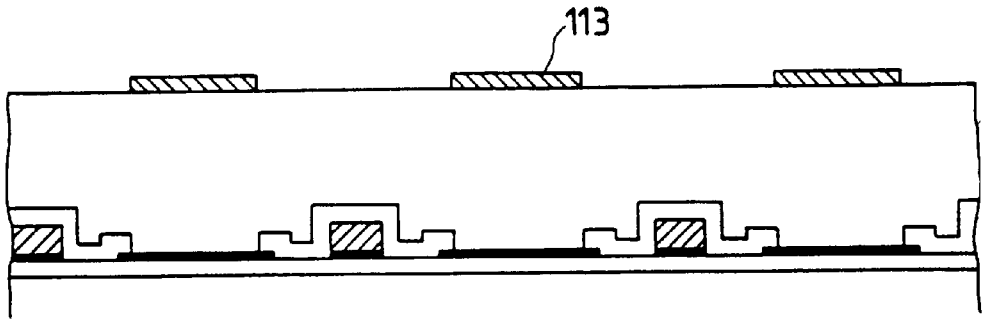

Thereafter, a 700-Å thick transparent electrode ITO layer 113 was formed by a conventional sputtering process (FIG. 35C) and etched into a desired shape by the conventional photolithographic step, forming upper electrodes of photodiodes (FIG. 35D).

Figure 35E:
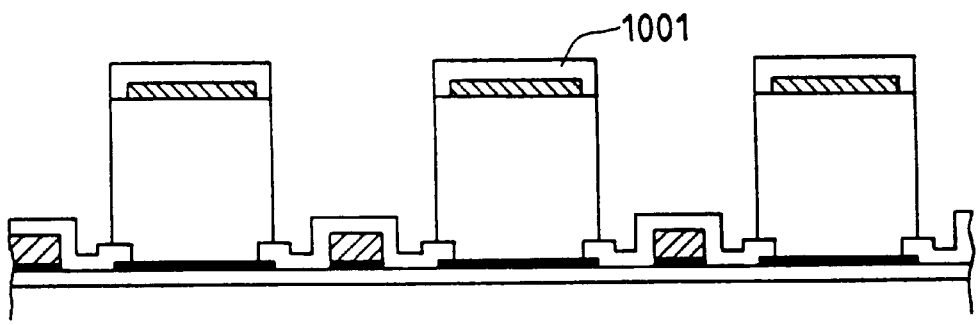

Thereafter, a resist pattern (1001) was printed through the conventional photolithographic step using a resist, and the $n^+$-$\mu c$-Si:H layer 110, the i-a-Si:H layer 111, and the $p^+$-$\mu c$-Si:H layer 112 were etched into a desired shape by reactive ion etching (RIE) (FIG. 35E).

Figure 35F:
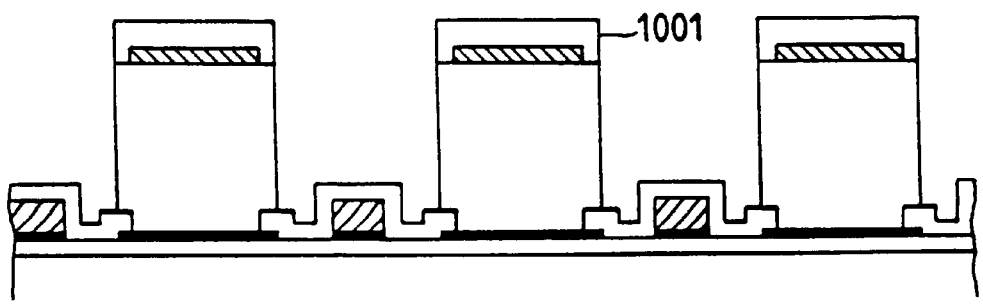

Subsequently, an etchant consisting of $HF:HNO_3:CH_3COOH:H_2O=1:7:88:4$ was used to etch away the edges of the layers 110, 111, and 112 through wet-etching without removing the resist 1001, and then the resist was peeled (FIG. 35F).

Thereafter, an SiN layer 114 having a thickness of 8,000 Å was formed through deposition performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD. This SiN layer 114 was then etched into a desired shape by the conventional photolithographic process, forming holes for extracting upper wiring electrodes.

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention.

The photoelectric conversion device manufactured by the above process had an S/N ratio of 70 dB, while the S/N ratio of a photoelectric conversion device manufactured through exactly the same process except that no wet-etching processing was performed was only 40 dB due to an increase in a dark current. This demonstrates that the process of the present invention realized the photoelectric conversion device whose characteristics were not much degraded by a dark current.

Embodiment 5

This embodiment is realized by a photoelectric conversion device having a structure formed by depositing an electrode, a photoconductive film, and another electrode in sequence on a substrate, in which the photoconductive film has a multilayered structure constituted by a semiconductor layer having one conductivity type and heavily doped with an impurity, a semiconductor layer not doped with or doped slightly with an impurity for controlling a conductivity type, and a semiconductor layer having the other conductivity type and heavily doped with an impurity, and at least the heavily doped impurity layer and the electrode layer formed below the semiconductor layer not doped with or doped slightly with an impurity for controlling a conductivity type are isolated into individual pixels, wherein after the step of isolating the photoconductive film into individual pixels is performed by reactive ion etching, the edges of the photoconductive film exposed by the reactive ion etching are chemically etched in a vapor phase in a vacuum chamber.

When amorphous silicon hydride is used as the above photoconductive film, the above manufacturing steps can be realized more reliably by performing the vapor phase chemical etching by using a gas mixture of silane and fluorine, and by controlling the vapor phase chemical etching by adjusting the mixing ratio of silane to fluorine and the substrate temperature.

FIG. 17 shows the outline of a reaction apparatus used in the present invention. The reaction is performed in a reaction tube 300 mm in diameter which consists of pyrex or quartz. Gases to be used in the reaction are introduced to the entrance of the reaction tube via mass flow controllers and supplied from a nozzle provided on one side of the reaction tube. The gases thus supplied are blown against a substrate supported by a movable arm on the other side of the tube. The gases used are exhausted by an exhaust system from a portion below the arm for supporting the substrate.

The substrate is conveyed by a conveying system from a film formation chamber adjacent to the reaction chamber via a gate valve. A holder which supports the substrate is moved to the reaction position by the arm.

When the gate valve is opened, a substrate holder conveyed from another film formation chamber is stopped at a position where the movable arm is contracted in the reaction chamber, and placed on the arm automatically. The holder can be moved to a position in front of the nozzle by extending the arm (FIG. 17). In addition, since a heater is embedded in the distal end of the arm, the substrate can be heated. As shown in FIG. 18, nozzle holes 1 mm in diameter are formed radially from the center of the circular surface of the gas supply nozzle, and silane and fluorine are injected from every other array of the holes.

In this embodiment, the flow rate ratio of $SiH_4$ to $F_2$ of the gas mixture used in etching and the substrate temperature are determined in accordance with a correlation as shown in FIG. 19. As is apparent from FIG. 19, the tendency of the reaction is such that film deposition is performed at relatively stable rates for several different gas ratios at low temperatures, but, when the substrate temperature rises, the deposition rate decreases abruptly from a certain temperature, and deposition finally changes to etching of the film. This change from deposition to etching occurs abruptly when the $SiH_4/F_2$ ratio is 1/2 or lower, and consequently control using the temperature entirely loses its precision. If the ratio is 1 or higher, on the other hand, the change also takes place abruptly, and a temperature range within which the change occurs exceeds 450° C. This ratio is therefore impractical in a process for handling amorphous silicon hydride. It is therefore desirable to set the $SiH_4/F_2$ gas ratio between 1/2 and 1. In addition, since the etching thickness is about 1,000 Å, an etching rate of 1 to 10 Å/sec is suitable in respect of time control. When these conditions are taken into account, the substrate temperature preferably falls within the range indicated by a hatched portion in FIG. 20.

Example 5-1

Following the same procedures as in the above example, source and drain regions 103 and 103' of a MOS transistor shown in FIG. 29B were formed.

The subsequent manufacturing steps will be described below with reference to the sectional views shown in FIGS. 35A to 35F.

Deposition was performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by a conventional plasma CVD process, thereby forming an 8,000-Å thick SiN layer 106. This SiN layer 106 and an oxide film 104 were etched into a desired shape by conventional photolithography, forming holes for extracting the source and drain electrodes.

On top of the resultant structure, a 2,000-Å thick Cr layer 107 and a 10,000-Å thick Al layer 108 were deposited by sputtering. Thereafter, etching was performed to obtain a desired shape by the conventional photolithography such that the Al layer was removed from prospective pixel formation portions and left behind on steps of the holes for extraction from the MOS transistor, forming lower electrodes.

Subsequently, an 8,000-Å thick SiN layer 109 was formed by performing deposition for 160 minutes at $SiH_4$, $HN_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD process. This SiN layer 109 was used as a passivation film for an underlying circuit such as the MOS transistor. The SiN layer 109 was then etched into a desired shape by the conventional photolithographic step to partially expose the surfaces of the Cr electrodes 107 (FIG. 35A).

Thereafter, in a parallel-plate capacitive-coupling glow discharge apparatus shown in FIG. 24, deposition was performed for 30 minutes at an $SiH_4$ gas flow rate of 0.5 SCCM, a gas flow rate of $H_2$-diluted 100-ppm $PH_3$ of 50 SCCM, a substrate temperature of 300° C., an RF power of 18 W, and an internal pressure of 0.15 Torr by using the conventional plasma CVD process, thereby forming an $n^+$-type fine-crystal silicon ($n^+$-$\mu c$-Si:H) layer 110 having a thickness of 1,000 Å. Subsequently, deposition was performed without breaking the vacuum for 280 minutes at $SiH_4$ and $H_2$ gas flow rates of 5 and 50 SCCM, respectively, a substrate temperature of 300° C., an RF power of 5.0 W, and an internal pressure of 0.15 Torr, forming an 8,000-Å thick non-doped amorphous silicon (i-a-Si:H) layer 111. Deposition was subsequently performed without breaking the vacuum for 30 minutes at gas flow rates of $SiH_4$, $H_2$-diluted 100-ppm $B_2H_6$, and $H_2$ of 0.5, 25, and 25 SCCM, respectively, a substrate temperature of 200° C., an RF power of 18.0 W, and an internal pressure of 0.15 Torr. As a result, a $p^+$-type fine-crystal silicon ($p^+$-$\mu c$-Si:H) layer 112 having a thickness of 1,000 Å was formed (FIG. 35B).

Thereafter, a 700-Å thick transparent electrode ITO layer 113 was formed by the conventional sputtering process (FIG. 35C) and etched into a desired shape by the conventional photolithographic step, forming upper electrodes of photodiodes (FIG. 35D).

Thereafter, a pattern with a desired shape was formed through the conventional photolithographic step, and unnecessary portions of the $p^+$-$\mu c$-Si:H layer 112, the i-a-Si:H layer 111, and the $n^+$-$\mu c$-Si:H layer 110 were etched away by reactive ion etching (RIE), thereby performing pixel isolation for a photoconductive film (FIG. 35E).

Subsequently, the resultant substrate was set in a reaction apparatus coupled with the glow discharge apparatus shown in FIG. 24 by an arrangement as shown in FIG. 23, and a reaction was performed for 250 seconds at $SiH_4$ and $F_2$ gas flow rates of 240 and 360 SCCM, respectively, a substrate temperature of 340° C., and an internal pressure of 0.55 Torr, thereby etching 500 Å of the surface layers of the edges of the $p^+$-$\mu c$-Si:H layer 112, the i-a-Si:H layer 111, and the $n^+$-$\mu c$-Si layer 110 (FIG. 35F).

Thereafter, an SiN layer 114 having a thickness of 8,000 Å was formed through deposition performed for 160 minutes at $SiH_4$, $NH_3$, and $H_2$ gas flow rates of 0.5, 14.4, and 4.5 SCCM, respectively, a substrate temperature of 200° C., an RF power of 3.5 W, and an internal pressure of 0.15 Torr by the use of the conventional plasma CVD. This SiN layer 114 was then etched into a desired shape by the conventional photolithographic process, forming holes for extracting upper wiring electrodes.

On top of the resultant structure, Al was deposited to have a thickness of 10,000 Å by the sputtering process. This Al was then etched into a desired shape by the conventional photolithography to form upper wiring electrodes 115, completing one photoelectric conversion device according to the present invention.

The photoelectric conversion device manufactured by the above process had an S/N ratio of 70 dB, while the S/N ratio of a photoelectric conversion device manufactured through exactly the same process except that no step of etching the surface layers of the edges of the $p^+$-$\mu c$-Si:H layer 112, the i-a-Si:H layer 111, and the $n^+$-$\mu c$-Si layer 110 by using the gas mixture of $SiH_4$ and $F_2$ was performed was only 40 dB due to an increase in a dark current. This demonstrates that the process of the present invention realized the photoelectric conversion device whose characteristics were not much degraded by a dark current. In addition, the edge processing method of the present invention performed after the pixel isolation used no plasma. Therefore, no deterioration in characteristics was brought about because the underlying circuit was not influenced by physical shocks of ions.

Embodiment 6

The examples of this embodiment will be described in detail below with reference to the accompanying drawings.

A photoelectric conversion unit which is the characteristic portion of a photoelectric conversion device of this embodiment will be described below.

Example 6-1

The first example of this embodiment will be described with reference to FIGS. 36, 37A, and 37B.

Figure 36:
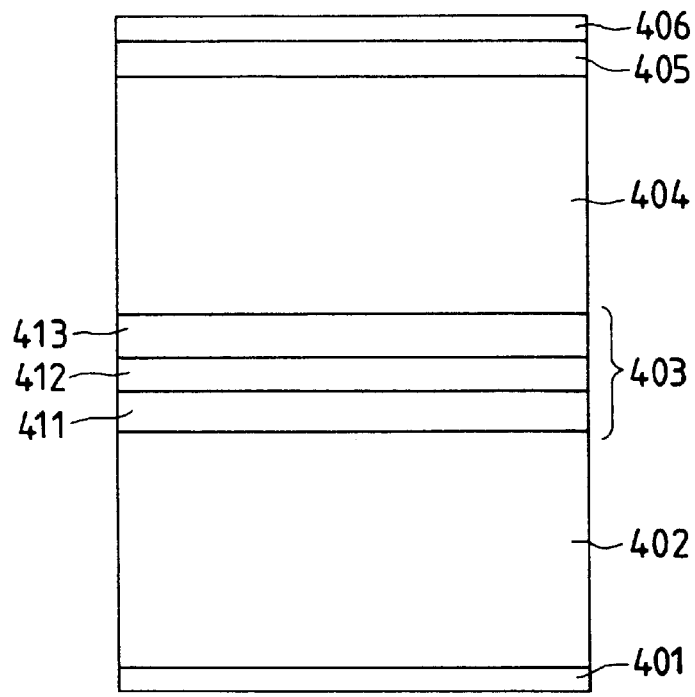
FIG. 36 is a schematic longitudinal sectional view for explaining the structure of a photoelectric conversion unit of a photoelectric conversion device according to the present invention.

FIG. 36 is a schematic longitudinal sectional view showing a photoelectric conversion unit of Example 6-1 of a photoelectric conversion device according to this embodiment.

Referring to FIG. 36, this photoelectric conversion unit comprises a Cr electrode 401, an n-type C-Si substrate 402 serving as a base with a function of inhibiting injection of electrons, a multiplication region 403 for performing carrier multiplication, in which compositions of a-$Si_{1-x}Ge_x$:H, a-$Si_{1-y}C_y$:H, and a-C:H were changed, an a-Si:H light absorption layer 404 having a thickness of about 2 μm for absorbing light to produce carriers, a p-type a-Si:H charge injection inhibiting layer 405 having a thickness of about 100 Å for inhibiting injection of electrons, and a transparent electrode 406 consisting primarily of indium oxide.

The Cr electrode 401 and the transparent electrode 406 were formed by EB vapor deposition, and the amorphous layers, such as the multiplication region 403, the light absorption layer 404, and the charge injection inhibiting layer 405, were formed by a plasma CVD process. As source gases in the formation of the amorphous layers, $SiH_4$, $GeH_4$, and $H_2$ were used for the multiplication region 403, $SiH_4$ and $H_2$ were used for the light absorption layer 404, and $SiH_4$, $B_2H_6$, and $H_2$ were used for the charge injection inhibiting layer 405.

The multiplication region 403 was constituted by three 200-Å thick composition change layers 411, 412, and 413 formed by continuously changing the gas flow rates of $CH_4$ and $GeH_4$ gases of the above source gases.

Figure 38:
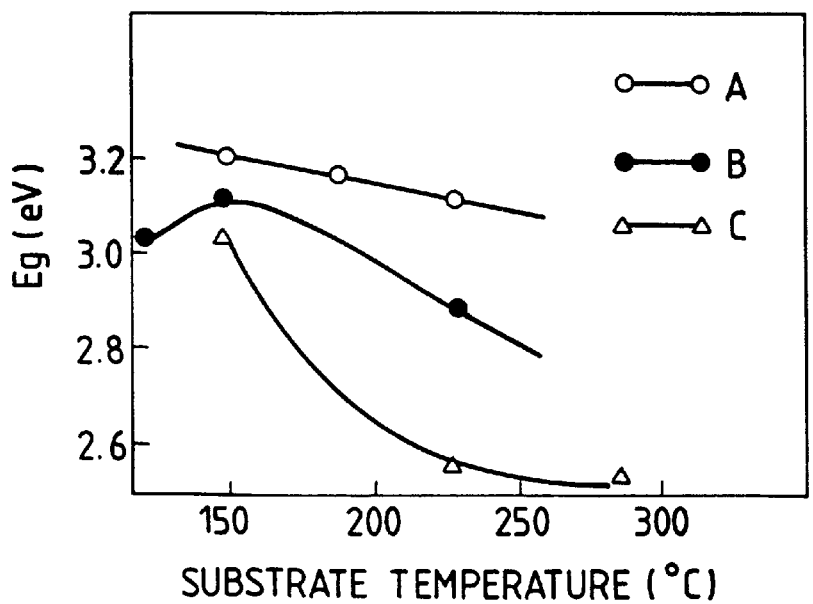
FIG. 38 is a graph showing the formation conditions of A: a-c: H and the substrate temperature dependency of an embodiment of the present invention.

FIG. 38 is a graph showing the gas type dependency and the substrate temperature dependency of the formation conditions of an a-C:H forbidden band width Eg used in the present invention. In the plasma CVD process, films were deposited to have a thickness of 1 μm at an RF power of 10 W, a $CH_4$ gas flow rate of 5 SCCM (A), a $C_2H_6$ gas flow rate of 4 SCCM (B), a $C_2H_4$ gas flow rate of 5 SCCM (C), and a pressure of 0.3 Torr, and the resultant forbidden band widths Eg were measured. As shown in FIG. 38, when the $CH_4$ gas was used, the forbidden band width Eg varied within the range of 0.2 eV and was greater than 3 eV over the temperature range shown in FIG. 38. In addition, the variation in use of the $C_2H_4$ gas was larger than that in use of $CH_4$. For these reasons, $CH_4$ was selected as the gas as described above.

Figure 37A:
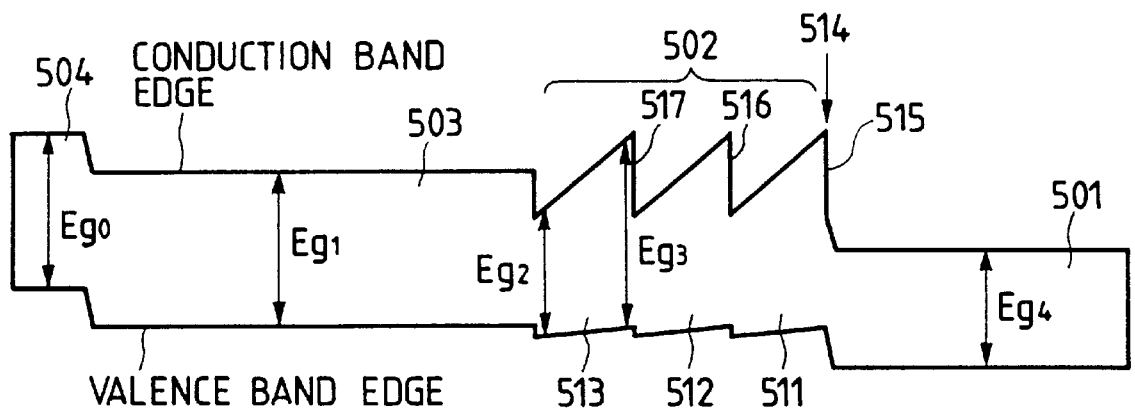
FIG. 37A is an energy band diagram of a photoelectric conversion unit according to an embodiment of the present invention when no bias is applied.
Figure 37B:
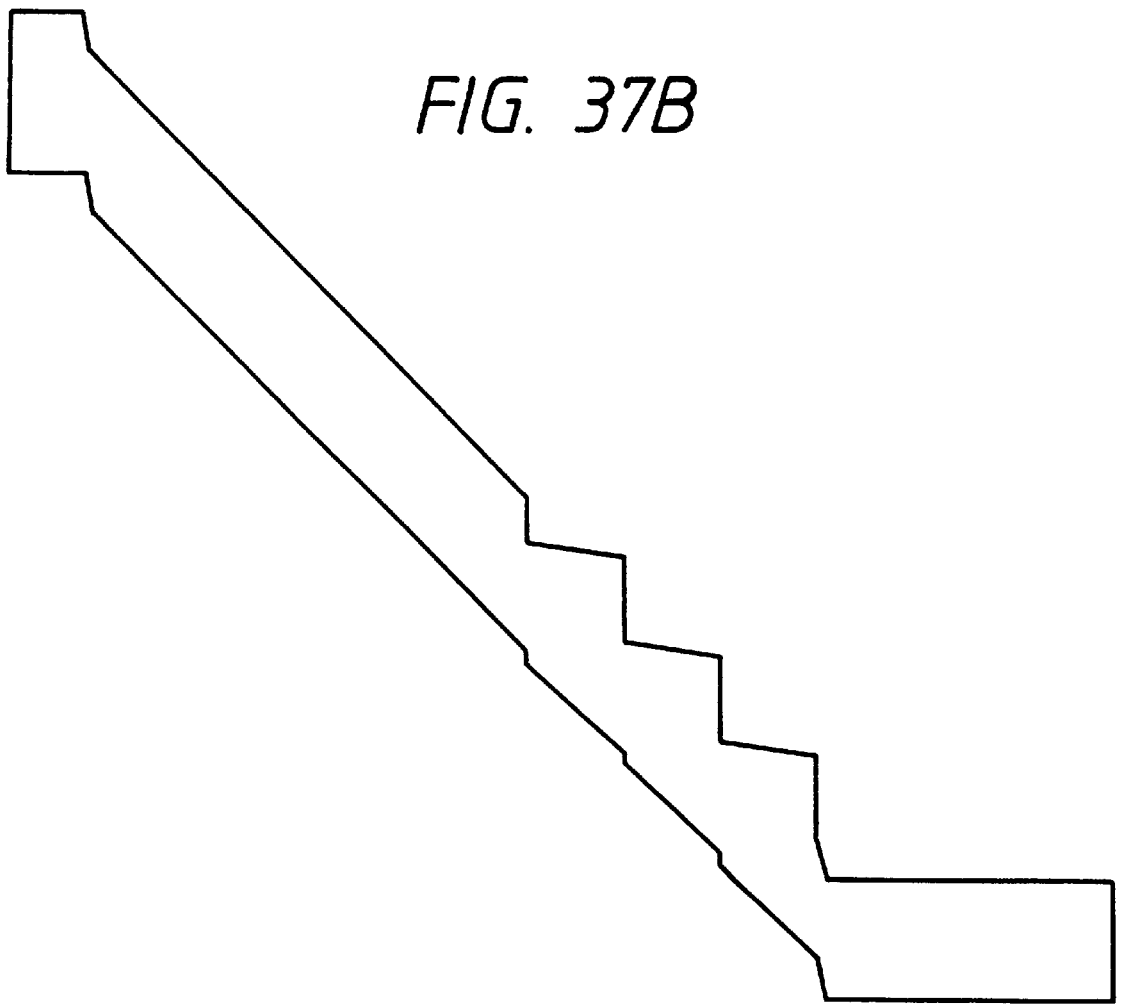
FIG. 37B is an energy band diagram of the photoelectric conversion unit when a bias is applied to perform a carrier multiplication operation.

It is estimated that the energy band structures of the photoelectric conversion device of Example 6-1 shown in FIG. 36 are ideally those shown in FIGS. 37A and 37B.

FIG. 37A is an energy band diagram when no bias is applied to the photoelectric conversion unit of Example 6-1, and FIG. 37B is an energy band diagram when a bias is applied in order to perform a carrier multiplication operation.

FIGS. 37A and 37B show that the forbidden band width of an n-type C-Si substrate 501 is $Eg_4$, the minimum forbidden band width of a multiplication region 502 constituted by three composition change layers 511, 512, and 513 of a-$Si_{1-x}Ge_x$:H, a-$Si_{1-y}$:H, and a-C:H is $Eg_2$, the maximum forbidden band width of the multiplication region 502 is $Eg_3$, the forbidden band width of an a-Si:H layer 503 is $Eg_1$, and the forbidden band width of a p-type a-Si:H layer 504 is $Eg_0$.

Referring to FIG. 37A, energy discontinuous points are present in both a conduction band edge and a valance band edge. When a bias voltage is applied, however, as can be seen from FIG. 37B, almost no barriers caused by energy discontinuity are found in a transit direction of carriers, so the transit properties of carriers are not interfered with.

Of the composition change layers 511, 512, and 513 thus formed, a layer having the maximum forbidden band width $Eg_3$ was formed at a substrate temperature of 200° C., and its $Eg_3$ was approximately 3.15 eV.

A layer having the minimum forbidden band width $Eg_2$ of the composition change layers 511, 512, and 513 was an a-$Si_{1-x}Ge_x$:H layer with a Ge composition ratio x of 0.6, and its $Eg_2$ was about 1.3 eV. Both the forbidden band widths $Eg_1$ and $Eg_0$ of the a-Si:H layers 503 and 504 were approximately 1.8 eV.

The light absorption coefficient of the light absorption layer 503 was about $1\times10^5$ $cm^{-1}$ or more with respect to light having a wavelength of 400 nm and about $5\times10^3$ $cm^{-1}$ or more with respect to light having a wavelength of 700 nm. That is, this light absorption layer could absorb visible light sufficiently.

The multiplication factor of this device was approximately 10 times or more when a bias of 10 V was applied.

In addition, there was no change in the multiplication factor with respect to light having wavelengths of 700 nm or less even if the wavelength was changed.

A dark leakage current exhibited a low value of about 1 $nA/cm^2$ or less upon application of a bias of 10 V.

A light response speed was as high as a speed obtained by a PIN photoelectric conversion device having no multiplication layer 502.

Although the number of composition change layers of the multiplication region was three in this example, the number of layers need not be limited and can be determined in accordance with a desired multiplication factor.

In this example, a structure in which a step back changes steeply is assumed as an ideal energy band diagram. However, the same effect can be obtained even if the step back changes gently, provided that the step back is within the range of a mean free path of electrons. Furthermore, the device can operate even if the step back changes more gently.

The thickness of the composition change layer was about 200 Å in this example, but the thickness is not limited to this value as long as carriers can transit without causing any recombination. However, a smaller thickness is more desirable because an application bias can be reduced.

Although the thickness of the light absorption layer was about 2 μm in this example, the thickness need only have a value by which incident light does not reach the multiplication layer through the light absorption layer. This thickness is determined by the light absorption coefficient.

SiH$_4$, B$_2$H$_6$, PH$_3$, CH$_4$, and GeH$_4$ were used as the source gases for forming the amorphous layers of this example, but the source gases are not limited to these gases. Examples that can be used in place of SiH$_4$ are chain-like silane compounds such as SiF$_4$, Si$_2$H$_6$, Si$_2$F$_6$, Si$_3$H$_8$, SiH$_3$F, and Si$_2$F$_2$, and cyclic silane compounds such as Si$_{5H10}$, Si$_6$H$_{12}$, and Si$_4$H$_8$. Examples that can be used in place of B$_2$H$_6$ are gases containing Group III atoms such as B (boron), Al (aluminum), In (indium), and Tl (thallium). Examples that can be used in place of PH$_3$ are gases containing Group IV atoms such as P (phosphorus), As (arsenic), Sb (antimony), and Bi (bismuth). Examples usable in place of GeH$_4$ are a germanium compound such as GeF$_4$ and a tin compound such as SnH$_4$.

An ECR plasma process is also useful in the formation of the amorphous layers in addition to the plasma CVD process.

Although the amorphous layers were used as the semiconductor layers in this example, non-single-crystal layers such as polycrystalline layers can also be used.

In this example, light was incident from the p-type charge injection inhibiting layer to start a multiplication operation by using electrons. However, the p- and n-type charge injection inhibiting layers may be switched to form the step-back structure on the side of a valence band in the multiplication region. In this case, light is incident from the n-type charge injection inhibiting layer to start a multiplication operation by using holes.

In this example, the forbidden band width of the light absorption layer was approximately 1.8 eV. However, it is also possible to obtain desired spectral sensitivity characteristics by controlling the Eg$_2$ by changing the H$_2$ gas flow rate.

In addition, the forbidden band width and the dose of the charge injection inhibiting layers (of both the p- and n-types) need only be adjusted such that injection of minority carriers from the electrodes can be prevented and transition of majority carriers is not interfered with.

Example 6-2

The second example of this embodiment will be described below with reference to FIG. 39.

Figure 39:
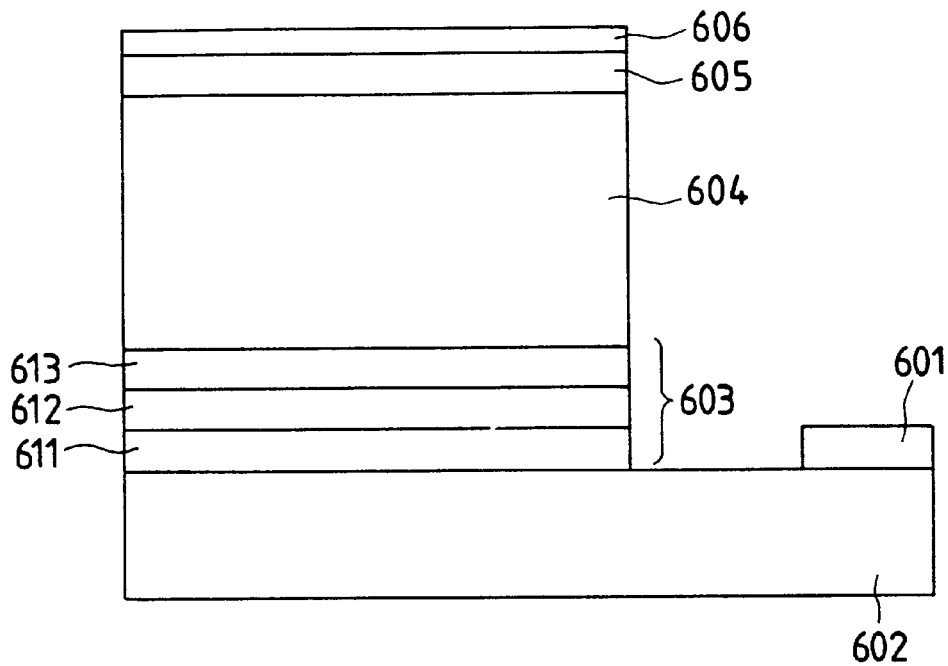
FIG. 39 is a schematic longitudinal sectional view for explaining the structure of a photoelectric conversion unit of an embodiment of a photoelectric conversion device according to the present invention.

FIG. 39 is a schematic longitudinal sectional view showing a photoelectric conversion unit of Example 6-2 of a photoelectric conversion device according to the present invention.

A structure shown in FIG. 39 is identical with that shown in FIG. 36 except for an n-type poly-Si layer 602 formed by a low-pressure CVD process and having a function of inhibiting injection of electrons. Referring to FIG. 39, this photoelectric conversion unit comprises an Al electrode 601, a multiplication region 603 for performing carrier multiplication, which was constituted by three layers 611, 612, and 613 in which compositions of a-Si$_{1-x}$Ge$_x$:H, a-Si$_{1-y}$C$_y$:H, and a-C:H were changed, an a-Si:H light absorption layer 604 having a thickness of about 2 μm for absorbing light to produce carriers, a p-type a-Si:H charge injection inhibiting layer 605 having a thickness of about 100 Å for inhibiting injection of electrons, and a transparent electrode 606 consisting primarily of indium oxide.

The multiplication factor of this device was about 10 times or more when a bias of 10 V was applied.

In addition, there was no change in the multiplication factor with respect to ultraviolet light having wavelengths of 400 nm or less even if the wavelength was changed.

A dark leakage current exhibited a low value of about 0.1 nA/cm$^2$ or less upon application of a bias of 10 V.

A light response speed was as high as a speed obtained by a PIN photoelectric conversion device having no multiplication layer 603. It is clear from the above description that the a-C:H used in the present invention has a sufficiently large ΔEc and a sufficiently small ΔEv, performs multiplication, and does not limit transition of carriers.

A whole structure and an operation of the photoelectric conversion device according to the present invention will be described below.

In an example to be explained below, the photoelectric conversion unit described in Example 6-1 was stacked on the scanning circuit and the reading circuit that the present inventors have already proposed in Japanese Laid-Open Patent Application No. 63-278269.

Example 6-3

Figure 40:
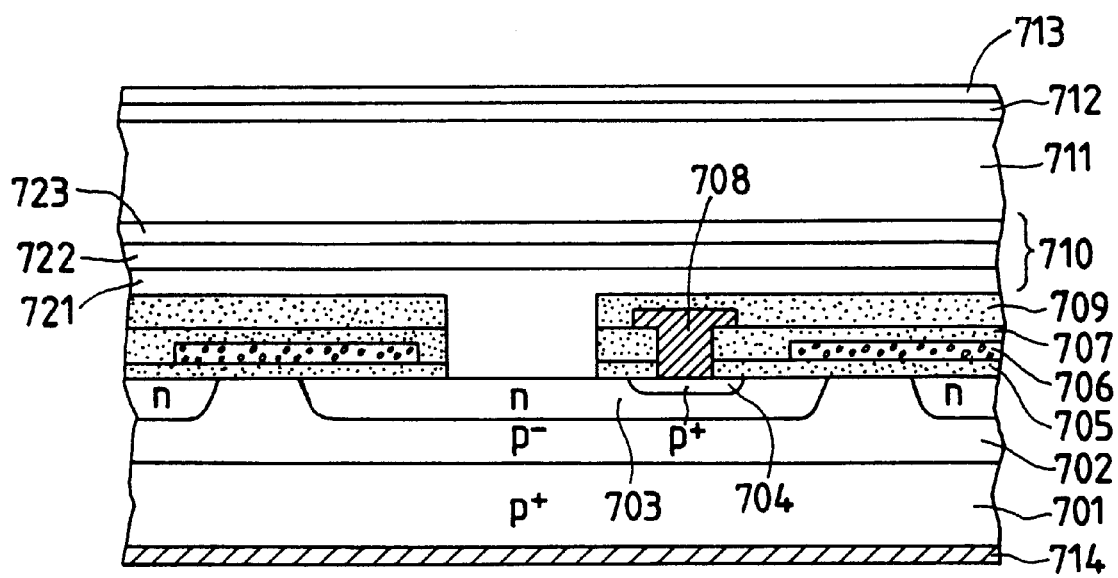
FIG. 40 is a schematic sectional view showing a light-receiving portion and its peripheral portion of an embodiment of a photoelectric conversion device according to the present invention.
Figure 41:
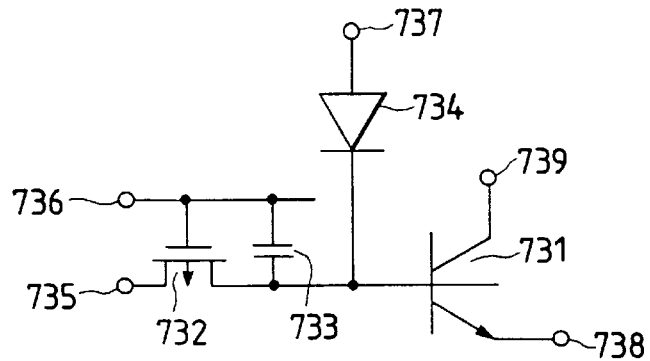
FIG. 41 is an equivalent circuit diagram showing one pixel.
Figure 42:
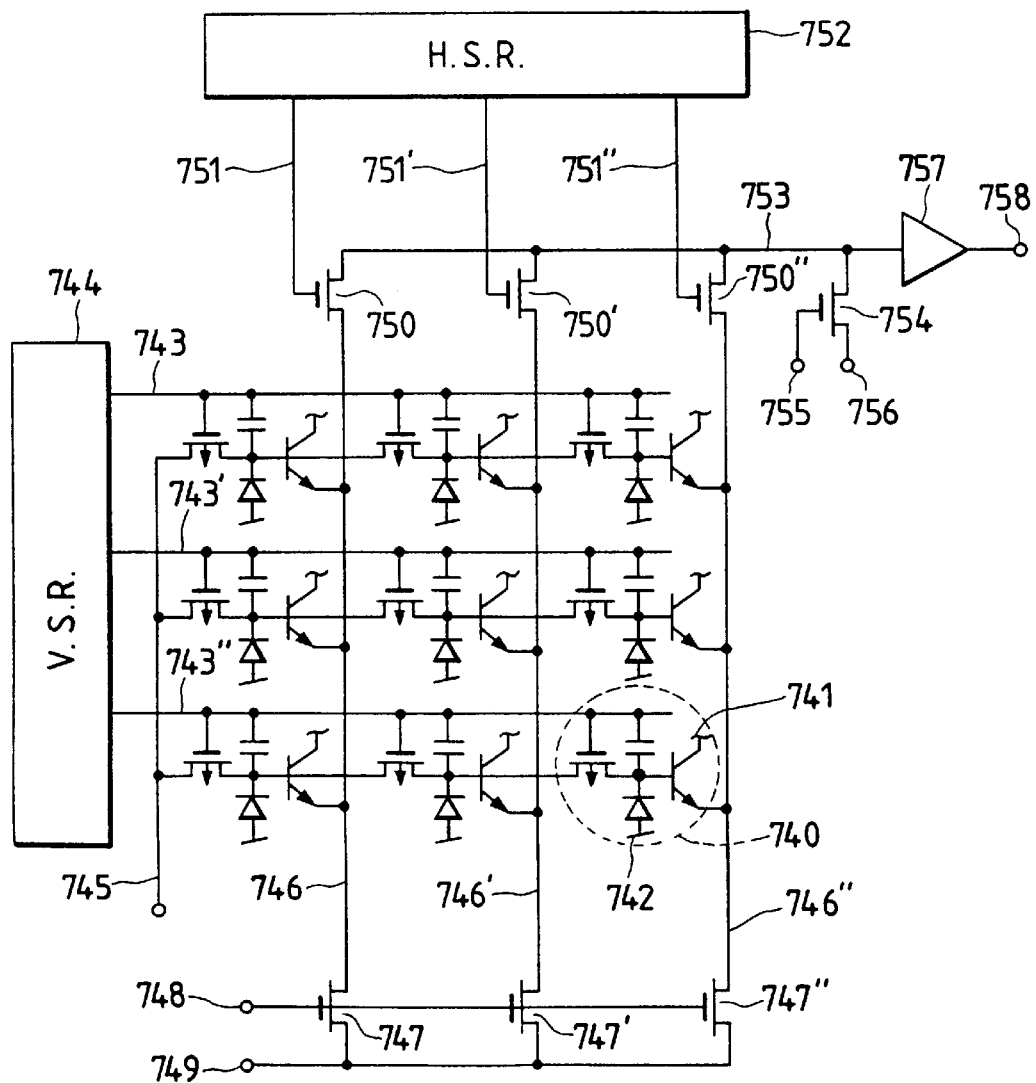
FIG. 42 is an equivalent circuit diagram including blocks, which shows the entire device.

FIG. 40 is a schematic sectional view showing a light-receiving portion and its peripheral portion of Example 6-3 of the photoelectric conversion device according to the present invention. FIG. 41 is an equivalent circuit diagram showing one pixel, and FIG. 42 is an equivalent circuit diagram including blocks, which shows the entire device.

Referring to FIG. 40, a p$^-$-type layer 702 serving as a collector region is formed on a p-type silicon substrate 701 by epitaxial growth, and an n-type base region 703 and a p$^+$-type emitter region 704 are formed in the p$^-$-type layer 702, constituting a bipolar transistor.

The n-type base region 703 is isolated from adjacent pixels, and a gate electrode 706 is formed between the n-type base regions 703 horizontally adjacent to each other via an oxide film 705. Therefore, an n-channel MOS transistor is constituted by using the adjacent n-type base regions 703 as source and drain regions. The gate electrode 706 also serves as a capacitor for controlling the potential of the n-type base region 703.

An emitter electrode 708 is formed after formation of an insulating layer 707.

Thereafter, an insulating layer 709 is formed, and composition change layers 721, 722, and 723 in which a composition changes from a-Si$_{1-x}$Ge$_x$:H to a-Si$_{1-y}$C$_y$:H are formed to constitute a multiplication region 710. Subsequently, an a-Si:H light absorption layer 711 and a p-type a-Si:H layer 712 are formed, and a transparent electrode 713 for applying a bias voltage to a sensor is also formed.

In addition, a collector electrode 714 is ohmic-connected to the lower surface of the substrate 701.

An equivalent circuit of one pixel, therefore, is as shown in FIG. 41. In FIG. 41, an n-channel MOS transistor 732, a capacitor 733, and a photoelectric conversion device 734 identical with that of Example 6-1 are connected to the base of a bipolar transistor 731 consisting of crystalline silicon. This pixel also comprises a terminal 735 for applying a potential to the base, a terminal 736 for driving the n-channel MOS transistor 732 and the capacitor 733, a sensor electrode 737, an emitter electrode 738, and a collector electrode 739.

FIG. 42 is a circuit diagram showing a part of a circuit diagram in which pixel cells 740 as shown in FIGS. 40 and 41 are arranged in a 3×3 two-dimensional matrix manner.

Referring to FIG. 42, collector electrodes 741 are provided for the individual pixels 740, and sensor electrodes 742 are also formed for all the pixels. The gate and capacitor electrodes of the n-channel MOS transistors are connected to drive lines 743, 743', and 743" in units of rows and then connected to a vertical shift register (V.S.R.) 744. The emitter electrodes are connected to vertical lines 746, 746', and 746" for reading out signals in units of columns. The vertical lines 746, 746', and 746" are connected to reset switches 747, 747', and 747" for resetting charges on the respective vertical lines and read switches 750, 750', and 750", respectively. The gate electrodes of the reset switches 747, 747', and 747" are connected together to a terminal 748 for applying a vertical line reset pulse, and their source electrodes are connected together to a terminal 749 for applying a vertical line reset voltage. The gate electrodes of the read switches 750, 750', and 750" are connected to a horizontal shift register (H.S.R.) 752 through lines 751, 751', and 751", and their drain electrodes are connected to an output amplifier 757 through a horizontal read line 753. This horizontal read line 753 is connected to a reset switch 754 for resetting a charge on the horizontal read line.

The reset switch 754 is connected to a terminal 755 for applying a horizontal line reset pulse and to a terminal 756 for applying a horizontal line reset voltage.

An output from an amplifier 757 is extracted from a terminal 758.

An operation will be described briefly below with reference to FIGS. 40 to 42.

Incident light is absorbed by the light absorption layer 711 shown in FIG. 40, and carriers generated are multiplied by the multiplication region 710 and stored in the base region 703.

When a negative drive pulse delivered from the vertical shift register shown in FIG. 42 appears on the drive line 743, the base potentials decrease via the capacitors, and signal charges corresponding to the quantity of light are extracted from the pixels on the first row to the vertical lines 746, 746', and 746".

Subsequently, when the horizontal shift register 752 outputs scan pulses 751, 751', and 751", the switches 750, 750', and 750" are ON/OFF-controlled in sequence, and the signals are transferred to the output terminal 758 via the amplifier 757. In this case, while the switches 750, 750', and 750" are turned on in this order, the reset switch 754 is turned on to remove the residual charge from the horizontal line 753.

Subsequently, the vertical line reset switches 747, 747', and 747" are turned on to remove the residual charges from the vertical lines 746, 746', and 746", respectively. When the vertical shift register 744 applies a positive pulse to the drive line 743, the n-type MOS transistors of the pixels on the first row are turned on to remove the base residual charges from the individual pixels, thereby initializing the pixels.

An output drive pulse from the vertical shift register 744 then appears on the drive line 743' to extract signal charges from the pixels on the second row in the same manner as described above.

Subsequently, extraction of signal charges from the pixels on the third row is similarly performed.

This device operates by repeatedly executing the above operation.

Note that Example 6-3 has been explained by taking the circuit invented by the present inventors as an example, but the present invention is similarly applicable to other general photoelectric conversion devices.

Example 6-4

An example in which the photoelectric conversion device of the present invention is applied to a photoelectric conversion device having a general arrangement will be described below.

Figure 43:
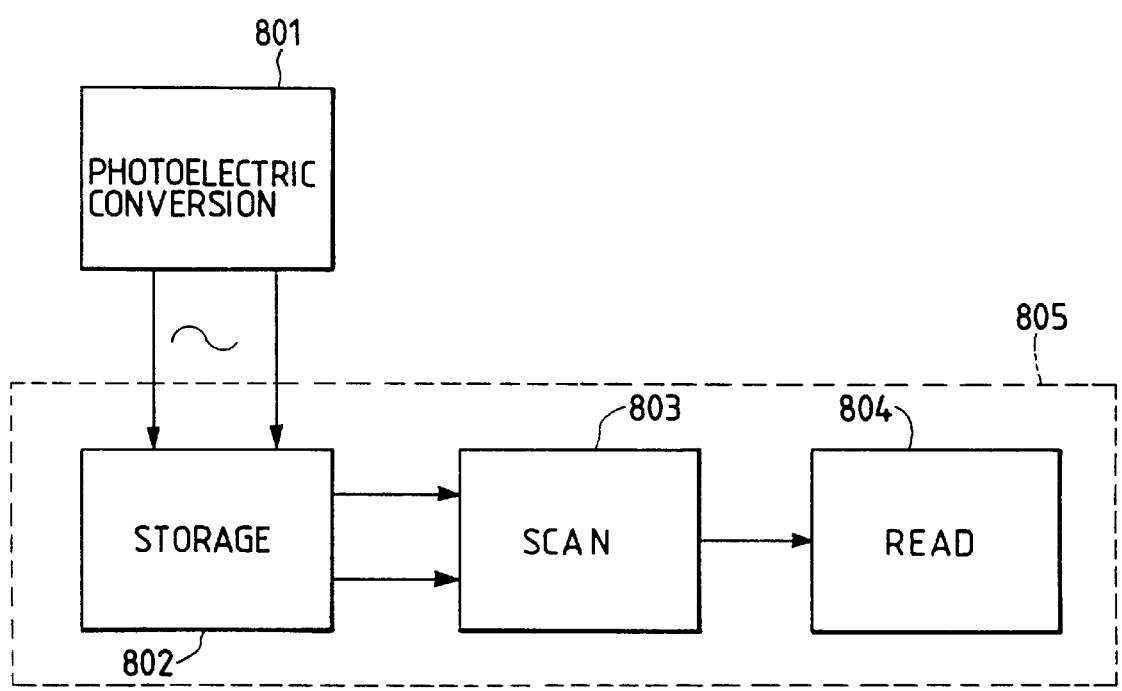
FIG. 43 is a block diagram showing an arrangement when a photoelectric conversion device with a general arrangement is used in the present invention.

FIG. 43 is a block diagram showing an arrangement in which the present invention is applied to a photoelectric conversion device having a common arrangement.

Referring to FIG. 43, the photoelectric conversion device of the present invention explained in Example 6-1 or 6-2 is used as each of a plurality of photoelectric conversion units 801 according to the present invention. The photoelectric conversion units 801 are connected to an signal output unit 805. The signal output unit 805 includes a storage means 802 for storing signal charges generated by the photoelectric conversion units 801, a scanning means 803 for scanning the signal charges, and a reading means 804 which consists of, e.g., an amplifier and a noise compensation circuit for reading out the signal charges transferred from the scanning means.

Note that the storage means 802 need not be used although it is necessary to perform a storage operation.

Example 6-5

Example 6-5 of the present invention will be described below with reference to FIG. 44.

Figure 44:
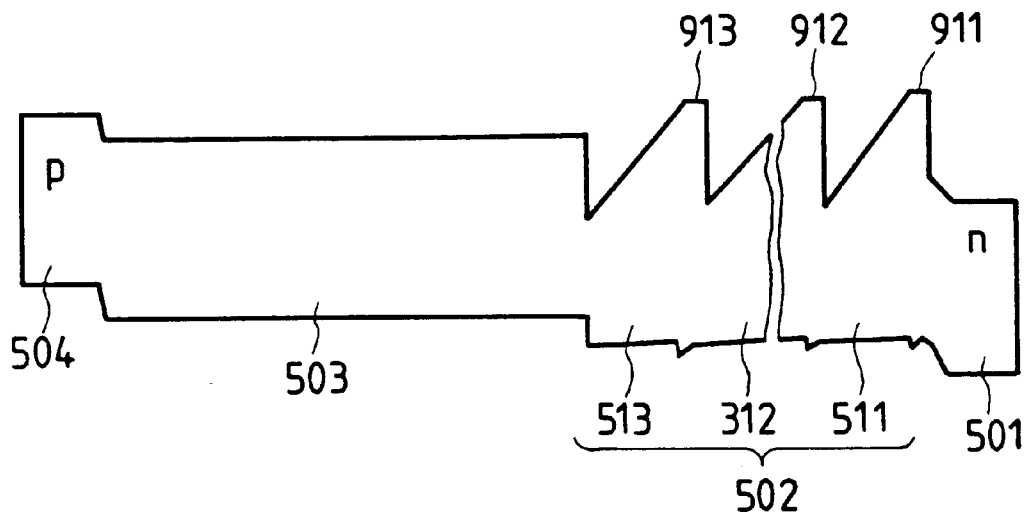
FIG. 44 is an energy band diagram of another embodiment of the present invention.

FIG. 44 is an energy band diagram when no bias is applied to a photoelectric conversion unit of Example 6-5 of the photoelectric conversion device according to the present invention. In FIG. 44, the same reference numerals as in FIG. 37 denote the same parts. A large difference of FIG. 44 from FIG. 37 is that a-C:H layers 913, 912, and 911 each having a constant forbidden band width and a thickness of about 30 Å are added to step-back layers 513, 512, and 511, respectively, of a multiplication layer 502. A formation method of the a-C:H is identical with that of Example 6-1. With these layers 913, 912, and 911, ionization degrees of electrons at energy steps are increased by the effect of an applied electric field.

Embodiment 7

Example 7-1

Example 7-1 of the present invention will be described below with reference to FIG. 45.

Figure 45:
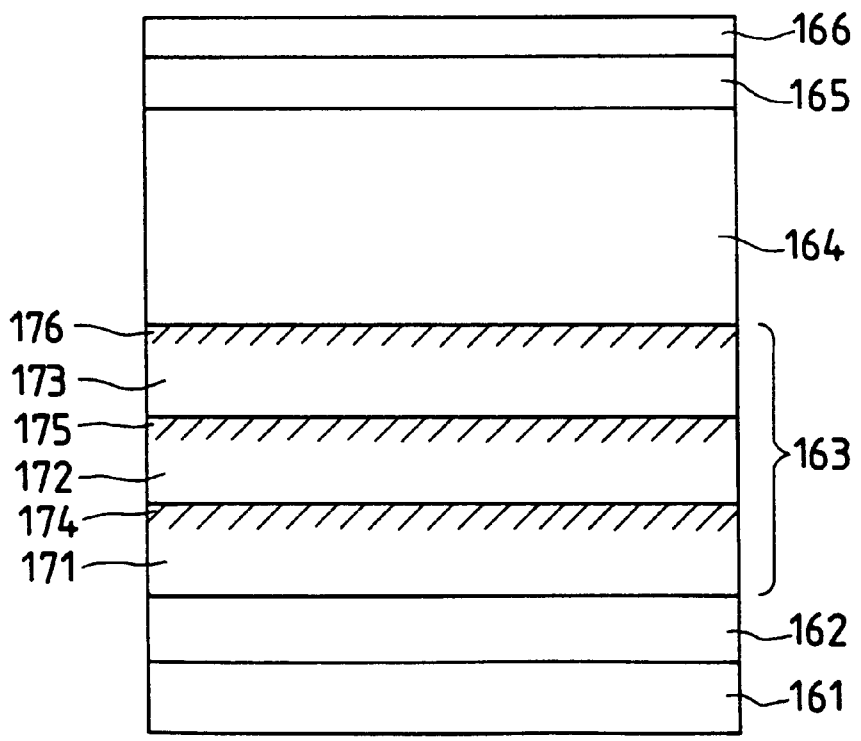
FIG. 45 is a schematic sectional view showing still another embodiment of a photoelectric conversion device according to the present invention.

Referring to FIG. 45, this photoelectric conversion device comprises a Cr electrode 161, an n-type a-$Si_{1-x}Ge_x$:H charge injection inhibiting layer 162 having a thickness of about 500 Å for inhibiting injection of holes, a multiplication layer 163 for performing carrier multiplication, in which a forbidden band width is changed by changing a composition from a-$Si_{1-x}Ge_x$:H to a-$Si_{1-y}C_y$:H, an a-Si:H light absorption layer 164 having a thickness of about 1 μm for absorbing light to produce carriers, a p-type a-$Si_{1-y}'C_y'$:H charge injection inhibiting layer 165 having a thickness of about 100 Å for inhibiting injection of electrons, and a transparent electrode 166 mainly consisting of indium oxide.

The Cr electrode 161 was formed by EB vapor deposition, the transparent electrode 166 was formed by sputtering, and the charge injection inhibiting layer 165, the multiplication layer 163, the light absorption layer 164, and the charge injection inhibiting layer 162 were formed by plasma CVD. The source gases used in the formation of the amorphous layers were $SiH_4$, $GeH_4$, $PH_3$, and $H_2$ for the charge injection inhibiting layer 162, $SiH_4$, $GeH_4$, $CH_4$, $B_2H_6$, and $H_2$ for the multiplication layer 163, $SiH_4$ and $H_2$ for the light absorption layer 164, and $SiH_4$, $CH_4$, $B_2H_6$, and $H_2$ for the charge injection inhibiting layer 165. The multiplication region 163 was constituted by 200-Å thick forbidden band width and Fermi level change layers 171, 172, and 173 formed by continuously changing the gas flow rates of $CH_4$, $GeH_4$, and $B_2H_6$ of the above source gases.

Stacking of the forbidden band width change regions of the multiplication layer was started from formation of a maximum forbidden band width layer using $SiH_4$, $H_2$, $CH_4$, and $B_2H_6$ gases. The flow rate of $CH_4$ was then decreased gradually, and, when the flow rate of $CH_4$ became zero, the flow rate of $GeH_4$ was increased gradually, thereby forming other layers up to a minimum forbidden band width layer. In this case, the flow rate of $B_2H_6$ was also decreased gradually from the formation of the maximum forbidden band width layer to become zero in the formation of the minimum forbidden band width layer.

When the formation of the minimum forbidden band width was finished, the flow rates of $SiH_4$ and $GeH_4$ were reduced to zero, and layers 174, 175, and 176 by each of which the surface of the minimum forbidden band layer was terminated with hydrogen atoms were formed by using plasma of $H_2$ gas (or a gas mixture of $H_2$ and a diluted gas as of $H_2$ and Ar or $H_2$ and He). Thereafter, the $SiH_4$, $CH_4$, and $B_2H_6$ gases were again supplied to incline the forbidden band width from a position at which the maximum forbidden band width was formed, thereby stacking layers.

Figure 46A:
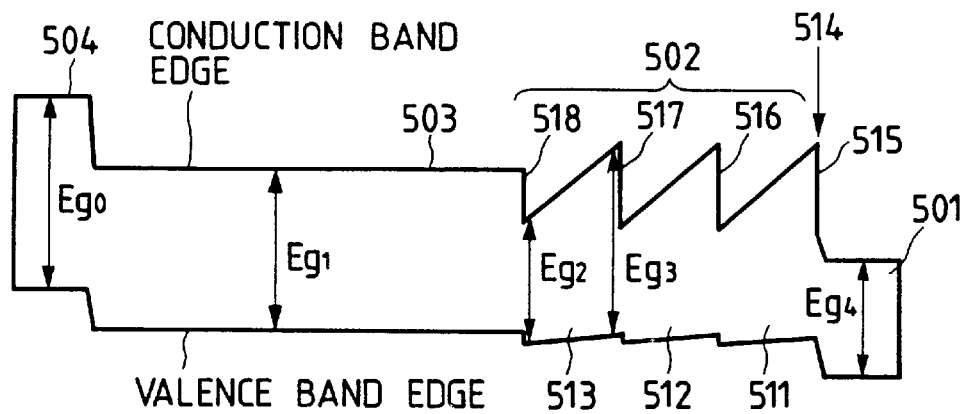
FIG. 46A is an energy band diagram when a weak electric field is applied to the photoelectric conversion device shown in FIG. 45.
Figure 46B:
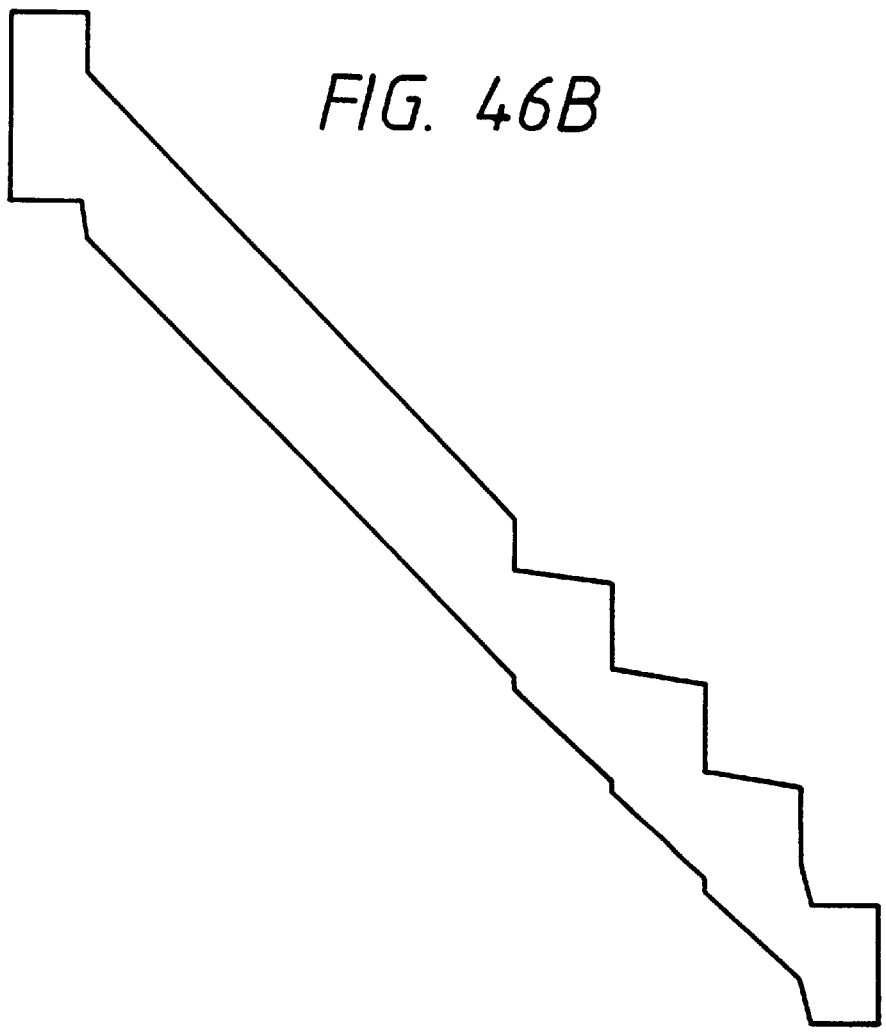
FIG. 46B is an energy band diagram when a strong electric field is applied to the photoelectric conversion device shown in FIG. 45.

The energy band structures of the photoelectric conversion device according to the example shown in FIG. 45 are shown in FIGS. 46A and 46B. FIG. 46A is an energy band diagram when a weak electric field is applied to this photoelectric conversion device, and FIG. 46B is an energy band diagram when a strong electric field is applied to this photoelectric conversion device.

FIGS. 46A and 46B indicate that the forbidden band width of an n-type a-$Si_{1-y}Ge_x$:H layer 501 is $Eg_4$, the minimum forbidden band width and the maximum forbidden band width of a multiplication region consisting of three forbidden band width change layers 511, 512, and 513 in which a composition is changed from a-$Si_{1-x}Ge_x$:H to a-$Si_{1-y}C_y$:H are $Eg_2$ and $Eg_3$, respectively, the forbidden band width of an a-Si:H layer 503 is $Eg_1$, and the forbidden band width of a p-type a-$Si_{1-y'}C_{y'}$:H layer 504 is $Eg_0$. FIGS. 46A and 46B also illustrate step-back heterojunctions 515, 516, and 517.

The forbidden band width $Eg_1$ of the a-Si:H layer 503 is about 1.72 eV. A composition ratio y' of C contained in the p-type a-$Si_{1-y'}C_{y'}$:H layer 504 is about 0.2, and the forbidden band width of this layer is about 2.2 eV. A composition ratio y of an a-$Si_{1-y}C_y$ layer of the forbidden band width change layers 511, 512, and 513, which gives a maximum forbidden band width, is approximately 0.5, and the forbidden band widths of these layers are approximately 2.9 eV. The composition ratio of Ge in both the n-type a-$Si_{1-x}Ge_x$:H layer 501 and an a-$Si_{1-x}Ge_x$:H layer of the forbidden band width change layers 511, 512, and 513, which gives a minimum forbidden band width, is about 0.4, and the forbidden band widths $Eg_4$ and $Eg_2$ of these layers are approximately 1.4 eV.

The concentration of B in the forbidden band width change layers is at maximum in the maximum forbidden band width layer, decreases gradually from that layer, and is zero in the minimum forbidden band width layer. At this point, the Fermi level of each of the forbidden band width change layers 511, 512, and 513 is located at a position below the center of the forbidden band by about 0.4 eV in the maximum forbidden band width layer, changes gradually from that position, and is at the center of the forbidden band in the minimum forbidden band width layer. At this time, the Fermi level in the vicinity of the step-back heterojunction is almost constant within the range of approximately 0.1 eV from a vacuum level.

In this example, as can be seen from FIGS. 46A and 46B, neither spikes nor notches are produced under either a weak electric field or a strong electric field. In addition, since defect levels of the step-back heterojunction portions of the inclined multiplication layer are reduced by the terminating effect of hydrogen, the multiplication factor of the photoelectric conversion device of this example almost remained unchanged, about 10 times, even upon application of a bias of 10 to 20 V. Excess noise produced upon multiplication exhibited as low as approximately 1.05. In addition, a dark current was only about 1 nA/cm². Also, a response speed showed a high value equivalent to that obtained by a PIN photoelectric conversion device having no multiplication layer.

Although the number of forbidden band width change layers of the multiplication layer is three in this example, the number of layers is not limited and can be determined in accordance with a desired multiplication factor.

In this example, the step-back heterojunction forms a sharp junction. However, the same effect can be obtained even if the junction is gentle provided that the step back is within the range of a mean free path of electrons. In addition, the device can operate even if the junction is moderate.

This thickness of the composition change layer was about 200 Å in this example, but the thickness is not limited to this value as long as carriers can transit without causing any recombination. However, a smaller thickness is more desirable because an application bias can be reduced. Although the thickness of the light absorption layer was about 1 μm in this example, the thickness need only be one by which incident light does not reach the multiplication layer through the light absorption layer. This thickness is determined by the light absorption coefficient. $SiH_4$, $B_2H_6$, $PH_3$, $CH_4$, and $GeH_4$ were used as the source gases for forming the amorphous layers of this example, but the source gases are not limited to these gases. Examples that can be used in place of $SiH_4$ are chain-like silane compounds such as $SiF_4$, $Si_2H_6$, $Si_2F_6$, $Si_3H_8$, $SiH_3F$, and $Si_2F_2$, and cyclic silane compounds such as $Si_5H_{10}$, $Si_6H_{12}$, and $Si_4H_8$. Examples that can be used in place of $B_2H_6$ are gases containing Group III atoms such as B, Al, In, and Tl. Examples usable in place of $PH_3$ are gases containing Group IV atoms such as P, As, Sb, and Bi. Examples that can be used in place of $CH_4$ are carbon compounds such as $CH_2F_2$, $C_2H_6$, $C_2H_4$, $C_2H_2$, $Si(CH_3)_4$, and $SiH(CH_3)_3$, nitrogen compounds such as $N_2$, $NH_3$, $H_2NNH_2$, $HN_3NH_4N_3$, $F_3N$, and $F_4N$, and oxygen compounds such as $O_2$, $CO_2$, NO, $NO_2$, $N_2O$, $O_3$, $N_2O_3$, $N_2O_4$, and $NO_3$. Examples usable in place of $GeH_4$ are a germanium compound such as $GeF_4$ and a tin compound such as $SnH_4$. In addition, the composition ratio of the forbidden band width change layers preferably ranges from 0 to about 0.6 in order to reduce localized levels.

An ECR plasma process is also useful in the formation of the amorphous layers in addition to the plasma CVD process.

Although the amorphous layers were used as the semiconductor layers in this example, non-single-crystal layers such as polycrystalline layers can also be used.

In this example, light was incident from the p-type charge injection inhibiting layer to start a multiplication operation by using electrons. However, the p- and n-type charge injection inhibiting layers may be switched to form a steep step-back heterojunction on the side of a valence band in the multiplication region. In this case, light is incident from the n-type charge injection inhibiting layer to start a multiplication operation by using holes.

In addition, the forbidden band width and the dose of each charge injection inhibiting layer need only be adjusted such that injection of minority carriers from the electrodes can be prevented and transition of majority carriers is not interfered with.

Example 7-2

An example in which the photoelectric conversion device described in the above example was stacked on the scanning circuit and the reading circuit already proposed by the present inventors in Japanese Laid-Open Patent Application No. 63-278269 will be described in detail below.

Figure 47:
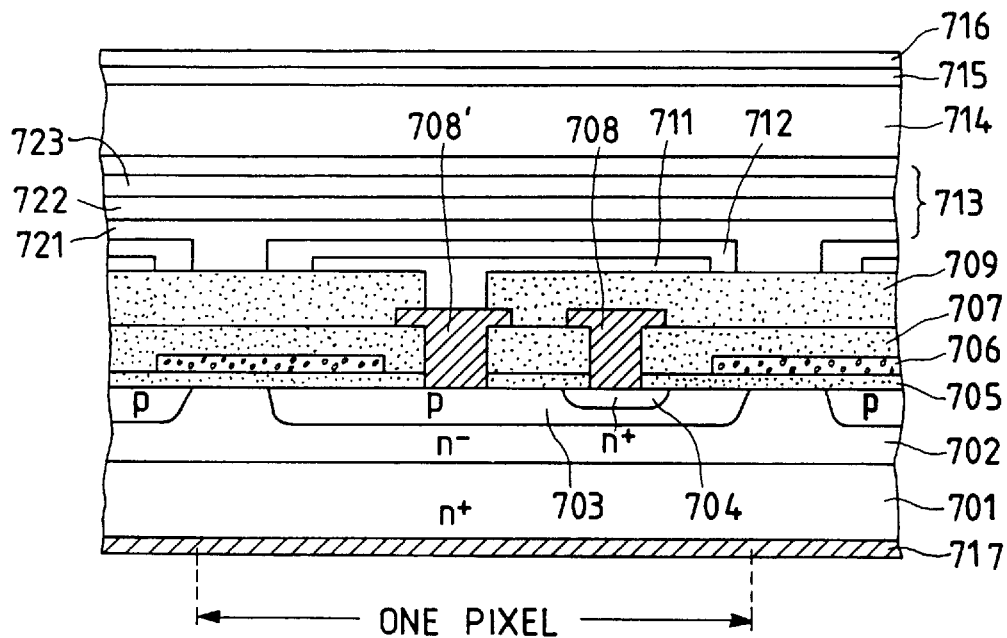
FIG. 47 is a schematic sectional view showing a light-receiving portion and its peripheral portion of still another embodiment of the present invention.

FIG. 47 is a schematic sectional view showing a light-receiving portion and its peripheral portion according to this example of the present invention. Note that an equivalent circuit diagram of one pixel is identical with that shown in FIG. 41, and an equivalent circuit diagram including blocks of an entire device is identical with that shown in FIG. 42.

Referring to FIG. 47, an $n^-$-type layer 702 serving as a collector region is formed on an n-type silicon substrate 701 by epitaxial growth, and p-type base region 703 and an $n^+$-type emitter region 704 are formed in the $p^-$-type layer 702, constituting a bipolar transistor. The p-type base region 703 is isolated from adjacent pixels, and a gate electrode 706 is formed between the p-type base regions 703 horizontally adjacent to each other via an oxide film 705. Therefore, a p-channel MOS transistor is constituted by using the adjacent p-type base regions 703 as source and drain regions. The gate electrode 706 also serves as a capacitor for controlling the potential of the p-type base region 703. After an insulating layer 707 is formed, an emitter electrode 708 and a base electrode 708' are formed. Thereafter, an insulating layer 709 is formed, and then an electrode 711 is formed and isolated into individual pixels. The electrode 711 and the electrode 708' are electrically connected.

Subsequently, multiplication layers 721, 722, 723, and 724 are formed such that the surfaces of minimum forbidden band width layers are terminated with hydrogen by forming forbidden band width change layers having a composition changing from $a\text{-}Si_{1-x}Ge_x{:}H$ to $a\text{-}Si_{1-y}C_y{:}H$, thereby constituting a multiplication region 713.

Subsequently, an a-Si:H light absorption layer 714 and a p-type $a\text{-}Si_{1-y}{'}C_y{'}{:}H$ layer 715 are formed, and a transparent electrode 716 for applying a bias voltage to a sensor is also formed. In addition, a collector electrode 717 is ohmic-connected to the lower surface of the substrate 701.

An equivalent circuit of one pixel, therefore, is as shown in FIG. 41. In FIG. 41, a p-channel MOS transistor 732, a capacitor 733, and a photoelectric conversion device 734 identical with that of the above example are connected to the base of a bipolar transistor 731 consisting of crystalline silicon. This pixel also comprises a terminal 735 for applying a potential to the base, a terminal 736 for driving the p-channel MOS transistor 732 and the capacitor 733, an electrode 737 and an emitter electrode 738 for applying a potential to the transparent electrode, and a collector electrode 739.

FIG. 42 is a circuit diagram showing a part of a circuit diagram in which pixel cells 740 as shown in FIGS. 47 and 41 are arranged in a 3×3 two-dimensional matrix manner.

Referring to FIG. 42, collector electrodes 741 are provided for the individual pixels 740, and sensor electrodes 724 are also formed for all the pixels. The gate and capacitor electrodes of the PMOS transistors are connected to drive lines 743, 743', and 743" in units of rows and then connected to a vertical shift register (V.S.R.) 744. The emitter electrodes are connected to vertical lines 746, 746', and 746" for reading out signals in units of columns. The vertical lines 746, 746', and 746" are connected to reset switches 747, 747', and 747" for resetting charges on the respective vertical lines and read switches 750, 750', and 750", respectively. The gate electrodes of the reset switches 747, 747', and 747" are connected together to a terminal 748 for applying a vertical line reset pulse, and their source electrodes are connected together to a terminal 749 for applying a vertical line reset voltage. The gate electrodes of the read switches 750, 750', and 750" are connected to a horizontal shift register (H.S.R.) 752 through lines 751, 751', and 751", and their drain electrodes are connected to an output amplifier 757 through a horizontal read line 753. This horizontal read line 753 is connected to a reset switch 754 for resetting a charge on the horizontal read line. The reset switch 754 is connected to a terminal 755 for applying a horizontal line reset pulse and to a terminal 756 for applying a horizontal line reset voltage. An output from an amplifier 757 is extracted from a terminal 758.

An operation will be described briefly below with reference to FIGS. 42, 47, and 41. Incident light is absorbed by the light absorption layer 714 shown in FIG. 47, and carriers generated are multiplied by the multiplication region 713 and stored in the base region 703. When a negative drive pulse delivered from the vertical shift register shown in FIG. 42 appears on the drive line 743, the base potentials rise via the capacitors, and signal charges corresponding to the quantity of light are extracted from the pixels on the first row to the vertical lines 746, 746', and 746". Subsequently, when the horizontal shift register 752 outputs scan pulses 751, 751', and 751", the switches 750, 750', and 750" are ON/OFF-controlled in sequence, and the signals are transferred to the output terminal 758 via the amplifier 757. In this case, while the switches 750, 750', and 750" are turned on in this order, the reset switch 754 is turned on to remove the residual charge from the horizontal line 753. Subsequently, the vertical line reset switches 747, 747', and 747" are turned on to remove the residual charges from the vertical lines 746, 746', and 746", respectively. When the vertical shift register 744 applies a negative pulse to the drive line 743, the PMOS transistors of the pixels on the first row are turned on to remove the base residual charges from the individual pixels, thereby initializing the pixels. An output drive pulse from the vertical shift register 744 then appears on the drive line 743' to extract signal charges from the pixels on the second row in the same manner as described above. Subsequently, extraction of signal charges from the pixels on the third row is similarly performed. This device operates by repeatedly executing the above operation.

Note that Example 7-2 has been explained by taking the circuit invented by the present inventors as an example, but the present invention is similarly applicable to other general photoelectric conversion devices.

Example 7-3

An example in which the photoelectric conversion device of the present invention is applied to a photoelectric conversion device having a general arrangement will be described below. FIG. 43 is a block diagram showing an arrangement in which the present invention is applied to a photoelectric conversion device having a common arrangement. Referring to FIG. 43, the photoelectric conversion

47 device of the present invention explained in Example 6-1 or 6-2 is used as each of a plurality of photoelectric conversion units 801 according to the present invention. The photoelectric conversion units 801 are connected to a signal output unit 805. The signal output unit 805 includes a storage means 802 for storing signal charges generated by the photoelectric conversion units 801, a scanning means 803 for scanning the signal charges, and a reading means 804 which consists of, e.g., an amplifier and a noise compensation circuit for reading out the signal charges transferred from the scanning means. Note that the storage means 802 need not be used although it is necessary to perform a storage operation.

Embodiment 8

Example 8-1

Example 8-1 of the present invention will be described below with reference to FIG. 48.

Figure 48:
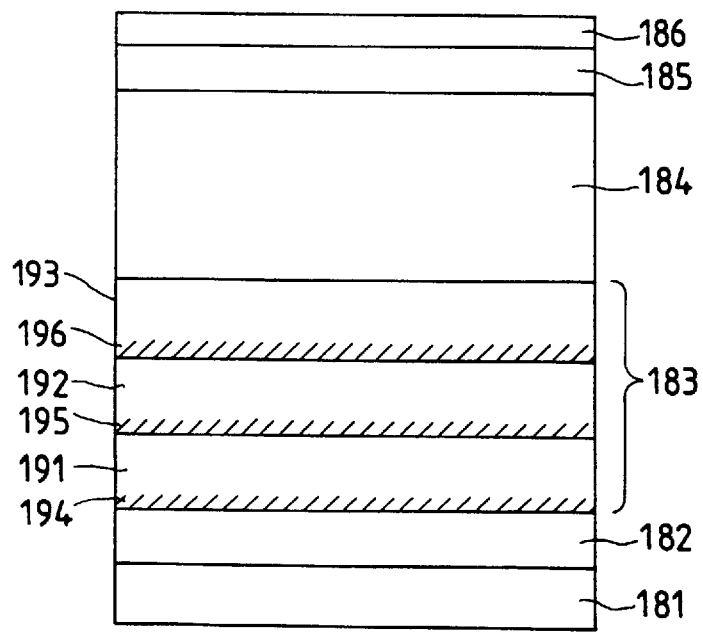
FIG. 48 is a schematic sectional view showing the structure of still another embodiment of a photoelectric conversion device according to the present invention.
Figure 49A:
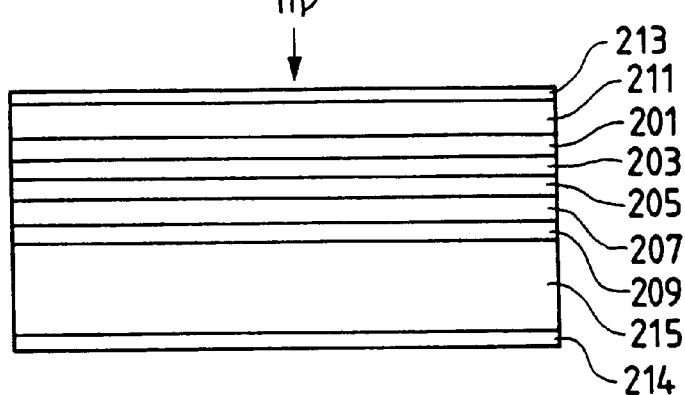
FIG. 49A shows schematically a sectional structure of a prior art photoelectric conversion device.
Figure 49B:
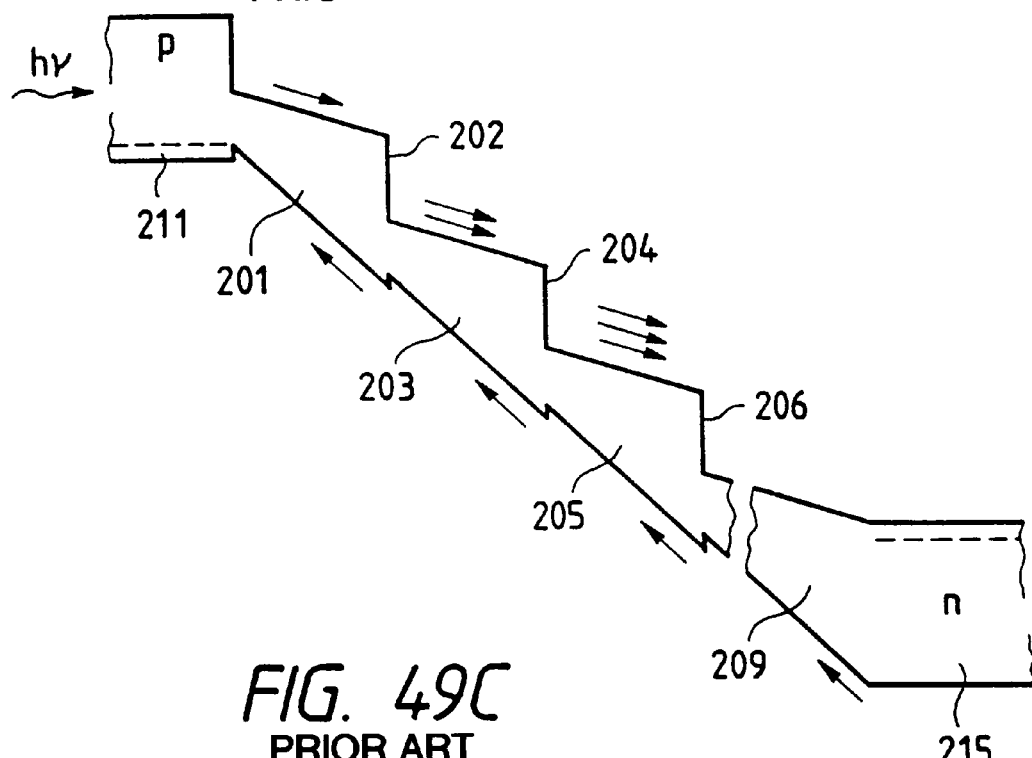
FIG. 49B shows an energy band diagram of a prior art photoelectric conversion device.
Figure 49C:
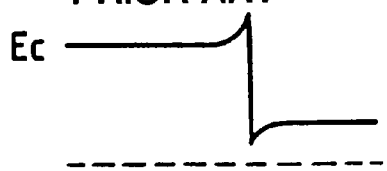
FIG. 49C shows an energy band diagram of a heterojunction of a prior art multiplication layer.
Figure 49C:

Referring to FIG. 48, this photoelectric conversion device comprises a Cr electrode 181, an n-type a-$Si_{1-x}Ge_x$:H charge injection inhibiting layer 182 having a thickness of about 500 Å for inhibiting injection of holes, a multiplication layer 183 for performing carrier multiplication, in which a forbidden band width is changed by changing a composition from a-$Si_{1-x}Ge_x$:H to a-$Si_{1-y}C_y$:H, an a-Si:H light absorption layer 184 having a thickness of about 1 μm for absorbing light to produce carriers, a p-type a-$Si_{1-y}'C_y'$:H charge injection inhibiting layer 185 having a thickness of about 100 Å for inhibiting injection of electrons, and a transparent electrode 186 mainly consisting of indium oxide.

The Cr electrode 181 was formed by EB vapor deposition, the transparent electrode 186 was formed by sputtering, and the charge injection inhibiting layer 185, the multiplication layer 183, the light absorption layer 184, and the charge injection inhibiting layer 182 were formed by plasma CVD. The source gases used in the formation of the amorphous layers were $SiH_4$, $GeH_4$, $PH_3$, and $H_2$ for the charge injection inhibiting layer 182, $SiH_4$, $GeH_4$, $CH_4$, $B_2H_6$, and $H_2$ for the multiplication layer 183, $SiH_4$ and $H_2$ for the light absorption layer 184, and $SiH_4$, $CH_4$, $B_2H_6$, and $H_2$ for the charge injection inhibiting layer 185. The multiplication region 183 was constituted by 200-Å thick forbidden band width and Fermi level change layers 191, 192, and 193 formed by continuously changing the gas flow rates of $CH_4$, $GeH_4$, and $B_2H_6$ of the above source gases.

Stacking of the forbidden band width change regions of the multiplication layer was started from formation of a maximum forbidden band width layer using $SiH_4$, $H_2$, $CH_4$, and $B_2H_6$ gases. The flow rate of $CH_4$ was then decreased gradually, and, when the flow rate of $CH_4$ became zero, the flow rate of $GeH_4$ was increased gradually, thereby forming other layers up to a minimum forbidden band width layer. In this case, the flow rate of $B_2H_6$ was also decreased gradually from the formation of the maximum forbidden band width layer to become zero in the formation of the minimum forbidden band width layer.

When the formation of the minimum forbidden band width was finished, a thin maximum forbidden band width layer having a thickness of about 10 Å was formed. Thereafter, the flow rates of $SiH_4$ and $GeH_4$ were reduced to zero, and layers 195 and 196 by each of which the surface of the minimum forbidden band layer was terminated with hydrogen atoms were formed by using plasma of $H_2$ gas (or a gas mixture of $H_2$ and a diluted gas, as of $H_2$ and Ar or $H_2$ and He). The depth of termination with hydrogen preferably

48 equals the entire thin film (10 Å) with the maximum forbidden band width. Thereafter, the $SiH_4$, $CH_4$, and $B_2H_6$ gases were again supplied to incline the forbidden band width from a position at which the maximum forbidden band width was formed, thereby stacking layers.

Another relatively thin layer 194 having a maximum energy band gap may be formed by terminating the surface of the n-type charge inhibiting layer 182 with hydrogen atoms by hydrogen plasma processing, similar to the above-described processing for layers 195 and 196. This formation is done after layer 182 has been formed and before layer 191 is formed.

The difference of this example from the above example is that the stacked multiplication layer 713 is constituted by forming the multiplication layers 721, 722, 723, and 724 in which, in the embodiment, the surfaces of the initial thin films having the maximum forbidden band width are terminated with hydrogen by forming forbidden band width change layers having a composition changing from a-$Si_{1-x}Ge_x$:H to a-$Si_{1-y}C_y$:H.

As has been described above, the present invention can realize a method of manufacturing a photoelectric conversion device, in which an increase in a dark current is minimized in the isolation step, by using the means as described above (particularly in Embodiments 1 to 5).

This can achieve an effect of providing a photoelectric conversion element which facilitates execution of the isolation step required for a one-dimensional or two-dimensional arrangement while taking advantage of the merit of a PIN photodiode, i.e., a low dark current (particularly in Embodiments 1 to 5).

In addition, according to the present invention, there is provided a photoelectric conversion device comprising: a plurality of photoelectric conversion units; and a signal output unit having at least one of a storage means for storing electrical signals generated by the photoelectric conversion units, a scanning means for scanning electrical signals generated by the photoelectric conversion units, and a reading means for reading out electrical signals generated by the photoelectric conversion units, in which as each of the photoelectric conversion units, a light absorption layer for absorbing light and a multiplication layer formed by stacking one or a plurality of step-back structure layers, which multiply carries produced upon absorption of light, and in which a forbidden band width changes continuously from a minimum forbidden band width $Eg_2$ to a maximum forbidden band width $Eg_3$, are sandwiched between a charge injection inhibiting layer stacked on the light absorption layer and a substrate formed on the signal output unit and having a charge injection inhibiting function, wherein the layer with the maximum forbidden band width $Eg_3$ consists of non-single-crystal carbon. This makes it possible to provide a photoelectric conversion device in which a variation in an energy step ΔEc upon composition modulation is reduced and variations between elements are also reduced (particularly in Embodiment 6).

Furthermore, in a photoelectric conversion device in which a light absorption layer and a carrier multiplication layer consist of non-single-crystal materials, and the carrier multiplication layer has a structure formed by stacking a plurality of layers in which a forbidden band width is changed continuously, the present invention reduces defect levels in the interface of a step-back heterojunction portion and eliminates spikes and notches in the heterojunction portion, thereby improving the transit properties of carriers and reducing recombinations of carriers. This makes it possible to provide a photoelectric conversion device which has a high multiplication factor and a high response speed, which is useful in industrial applications, and which can be stacked on a semiconductor substrate on which a circuit is already formed (particularly in Embodiments 7 and 8).

What is claimed is:

1. A method of manufacturing a photoelectric conversion device having, on a substrate, a light absorption layer and a carrier multiplication layer consisting of a non-single-crystal material, the carrier multiplication layer comprising a plurality of sublayers each having a graded energy band gap between a maximum energy band gap layer and a minimum energy band gap layer, wherein each sublayer of the carrier multiplication layer is formed by, after forming the minimum energy band gap layer so that the energy band gap changes respectively from the maximum energy band gap at the substrate side into the minimum energy band gap, terminating energy band gap layer with hydrogen atoms using a hydrogen plasma, and then forming, on the minimum energy band gap layer, the maximum energy band gap layer of the adjacent sublayer.

2. A method according to claim 1, wherein said step of terminating the surface of the at least one minimum energy band gap layer with hydrogen atoms is performed by plasma processing using hydrogen gas or a gas mixture of hydrogen gas and an inert gas.

3. A method according to claim 1, wherein the non-single-crystal material layers contain at least silicon atoms.

4. A method of manufacturing a photoelectric conversion device having, on a substrate, a light absorption layer and a carrier multiplication layer consisting of a non-single-crystal material, the carrier multiplication layer comprising a plurality of sublayers each having a graded energy band gap between a maximum energy band gap layer and a minimum energy band gap layer, wherein the carrier multiplication layer is formed by, after the minimum energy band gap layer is formed such that the energy band gap changes from the maximum energy band gap at the substrate side into the minimum energy band gap, forming a thin film layer of the maximum energy band gap on the minimum energy band gap layer, terminating the thin film by hydrogen atoms by subjecting the thin film to a hydrogen plasma processing, and thereafter, forming on the thin film layer another carrier multiplication sublayer of a graded energy band gap.

5. A method according to claim 4, wherein the thickness of the at least one thin layer having the maximum energy band gap is not more than 50 Å.

6. A method according to claim 4, wherein said step of terminating the thin film with hydrogen atoms using plasma processing, is performed using hydrogen gas or a gas mixture of hydrogen gas and an inert gas.

7. A method according to claim 4, wherein the non-single-crystal material layers contain at least silicon atoms.

8. A method according to claim 2, wherein the inert gas is selected from the group consisting of Ar and He.

9. A method according to claim 6, wherein the inert gas is selected from the group consisting of Ar and He.

10. A method of manufacturing a photoelectric conversion device having, on a substrate, a carrier multiplication layer comprising plural laminated sublayers of a non-single-crystal material, each sublayer having an energy bandgap which changes from a maximum energy bandgap into a minimum energy bandgap, a light absorption layer having an energy bandgap greater than the minimum energy bandgap, in this order, wherein, after formation of the sublayers, a surface of the minimum energy bandgap is subjected to a hydrogen plasma processing for terminating the surface by hydrogen atoms, and, on the surface terminated by the hydrogen atoms, another sublayer is formed.

11. A method according to claim 10, wherein the plasma processing is performed using hydrogen gas or a mixture of the hydrogen gas and an inert gas.

12. A method according to claim 10, wherein the non-single-crystal material includes silicon atoms.

13. A method according to claim 11, wherein the inert gas is selected from the group consisting of argon and helium.

14. A method of manufacturing a photoelectric conversion device having, on a substrate, a carrier multiplication layer comprising plural laminated sublayers of a non-single-crystal material, each sublayer having an energy bandgap which changes from a maximum energy bandgap into a minimum energy bandgap, and a light absorption layer having an energy bandgap greater than the minimum energy bandgap, wherein, after formation of the sublayers, a thin film of the maximum energy bandgap is formed, and a surface of the thin film is subjected to a hydrogen plasma processing for terminating the thin film by hydrogen atoms, and wherein an additional sublayer is laminated on the thin film subjected to the hydrogen plasma processing, that laminating being performed such that an energy bandgap of the additional sublayer changes from the maximum energy bandgap to the minimum energy bandgap.

15. A method according to claim 14, wherein the thin film has a thickness not greater than 50 Å.

16. A method according to claim 14, wherein the hydrogen plasma processing is performed using hydrogen gas or a mixture of the hydrogen gas and an inert gas.

17. A method according to claim 16, wherein the non-single-crystal material includes silicon atoms.

18. A method according to claim 16, wherein the inert gas is selected from the group consisting of argon and helium.

* * * * *